United States Patent
Matsuno

(10) Patent No.: US 10,290,649 B2
(45) Date of Patent: May 14, 2019

(54) SEMICONDUCTOR DEVICE AND METHOD FOR MANUFACTURING SAME

(71) Applicant: Toshiba Memory Corporation, Minato-ku (JP)

(72) Inventor: Koichi Matsuno, Mie (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/843,691

(22) Filed: Dec. 15, 2017

(65) Prior Publication Data

US 2019/0006383 A1 Jan. 3, 2019

(30) Foreign Application Priority Data

Jun. 28, 2017 (JP) ................. 2017-126467

(51) Int. Cl.
| | |
|---|---|
| H01L 27/11582 | (2017.01) |
| H01L 27/11524 | (2017.01) |
| H01L 27/11556 | (2017.01) |
| H01L 27/1157 | (2017.01) |
| H01L 23/522 | (2006.01) |
| H01L 23/532 | (2006.01) |
| H01L 21/768 | (2006.01) |
| H01L 23/528 | (2006.01) |

(52) U.S. Cl.
CPC .... *H01L 27/11582* (2013.01); *H01L 21/7682* (2013.01); *H01L 21/76816* (2013.01); *H01L 21/76877* (2013.01); *H01L 23/528* (2013.01); *H01L 23/5226* (2013.01); *H01L 23/5329* (2013.01); *H01L 27/1157* (2013.01); *H01L 27/11524* (2013.01); *H01L 27/11556* (2013.01); *H01L 2221/1063* (2013.01)

(58) Field of Classification Search
CPC .......... H01L 27/11582; H01L 27/1157; H01L 27/11556; H01L 27/11524; H01L 23/528; H01L 23/5329; H01L 23/5226; H01L 21/7682; H01L 21/76816; H01L 21/76877
See application file for complete search history.

(56) References Cited

U.S. PATENT DOCUMENTS

| | | | |
|---|---|---|---|
| 7,847,334 B2 | 12/2010 | Katsumata et al. | |
| 8,847,302 B2 | 9/2014 | Alsmeier et al. | |
| (Continued) | | | |

FOREIGN PATENT DOCUMENTS

| | | |
|---|---|---|
| JP | 4691124 | 6/2011 |
| JP | 2013-38124 | 2/2013 |
| JP | 2016-192514 | 11/2016 |

*Primary Examiner* — Yosef Gebreyesus
(74) *Attorney, Agent, or Firm* — Oblon, McClelland, Maier & Neustadt, L.L.P.

(57) ABSTRACT

According to one embodiment, a semiconductor device includes a foundation layer, a stacked body provided above the foundation layer, a columnar portion, a hole, and a sealing film. The stacked body includes a plurality of conductive layers stacked with an air gap interposed. The columnar portion includes a semiconductor body. The semiconductor body extends in a stacking direction of the stacked body through the stacked body and contacts the foundation layer. The hole extends in the stacking direction through the stacked body and forms a cavity communicating with the air gap. The sealing film plugs an upper end of the hole forming the cavity.

21 Claims, 58 Drawing Sheets

(56) References Cited

U.S. PATENT DOCUMENTS

| | | | |
|---|---|---|---|
| 2009/0059669 A1* | 3/2009 | Toriyama | G11C 16/0483 365/185.17 |
| 2010/0207193 A1* | 8/2010 | Tanaka | H01L 27/11578 257/324 |
| 2013/0032873 A1* | 2/2013 | Kiyotoshi | H01L 29/7926 257/324 |
| 2016/0293839 A1 | 10/2016 | Suzuki et al. | |
| 2017/0062464 A1 | 3/2017 | Aoyama | |

\* cited by examiner

SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2017-126467, filed on Jun. 28, 2017; the entire contents of which are incorporated herein by reference.

FIELD

Embodiments described herein relate generally to a semiconductor device and a method for manufacturing a semiconductor device.

BACKGROUND

A structure of a three-dimensional memory device has been proposed in which air gaps are provided between multiple conductive layers. Also, technology has been proposed in which the air gaps recited above are formed by removing sacrificial layers between the multiple conductive layers. The sacrificial layers are removed by etching through a slit formed in a stacked body including the conductive layers and the sacrificial layers.

DETAILED DESCRIPTION

Figure 1:
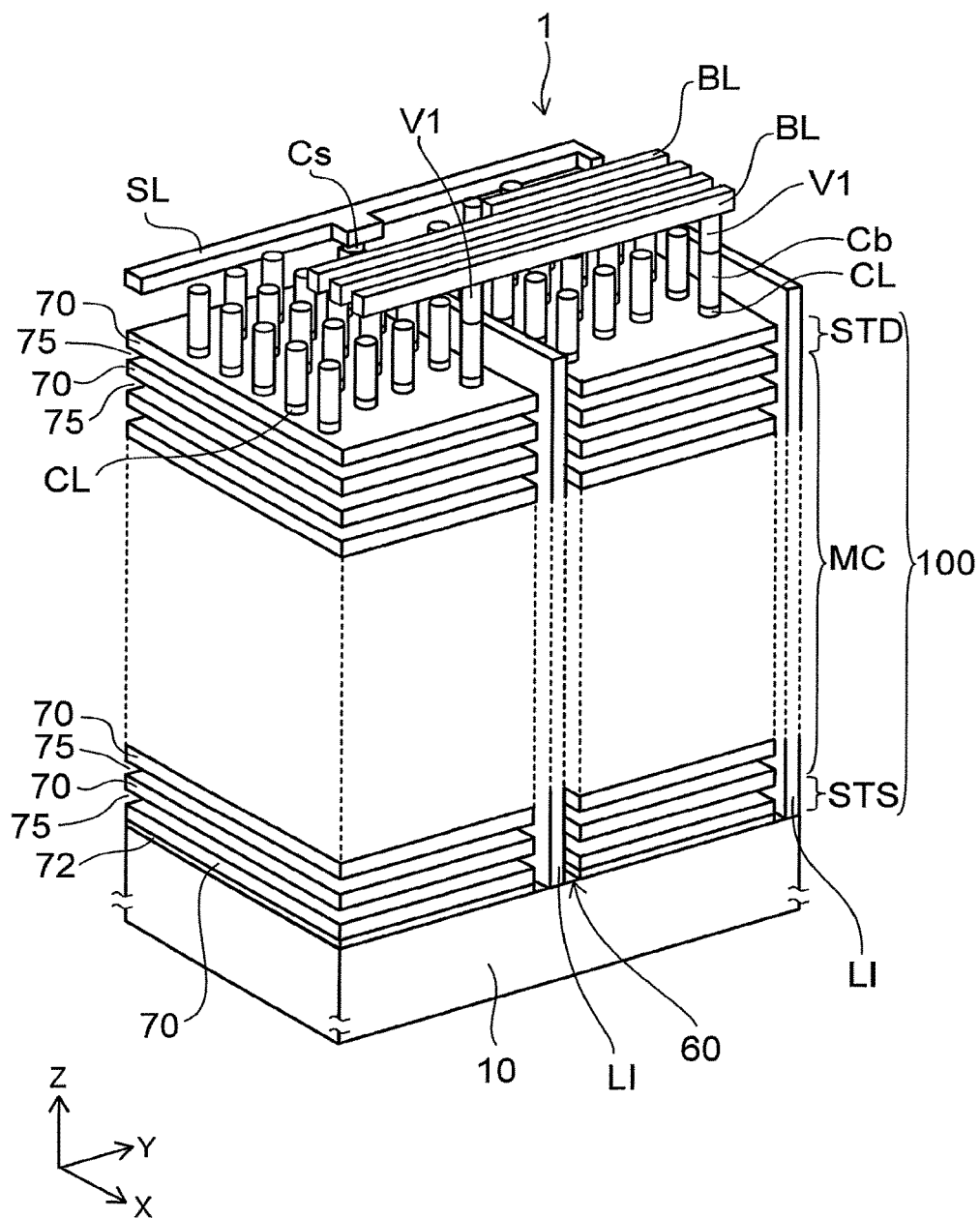
FIG. 1 is a schematic perspective view of a semiconductor device of an embodiment.

According to one embodiment, a semiconductor device includes a foundation layer, a stacked body provided above the foundation layer, a columnar portion, a hole, and a sealing film. The stacked body includes a plurality of conductive layers stacked with an air gap interposed. The columnar portion includes a semiconductor body. The semiconductor body extends in a stacking direction of the stacked body through the stacked body and contacts the foundation layer. The hole extends in the stacking direction through the stacked body and forms a cavity communicating with the air gap. The sealing film plugs an upper end of the hole forming the cavity.

Embodiments will now be described with reference to the drawings. The same components in the drawings are marked with the same reference numerals.

In an embodiment, for example, a semiconductor memory device that includes a memory cell array having a three-dimensional structure is described as a semiconductor device.

FIG. 1 is a schematic perspective view of a memory cell array of the embodiment.

Figure 2:
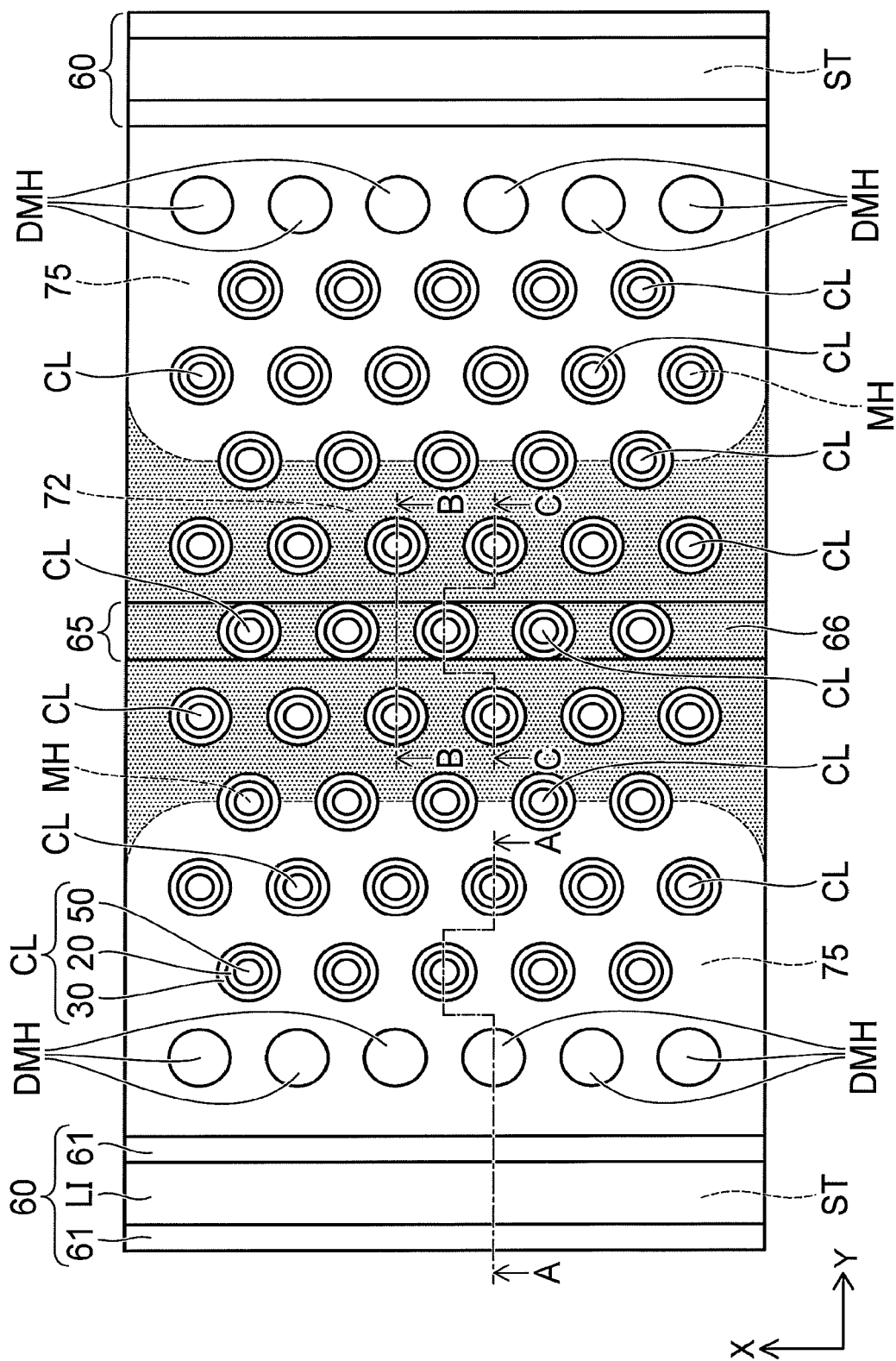
FIG. 2 is a schematic plan view of the semiconductor device of the embodiment.

FIG. 2 is a schematic plan view of the memory cell array of the embodiment.

Figure 3:
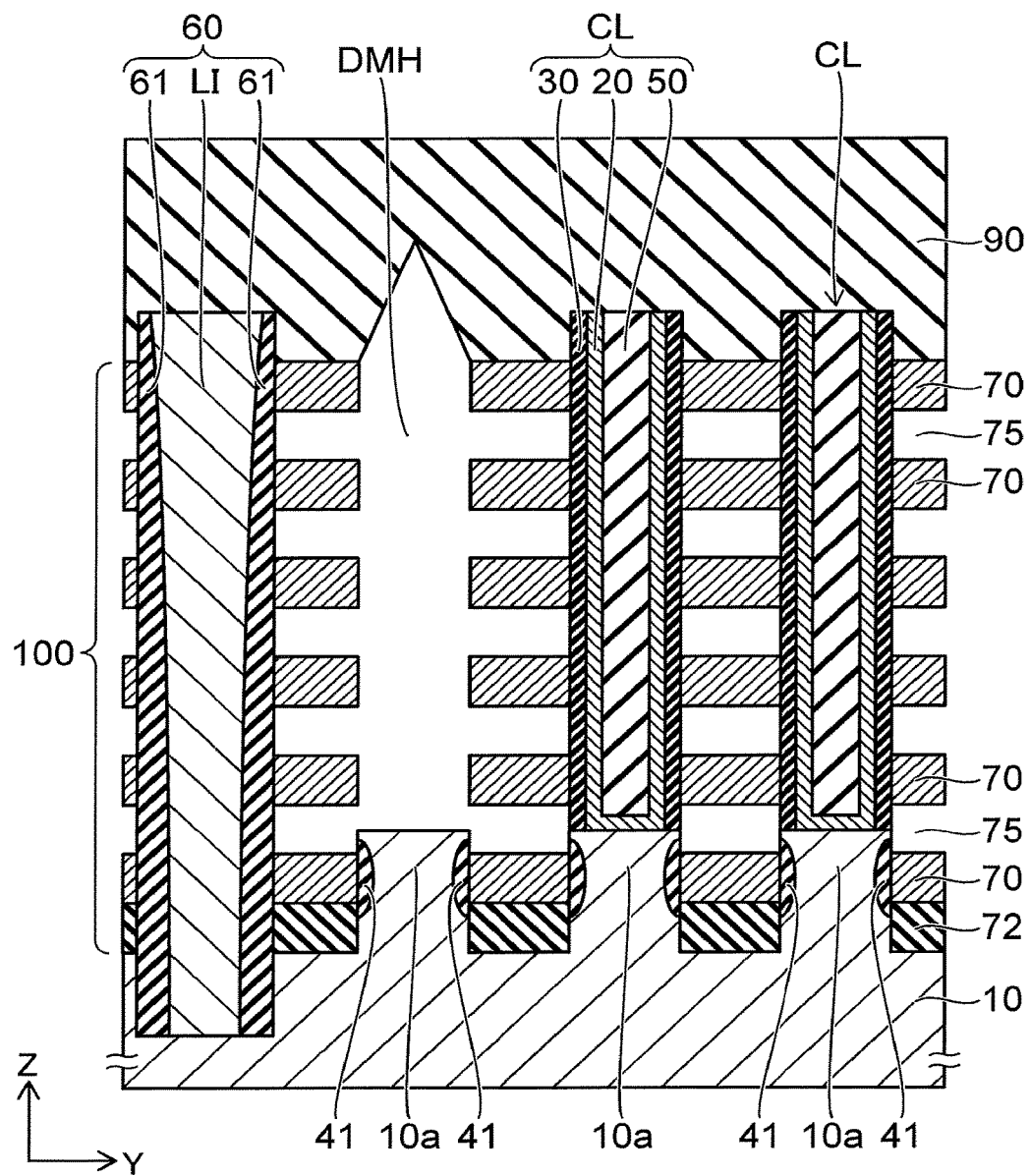
FIG. 3 is an A-A cross-sectional view of FIG. 2.

FIG. 3 is an A-A cross-sectional view of FIG. 2.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in the other drawings correspond respectively to the X-direction, the Y-direction, and the Z-direction of FIG. 1.

The memory cell array 1 includes the substrate 10 as a foundation layer, a stacked body 100 stacked on the substrate 10, multiple columnar portions CL, and multiple separation portions (first separation portions) 60. For example, bit lines BL and a source line SL are provided as upper layer interconnects above the stacked body 100.

The columnar portions CL are formed in substantially circular columnar configurations extending through the stacked body 100 in the stacking direction of the stacked body 100 (the Z-direction). The separation portion 60 spreads in the X-direction and the stacking direction of the stacked body 100 (the Z-direction), and divides the stacked body 100 into multiple blocks (or fingers) in the Y-direction.

As shown in FIG. 2, for example, the multiple columnar portions CL have a staggered arrangement. Or, the multiple columnar portions CL may have a square lattice arrangement along the X-direction and the Y-direction.

The multiple bit lines BL are, for example, metal films extending in the Y-direction. The multiple bit lines BL are separated from each other in the X-direction.

As shown in FIG. 3, the stacked body 100 includes multiple conductive layers 70 stacked on the substrate 10. The multiple conductive layers 70 are stacked in a direction (the Z-direction) perpendicular to the major surface of the substrate 10 with an air gap 75 interposed. The conductive layer 70 is, for example, a layer including a metal as a major component, or a silicon layer doped with an impurity. An insulating layer 72 is provided between the major surface of the substrate 10 and the conductive layer 70 of a lowermost layer.

The substrate 10 includes a protrusion 10a having a substantially circular columnar configuration protruding higher than the major surface. The protrusion 10a is provided under the columnar portion CL. The substrate 10 is, for example, a silicon substrate; and the protrusion 10a is an epitaxial layer of silicon.

The protrusion 10a pierces the insulating layer 72. The upper surface of the protrusion 10a is positioned at a height that is higher than the upper surface of the conductive layer 70 of the lowermost layer and lower than the lower surface of the conductive layer 70 of the second layer from the bottom. The conductive layer 70 of the lowermost layer surrounds the periphery of the protrusion 10a and opposes the side surface of the protrusion 10a. An insulating film 41 is provided between the conductive layer 70 of the lowermost layer and the side surface of the protrusion 10a; and the conductive layer 70 of the lowermost layer does not contact the protrusion 10a.

The multiple conductive layers 70 stacked with the air gap 75 interposed contact the side surfaces of the multiple columnar portions CL to surround the side surfaces of the columnar portions CL. The multiple conductive layers 70 are supported by such a physical bond with the multiple columnar portions CL; and the air gap 75 is maintained between the conductive layers 70.

As shown in FIG. 2 and FIG. 3, multiple holes DMH are disposed proximally to the separation portion 60. The multiple holes DMH are arranged in the direction (the X-direction) in which the separation portion 60 extends. The multiple holes DMH are disposed at the two ends in the Y-direction of one block (finger) of the stacked body 100 partitioned by two separation portions 60.

As shown in FIG. 3, a sealing film 90 is provided on the conductive layer 70 of an uppermost layer. The sealing film 90 is an insulating film and is, for example, a silicon oxide film. The sealing film 90 covers the upper ends of the columnar portions CL and the upper end of the separation portion 60. Also, the sealing film 90 plugs the upper end of the hole DMH while causing a cavity extending in the Z-direction to remain inside the hole DMH.

A film on the hole DMH side that plugs the end portion of the air gap 75 between the conductive layers 70 is not formed; and the holes DMH communicate with the air gap 75.

The protrusion 10a of the substrate 10 is provided also under the hole DMH. The bottom of the hole DMH and the bottom of the columnar portion CL are positioned at substantially the same height (the upper surface height of the protrusion 10a).

Figure 4A:
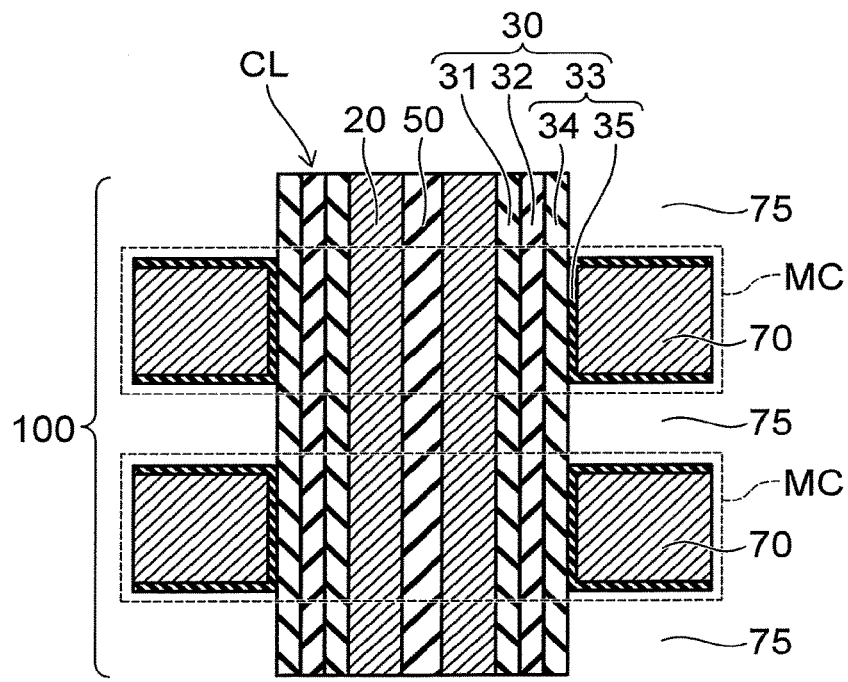
FIGS. 4A and 4B are enlarged cross-sectional views of one portion of FIG. 3.

FIG. 4A is an enlarged cross-sectional view of one portion of FIG. 3.

The columnar portion CL includes a memory film 30, a semiconductor body 20, and an insulative core film 50. The semiconductor body 20 and the core film 50 extend to be continuous along the stacking direction of the stacked body 100.

The semiconductor body 20 extends in a pipe-like configuration through the stacked body 100 in the stacking direction of the stacked body 100 (the Z-direction). The memory film 30 is provided between the semiconductor body 20 and the conductive layers 70, and surrounds the semiconductor body 20 from the outer perimeter side. The core film 50 is provided on the inner side of the semiconductor body 20 having the pipe-like configuration.

The memory film 30 is a stacked film of insulating films including a tunneling insulating film 31, a charge storage film (a charge storage portion) 32, and a blocking insulating film 33. The tunneling insulating film 31 is provided between the semiconductor body 20 and the charge storage film 32. The charge storage film 32 is provided between the tunneling insulating film 31 and the blocking insulating film 33. The blocking insulating film 33 is provided between the charge storage film 32 and the conductive layers 70.

The semiconductor body 20, the memory film 30, and the conductive layer 70 are included in a memory cell MC. The memory cell MC has a vertical transistor structure in which the conductive layer 70 surrounds the periphery of the semiconductor body 20 with the memory film 30 interposed.

In the memory cell MC that has the vertical transistor structure, the semiconductor body 20 is, for example, a channel body of silicon; and the conductive layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film, and includes, for example, a silicon nitride film. Or, the charge storage film 32 may be a conductive floating gate surrounded with an insulating body.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the conductive layer 70. Also, the blocking insulating film 33 prevents back-tunneling of the charge from the conductive layer 70 into the columnar portion CL.

The blocking insulating film 33 includes a first blocking film 34 and a second blocking film 35. The first blocking film 34 is provided between the charge storage film 32 and the second blocking film 35, and is, for example, a silicon oxide film. The second blocking film 35 is provided between the first blocking film 34 and the conductive layer 70, and is, for example, an aluminum oxide film. The second blocking film 35 is divided in the vertical direction at the position of the air gap 75. The second blocking film 35 is provided also on the upper surface and the lower surface of the conductive layer 70. The second blocking film 35 provided on the upper surface and the lower surface of the conductive layer 70 is not illustrated in FIG. 3. For example, a metal nitride film may be provided between the second blocking film 35 and the conductive layer 70.

As shown in FIG. 1, a drain-side selection transistor STD is provided in the upper layer portion of the stacked body 100. A source-side selection transistor STS is provided in the lower layer portion of the stacked body 100. The conductive layer 70 of at least the uppermost layer functions as a control gate of the drain-side selection transistor STD. The conductive layer 70 of at least the lowermost layer functions as a control gate of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are included in one memory string connected in series via the semiconductor body 20. For example, the memory strings have a staggered arrangement in a planar direction parallel to the X-Y plane; and the multiple memory cells MC are provided three-dimensionally in the X-direction, the Y-direction, and the Z-direction.

As shown in FIG. 3, the separation portion 60 includes an interconnect portion LI and an insulating film 61. The interconnect portion LI spreads in the X-direction and the Z-direction, and is, for example, a film including a metal. The insulating film 61 is provided at the side surface of the interconnect portion LI. The insulating film 61 is provided between the stacked body 100 and the interconnect portion LI.

The lower end portion of the interconnect portion LI and the lower end portion of the semiconductor body 20 contact the semiconductor region of the foundation layer. The lower end portion of the interconnect portion LI contacts the substrate 10. The lower end portion of the semiconductor body 20 contacts the protrusion 10a of the substrate 10.

The upper end portion of the semiconductor body 20 is connected to the bit line BL via a contact Cb and a contact V1 shown in FIG. 1. The upper end portion of the interconnect portion LI is connected to the source line SL via a contact Cs shown in FIG. 1.

As shown in FIG. 2, a separation portion (a second separation portion) 65 that extends in the X-direction is provided between the separation portion 60 and the separation portion 60.

Figure 5:
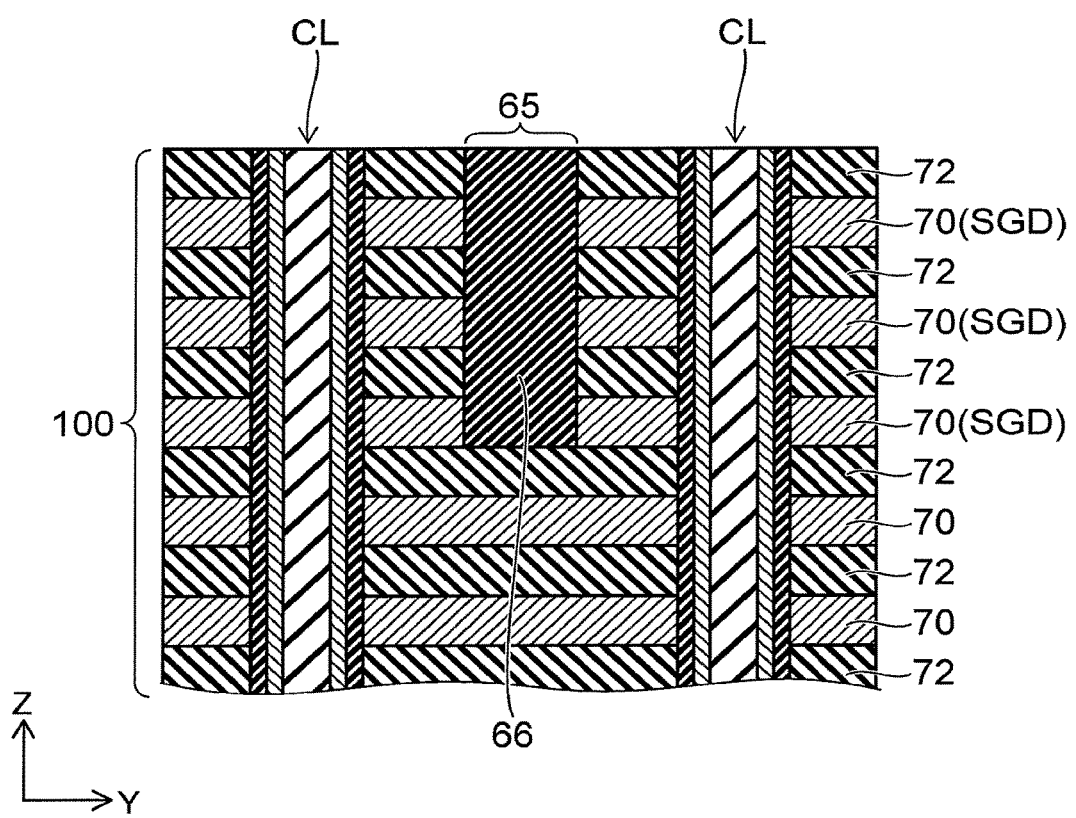
FIG. 5 is a B-B cross-sectional view of FIG. 2.
Figure 6:
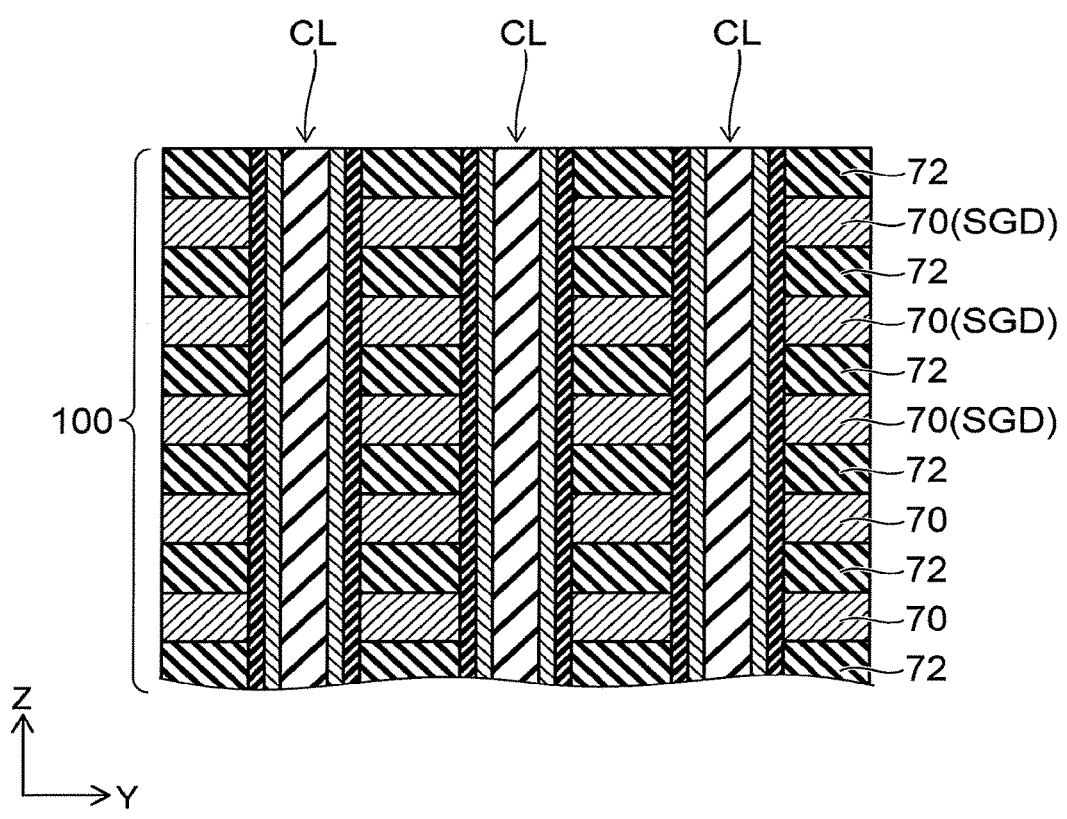
FIG. 6 is a C-C cross-sectional view of FIG. 2.

FIG. 5 is a B-B cross-sectional view of FIG. 2.
FIG. 6 is a C-C cross-sectional view of FIG. 2.

As shown in FIG. 2, the multiple columnar portions CL and the multiple holes DMH are arranged periodically at a substantially uniform pitch. The multiple columnar portions CL and the multiple holes DMH have a staggered arrangement. Or, the multiple columnar portions CL and the multiple holes DMH may have a square lattice arrangement along the X-direction and the Y-direction.

The entire region between the multiple conductive layers adjacent to each other in the stacking direction (the Z-direction) is not the air gap 75; and the region between the conductive layers 70 includes a region where the air gap 75 spreads and a region (the cross-hatched region of FIG. 2) where the insulating layer 72 is provided.

As shown in FIG. 5, the insulating layer 72 is provided between the conductive layers 70 in the region at the vicinity of the separation portion 65. As shown in FIG. 2 and FIG. 3, the air gap 75 spreads in at least a region including the periphery of the holes DMH. In one block (finger), the surface area of the region where the air gap 75 spreads is greater than the surface area of the region where the insulating layer 72 is provided.

The mechanical strength of the stacked body 100 can be increased by causing the insulating layer 72 to remain in a portion of the region between the conductive layer 70 and the conductive layer 70.

As shown in FIG. 5, the separation portion 65 divides the conductive layers 70 functioning as a drain-side selection gate SGD in the Y-direction.

In the example shown in FIG. 5, for example, the conductive layers 70 of three layers on the upper layer side function as the drain-side selection gate SGD. Accordingly, the separation portion 65 divides the conductive layers 70 of the three layers on the upper layer side (the drain-side selection gate SGD) in the Y-direction. The separation portion 65 includes an insulating film 66 provided inside a slit.

Also, as shown in FIG. 2, the multiple columnar portions CL are arranged in the X-direction in the region overlapping the separation portion 65. The columnar portion CL disposed in the center of the three columnar portions CL shown in FIG. 6 is the columnar portion CL disposed in the region overlapping the separation portion 65. The columnar portion CL disposed in the region overlapping the separation portion 65 pierces the separation portion 65.

The charge storage films 32 and the semiconductor bodies 20 of the columnar portions CL disposed in the region overlapping the separation portion 65 are not used as charge storage portions and channels of the memory cells MC.

To increase the density of the memory cells MC, it is desirable to increase the number of stacks of the multiple conductive layers 70. On the other hand, from the perspective of easily patterning the stacked body 100, it is desirable to suppress the increase of the thickness of the entire stacked body 100. Therefore, it is also desirable to reduce the spacing of the conductive layers 70 adjacent to each other in the stacking direction as the number of stacks of the conductive layers 70 is increased. Such narrowing between the conductive layers 70 easily causes dielectric breakdown between the conductive layers 70, and interference (fluctuation of the threshold voltage, etc.) between the memory cells MC caused by capacitive coupling between the conductive layers 70.

According to the embodiment, the breakdown voltage between the adjacent conductive layers 70 can be increased by forming the air gap 75 between the conductive layers 70 of the memory cells MC adjacent to each other in the stacking direction. Further, the capacitance between the adjacent conductive layers 70 can be reduced; and the interference between the adjacent memory cells MC can be suppressed.

A method for manufacturing the semiconductor device of the embodiment will now be described.

The cross-sectional views of FIG. 7 to FIG. 17 correspond to the A-A cross section of FIG. 2.

Figure 8:
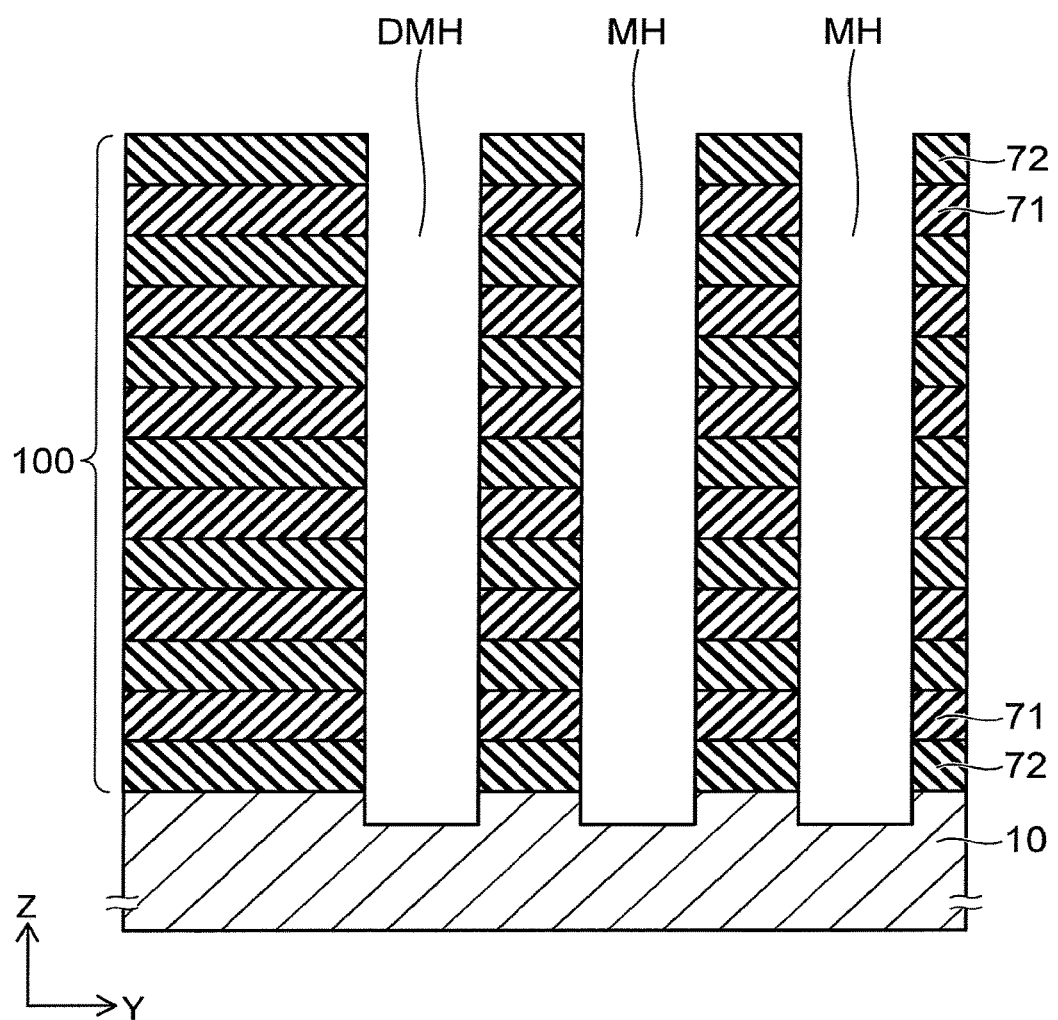
Figure 18A:
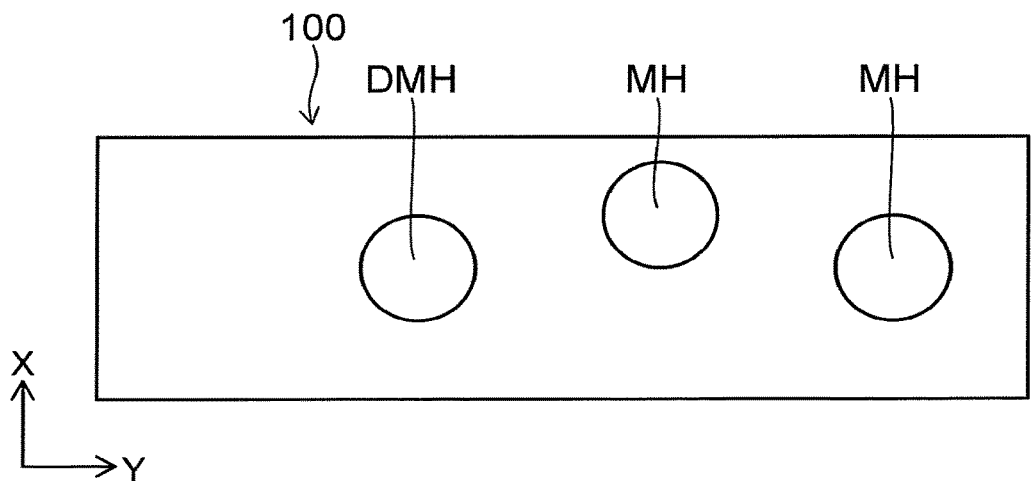
FIG. 18A to FIG. 20B are schematic plan views showing a method for manufacturing the semiconductor device of the embodiment.
Figure 18B:
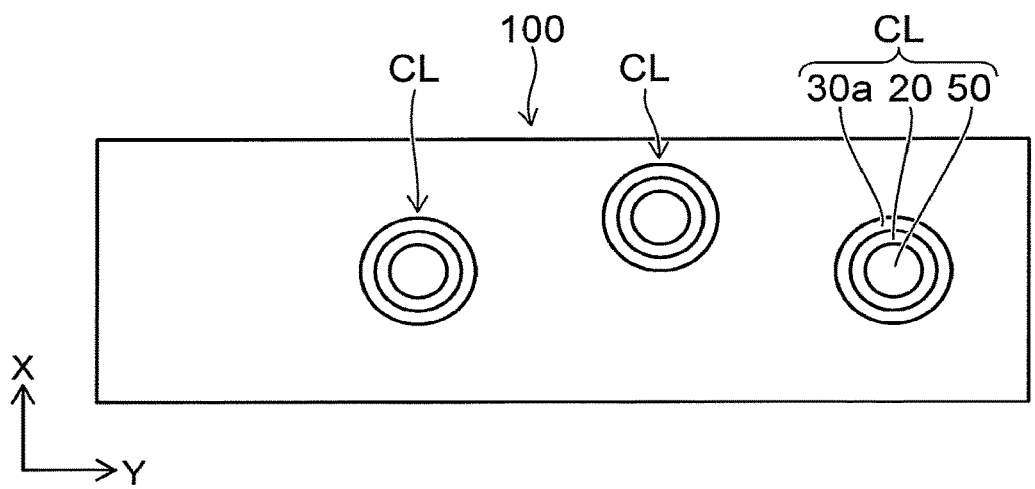
Figure 19A:
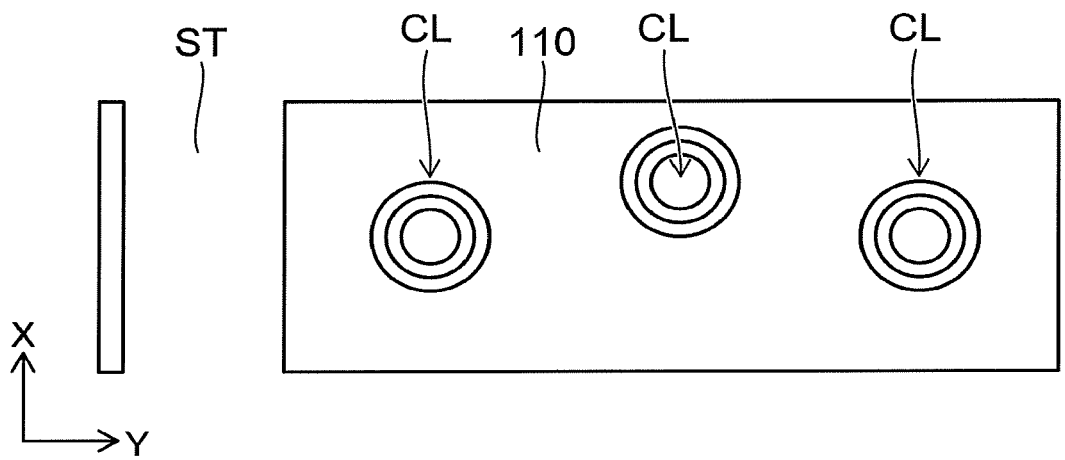
Figure 19B:
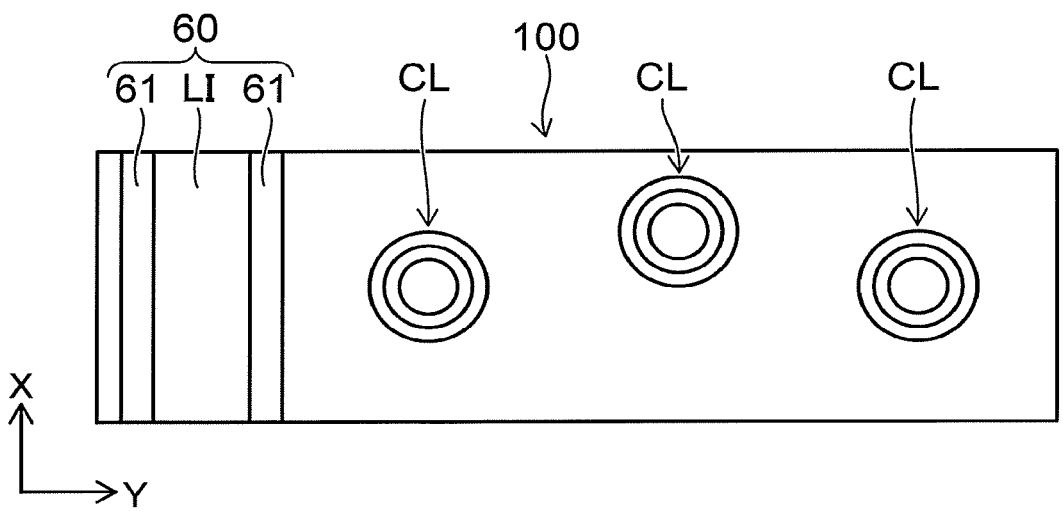
Figure 20A:
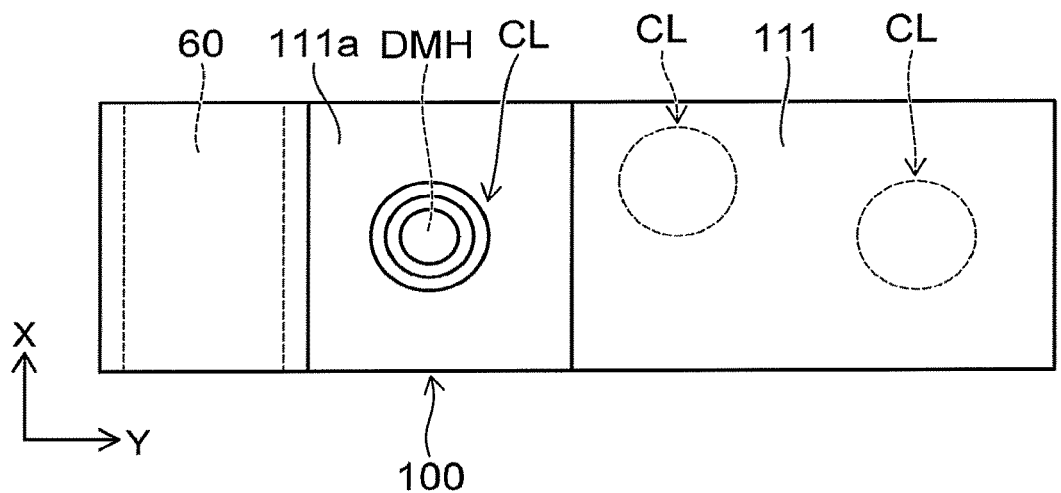
Figure 20B:
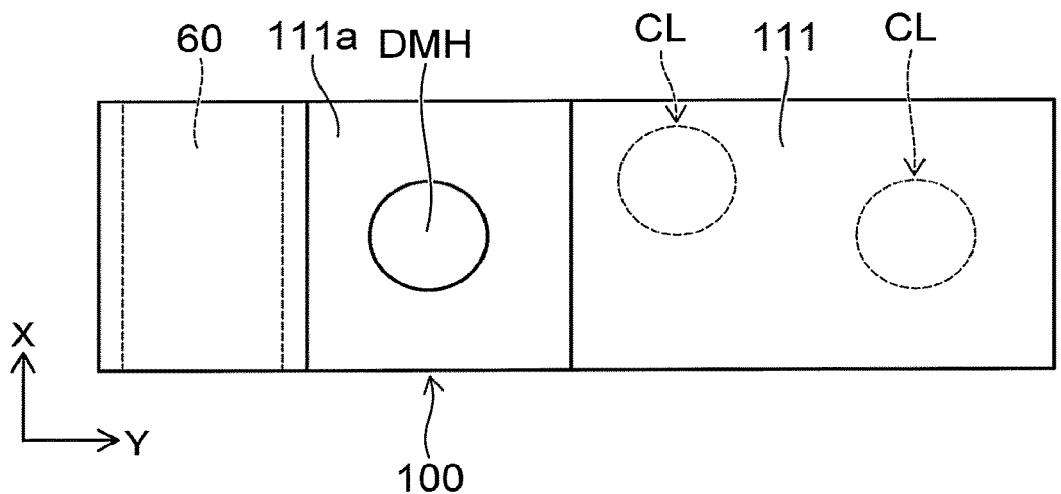

FIG. 18A corresponds to the top view of FIG. 8.
FIG. 18B corresponds to the top view of FIG. 10.
FIG. 19A corresponds to the top view of FIG. 11.
FIG. 19B corresponds to the top view of FIG. 14.
FIG. 20A corresponds to the top view of FIG. 15.
FIG. 20B corresponds to the top view of FIG. 16.

Figure 7:
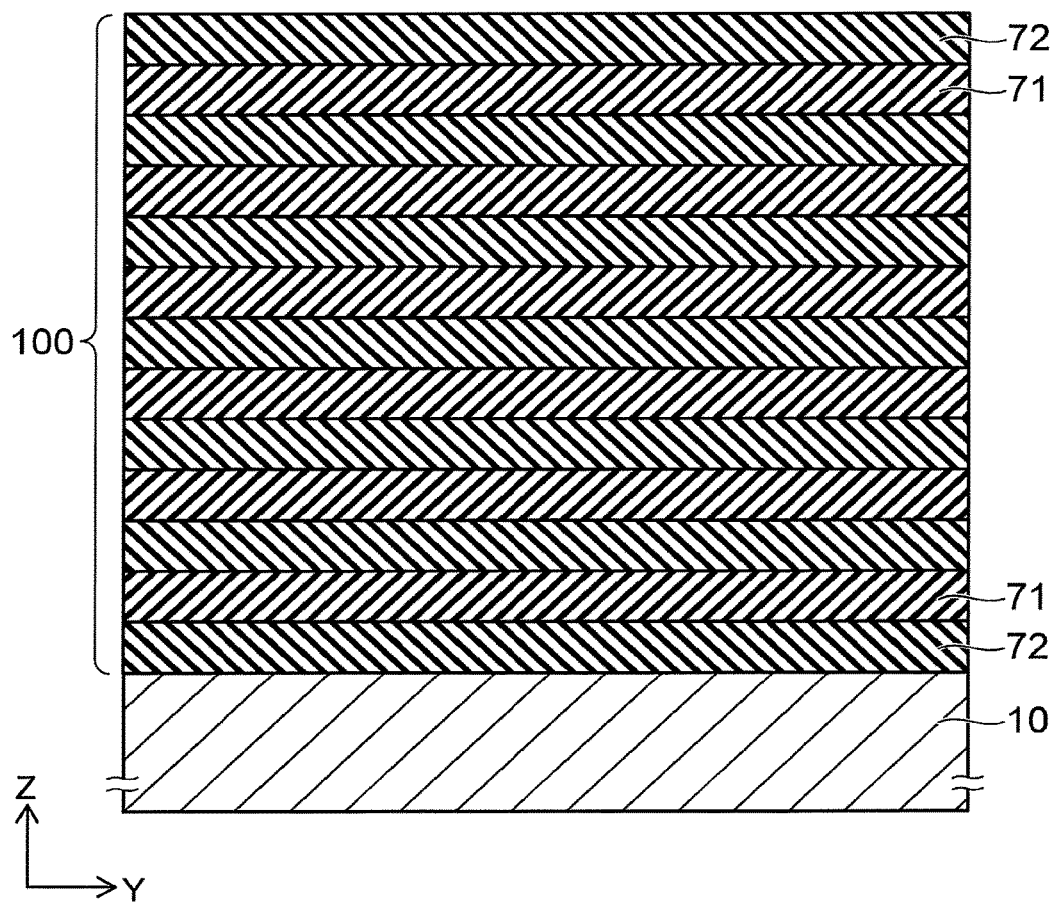
FIG. 7 to FIG. 17 are schematic cross-sectional views showing a method for manufacturing the semiconductor device of the embodiment.

As shown in FIG. 7, the stacked body 100 is formed on the substrate 10. The insulating layer 72 as a second layer and a sacrificial layer 71 as a first layer are stacked alternately on the substrate 10. The multiple insulating layers 72 and the multiple sacrificial layers 71 are formed on the substrate 10 by repeating the process of alternately stacking the insulating layer 72 and the sacrificial layer 71. For example, the insulating layer 72 is a silicon oxide layer; and the sacrificial layer 71 is a silicon nitride layer.

Then, as shown in FIG. 8 and FIG. 18A, multiple memory holes (first holes) MH and the multiple holes (second holes) DMH are formed in the stacked body 100. The multiple memory holes MH and the multiple holes DMH are formed simultaneously by RIE (reactive ion etching) using a not-illustrated mask. The diameter of the memory hole MH and the diameter of the hole DMH are substantially equal.

The multiple memory holes MH and the multiple holes DMH are formed in a periodic arrangement having a substantially uniform pitch (e.g., a staggered arrangement such as that shown in FIG. 2). The memory holes MH and the holes DMH pierce the stacked body 100 and reach the substrate 10.

Figure 9:
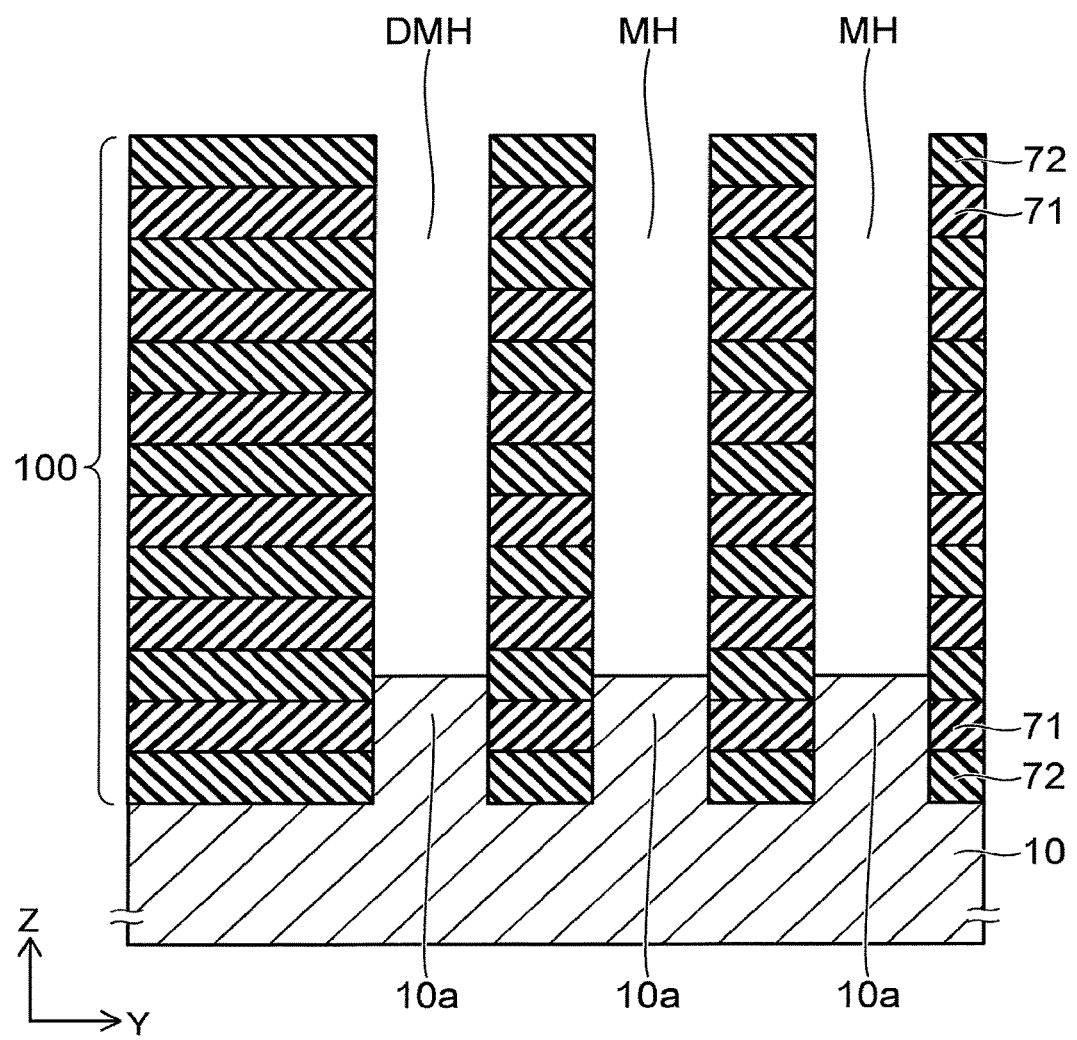

The silicon of the material of the substrate 10 is epitaxially grown on the bottoms of the memory holes MH and on the bottoms of the holes DMH. As shown in FIG. 9, the protrusions 10a are formed as crystal layers as one body with the substrate 10 on the bottoms of the memory holes MH and on the bottoms of the holes DMH.

Figure 10:
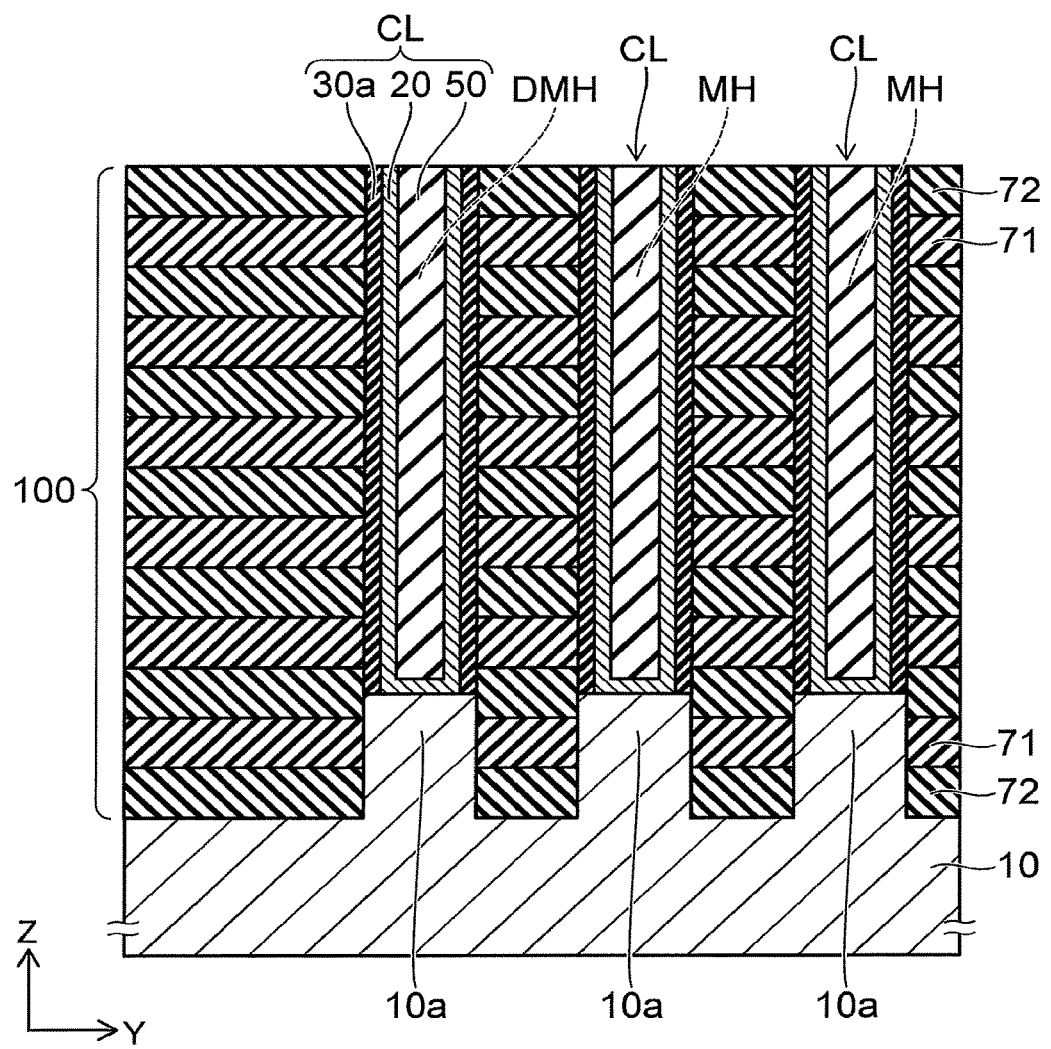

The columnar portions CL are formed as shown in FIG. 10 and FIG. 18B inside the memory holes MH on the protrusions 10a. A stacked film 30a, the semiconductor body 20, and the core film 50 are formed in order inside the memory holes MH. The stacked film 30a includes the tunneling insulating film 31, the charge storage film 32, and the first blocking film 34 shown in FIG. 4A. The lower end portion of the semiconductor body 20 contacts the protrusion 10a.

The columnar portion CL is formed also inside the holes DMH on the protrusions 10a simultaneously when forming the columnar portions CL inside the memory holes MH. The stacked film 30a, the semiconductor body 20, and the core film 50 of the columnar portion CL inside the hole DMH function as a sacrificial film that is removed in a process described below.

Figure 11:
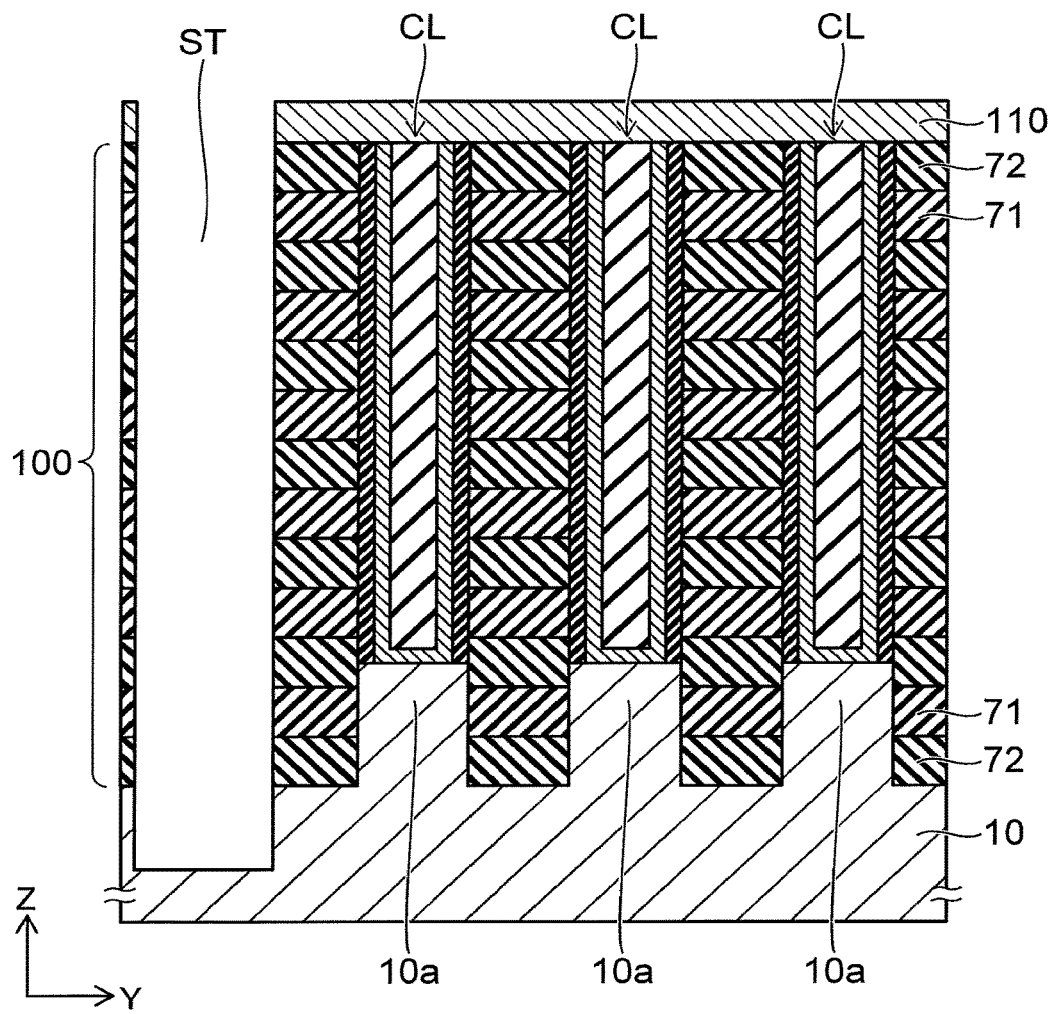

Continuing as shown in FIG. 11 and FIG. 19A, a capping layer (or a mask layer) 110 is formed on the stacked body 100 to cover the columnar portions CL; subsequently, a slit ST is formed in the stacked body 100 by, for example, RIE. The slit ST pierces the stacked body 100 and reaches the substrate 10. The slit ST extends in the X-direction and divides the stacked body 100 into multiple blocks (or fingers) in the Y-direction.

Then, the sacrificial layers 71 are removed using an etchant or an etching gas supplied through the slit ST. For example, the sacrificial layers 71 which are silicon nitride layers are removed using an etchant including phosphoric acid.

Figure 12:
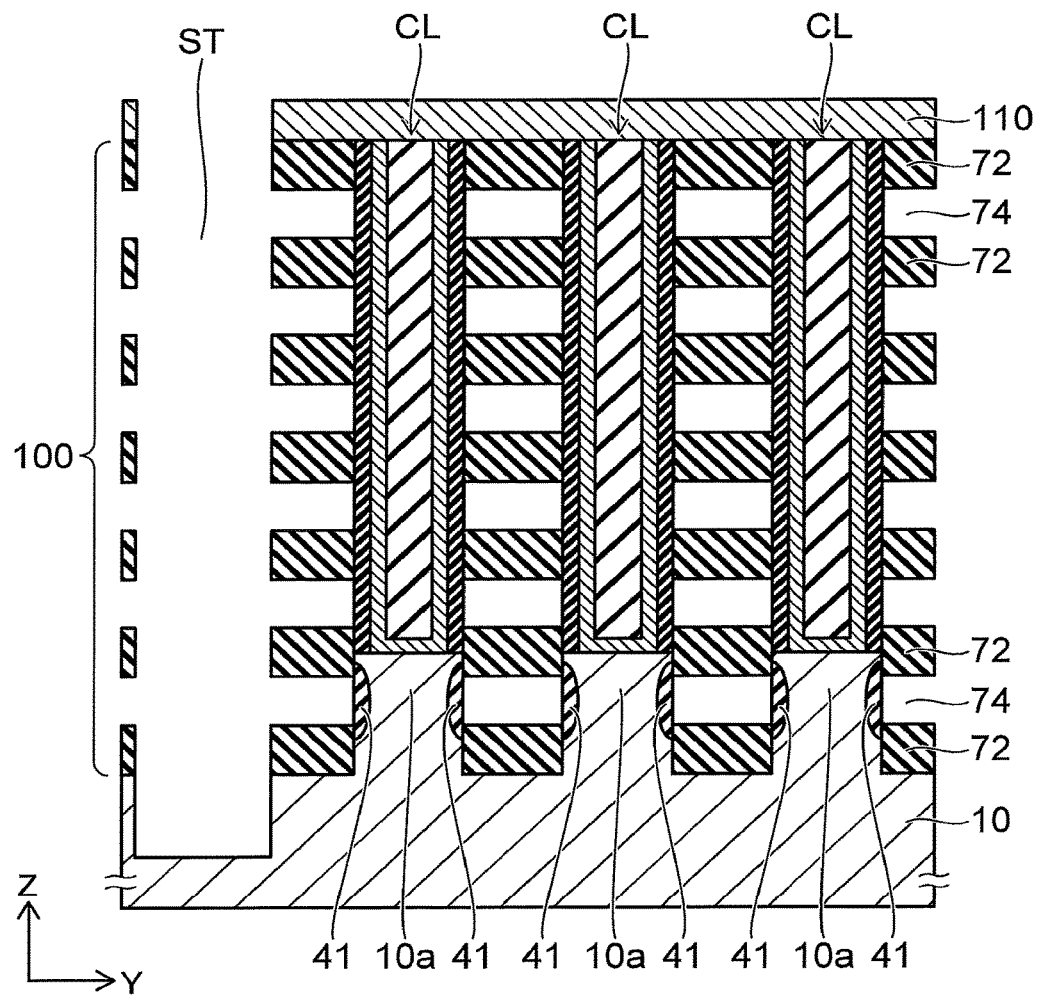

The sacrificial layers 71 are removed; and as shown in FIG. 12, an air gap 74 is formed between the insulating layers 72 adjacent to each other in the stacking direction. The multiple insulating layers 72 stacked with the air gap 74 interposed contact the side surfaces of the multiple columnar portions CL to surround the side surfaces of the columnar portions CL. The multiple insulating layers 72 are supported by such a physical bond with the multiple columnar portions CL; and the air gap 74 is maintained between the insulating layers 72.

The film at the outermost perimeter of the columnar portion CL is the first blocking film 34 shown in FIG. 4A. Because the first blocking film 34 is of a material different from the sacrificial layer 71 and is, for example, a silicon oxide film, the first blocking film 34 has resistance to the etching that removes the sacrificial layers 71; and the columnar portions CL remain.

The side surface of the protrusion 10a of the substrate 10 is exposed in the air gap 74. The insulating film 41 is formed at the side surface of the protrusion 10a by thermal oxidation of the side surface of the protrusion 10a.

Figure 13:
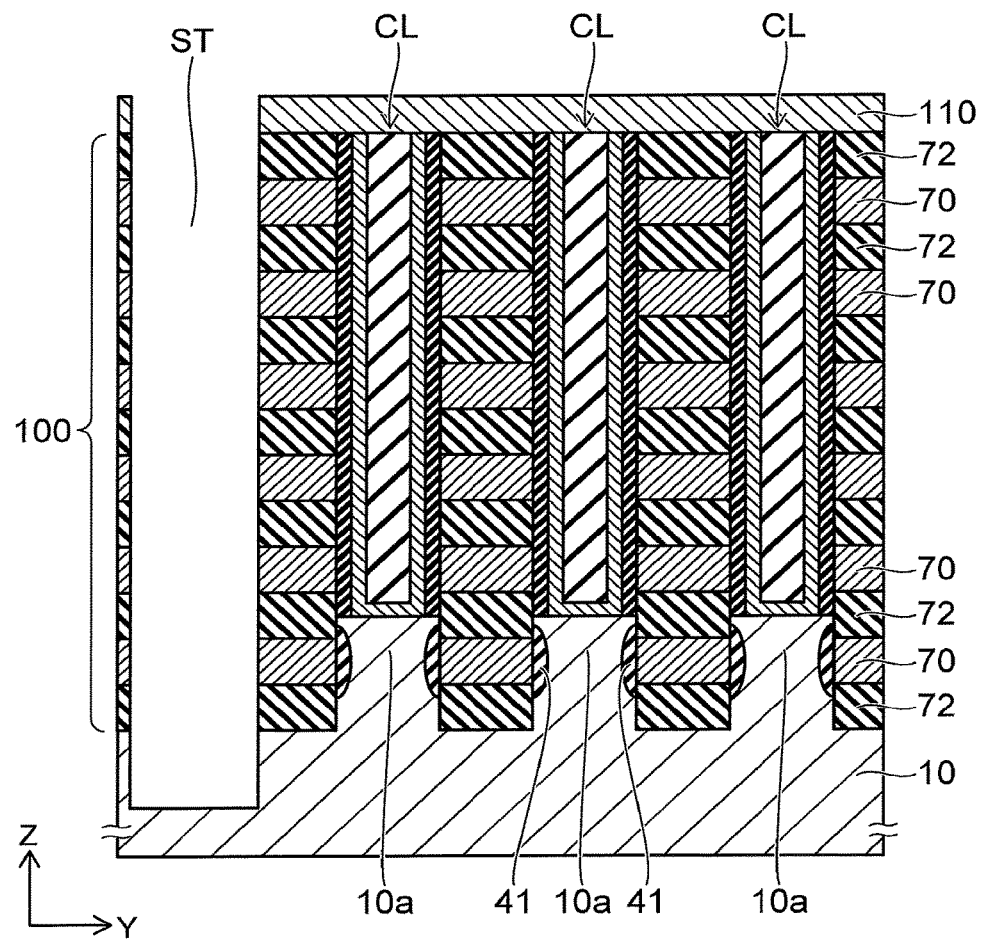

Subsequently, the conductive layers 70 shown in FIG. 13 are formed in the air gap 74. For example, tungsten layers are formed as the conductive layers 70 by CVD. A source gas is supplied to the air gap 74 through the slit ST.

Figure 4B:
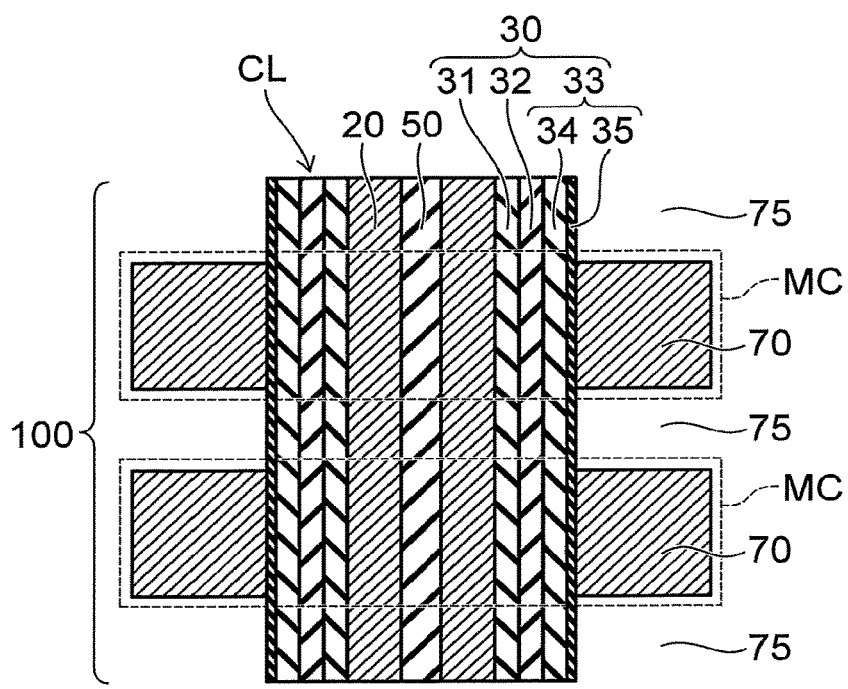

The second blocking film 35 shown in FIG. 4A is formed on the inner wall of the air gap 74 prior to forming the conductive layers 70. Or, the second blocking film 35 may be formed on the side surfaces of the memory holes MH and the holes DMH after the process shown in FIG. 9. In such a case, as shown in FIG. 4B, the second blocking film 35 extends to be continuous in the stacking direction of the stacked body 100.

Figure 14:
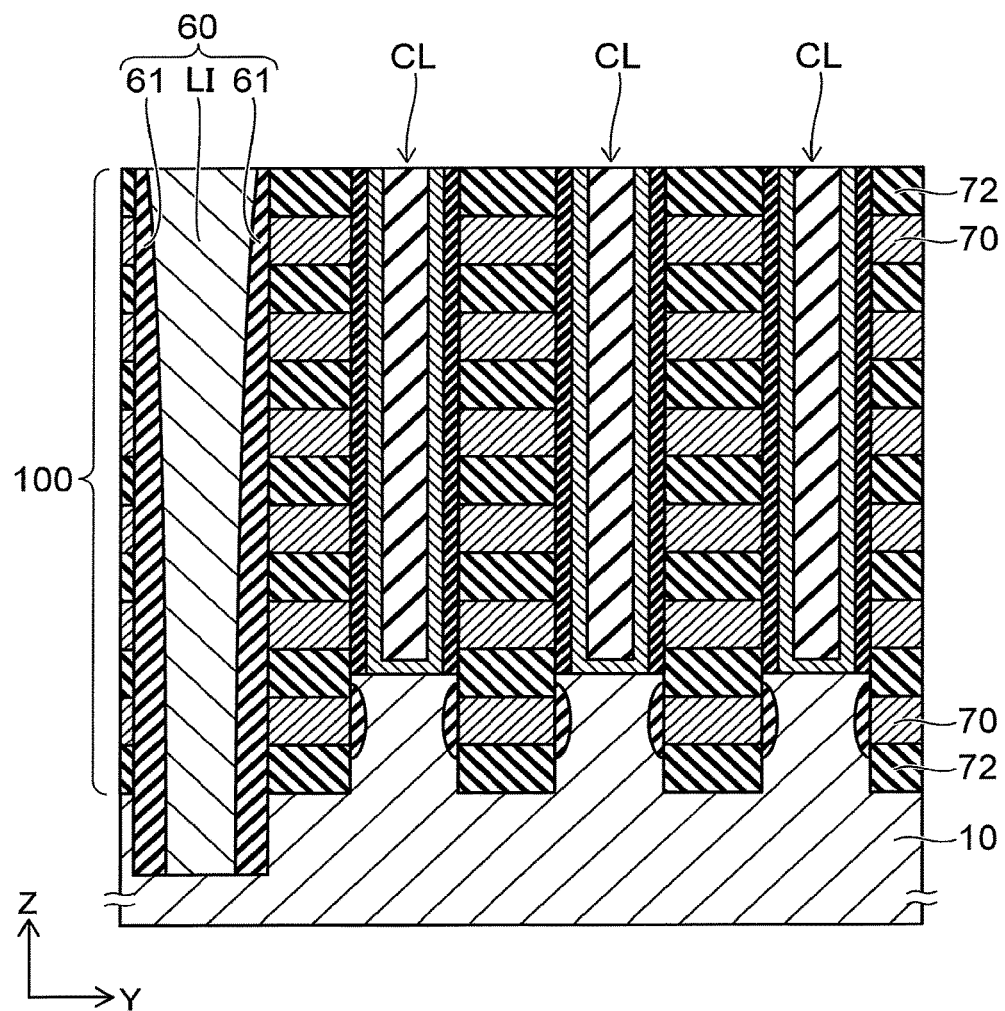

After removing the conductive layer 70 formed on the side surface of the slit ST, the separation portion 60 that includes the insulating film 61 and the interconnect portion LI shown in FIG. 14 and FIG. 19B is formed inside the slit ST. After forming the insulating film 61 conformally along the side surface and the bottom of the slit ST, the insulating film 61 formed on the bottom of the slit ST is removed by RIE. Subsequently, the interconnect portion LI is filled on the inner side of the insulating film 61 inside the slit ST. The lower end portion of the interconnect portion LI contacts the substrate 10.

Figure 15:
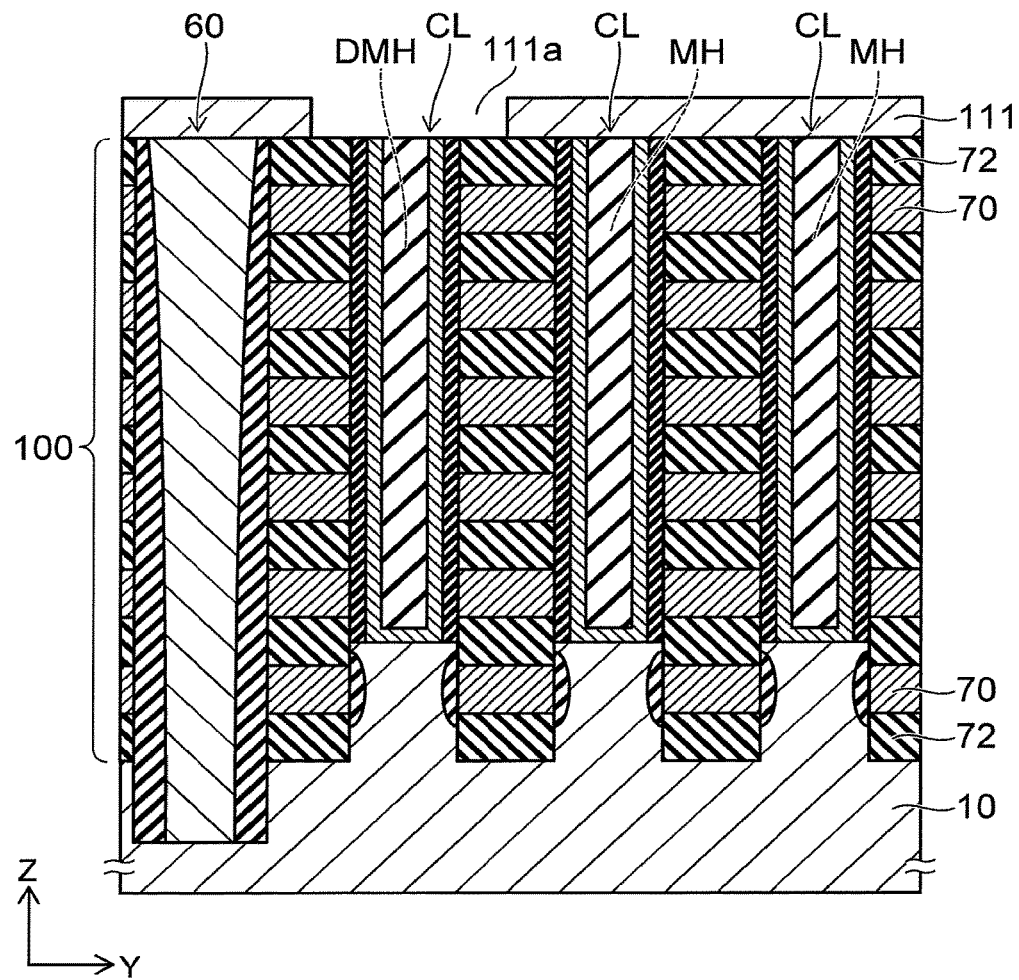

After forming the separation portion 60, a capping layer (or a mask layer) 111 is formed on the stacked body 100 as shown in FIG. 15 and FIG. 20A. The capping layer 111 covers the upper end portion of the separation portion 60 and the upper end portions of the columnar portions CL inside the memory holes MH. The capping layer 111 may be formed separately from the mask layer when forming the slit ST shown in FIG. 11 or may be formed as a stacked structure stacked on the mask layer when forming the slit ST.

An opening 111a that has, for example, a slit configuration is formed in the capping layer 111; and the upper end portions of the columnar portions CL inside the holes DMH are exposed from the opening 111a and are not covered with the capping layer 111.

Figure 16:
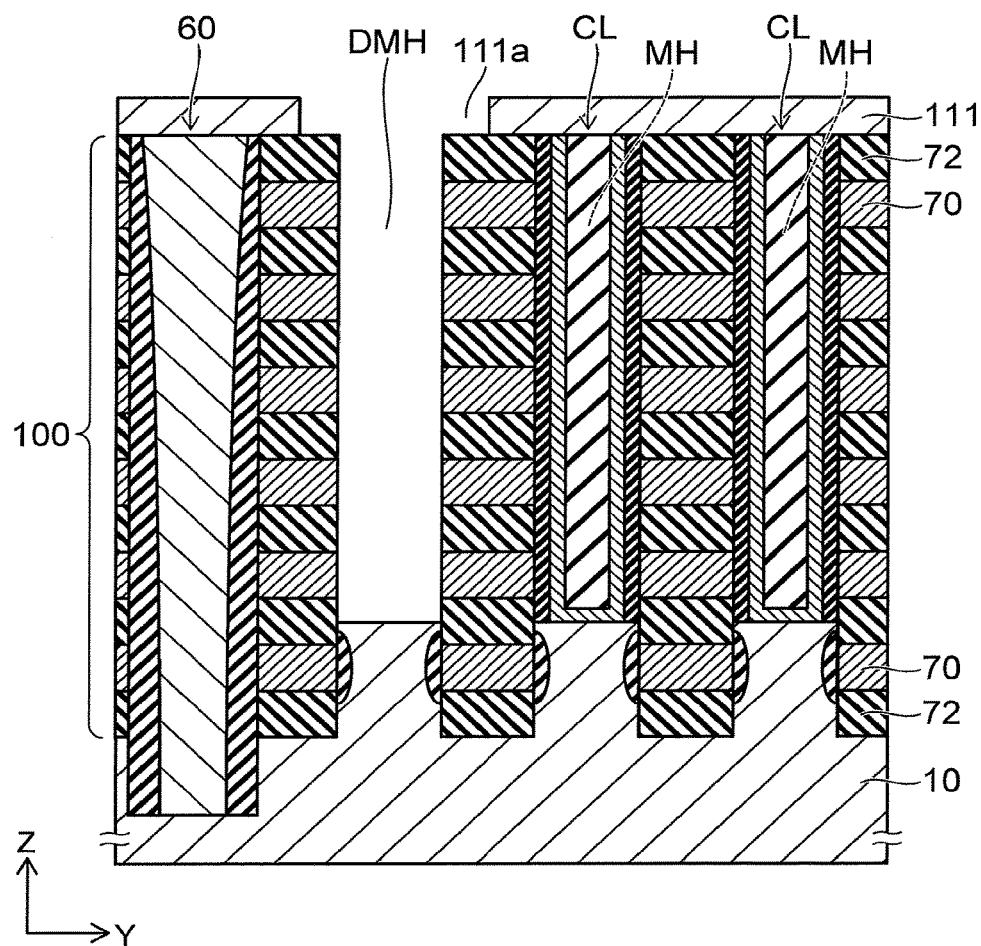

Then, the holes DMH are formed as shown in FIG. 16 and FIG. 20B by removing the columnar portions CL inside the holes DMH by etching. The end portions on the hole DMH side of the multiple insulating layers 72 other than the insulating layer 72 of the lowermost layer are exposed in the holes DMH.

The insulating layer 72 of the lowermost layer provided to surround the side surfaces of the protrusions 10a of the substrate 10 does not communicate with the holes DMH.

Then, the insulating layers 72 are removed by etching through the holes DMH in the state in which the columnar portions CL remain inside the memory holes MH. For example, the insulating layers 72 which are silicon oxide layers are removed using an etchant including hydrofluoric acid.

Figure 17:
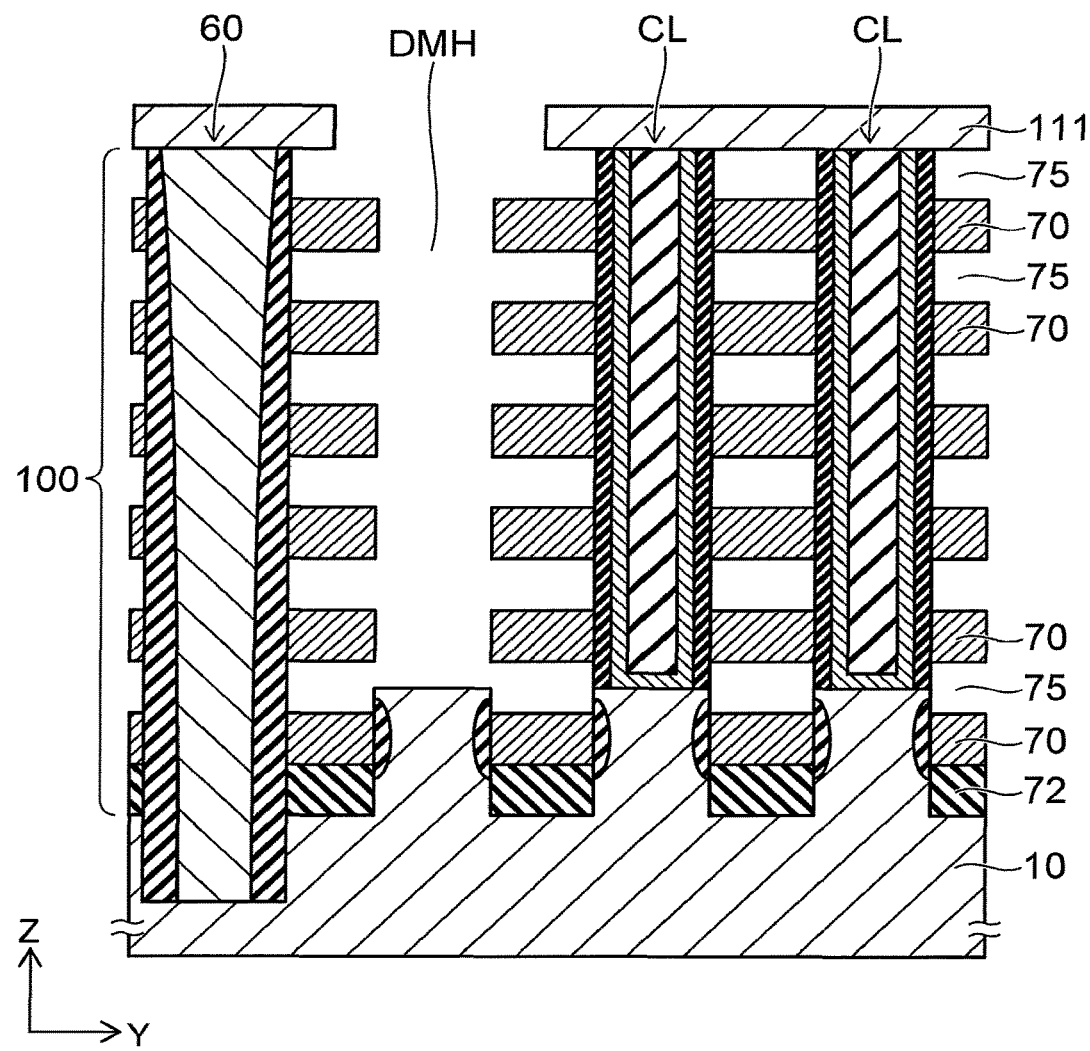

The insulating layers 72 are removed; and the air gap 75 is formed between the conductive layers 70 adjacent to each other in the stacking direction as shown in FIG. 17. The insulating layer 72 of the lowermost layer that does not communicate with the holes DMH remains without being etched. Subsequently, the capping layer 111 is removed.

The etching of the side surfaces of the columnar portions CL when etching to remove the insulating layers 72 which are silicon oxide layers can be stopped by the charge storage film 32 which is a silicon nitride film.

The etching of the insulating layers 72 progresses from the portions exposed in the holes DMH. As shown in FIG. 2, in the case where the column of the multiple holes DMH arranged in the X-direction is disposed at the vicinity of the two Y-direction ends of the block partitioned by the separation portions 60, the etching of the insulating layers 72 progresses from the vicinity of the two Y-direction ends of the block.

In such a case, as illustrated by the cross-hatched region in FIG. 2, there are cases where the insulating layers 72 remain in the region at the central vicinity in the Y-direction of the block according to the thickness of the insulating layer 72, the etching conditions, and the width of the region to be etched. Causing the insulating layer 72 to remain in a portion of the region without making the entire region an air gap helps to ensure the strength of the stacked body 100 and reduce the manufacturing time.

After forming the air gap 75, the upper ends of the holes DMH are plugged with the sealing film 90 as shown in FIG.

3. The sealing film 90 can be prevented from entering the air gap 75 through the holes DMH by forming the sealing film 90 that has poor coverage.

For example, the separation portion 65 is formed prior to forming the memory holes MH and the holes DMH. A slit dividing the sacrificial layer 71 of at least the uppermost layer in the Y-direction is formed in the stacked body 100 including the multiple sacrificial layers 71 prior to the replacement with the conductive layers 70 and the multiple insulating layers 72; subsequently, the insulating film 66 is filled into the slit.

Here, as a comparative example, the case may be considered where the insulating layers 72 are removed by etching through the slit ST. After forming the air gap 75 by removing the insulating layers 72, it is desirable to plug the upper end of the slit ST in the state in which the cavity remains inside the slit ST to prevent films from entering the air gap 75 through the slit ST. In such a case, the slit ST which is a cavity continuous in the X-direction remains inside the stacked body 100.

Conversely, according to the embodiment, the air gap 75 is formed by removing the insulating layers 72 by etching through the holes DMH instead of through the slit ST. The insulating film 61 and the interconnect portion LI are filled into the slit ST. Although the multiple holes DMH remain inside the stacked body 100, the multiple holes DMH do not communicate with each other in a direction parallel to the major surface of the substrate 10. The flexural strength of such a structure of the embodiment can be higher than that of a structure in which the slit ST extending to be continuous in the X-direction remains inside the stacked body 100.

Generally, when forming multiple hole patterns by lithography and RIE, there is a tendency for the configuration and the dimensional precision to degrade for holes disposed at the ends. According to the embodiment as shown in FIG. 2, the fluctuation of the configurations, the diameters, etc., of the multiple columnar portions CL functioning as the components of the memory cells MC can be reduced because the holes DMH not including the semiconductor body 20 and the memory film 30 are disposed at the ends of the region where the multiple columnar portions CL are formed.

The source gas of the conductive layers 70 is supplied to the air gap 74 shown in FIG. 12 through the slit ST extending to be continuous in the X-direction and is not supplied from the holes DMH. Therefore, it is easy to supply the source gas uniformly to the entirety in the planar direction at a rate that is higher than when supplying the source gas from the holes DMH. The source gas does not easily reach the vicinity of the separation portion 65 which is distal to the slit ST; and as a result, it is easy for the density of the conductive layers 70 at the vicinity of the separation portion 65 to be lower than the density of the conductive layers 70 in the region proximal to the slit ST.

In the example of FIG. 2, there may be a case where the density of the conductive layers 70 in the region (the cross-hatched region) where the insulating layers 72 remain is lower than the density of the conductive layers 70 in the region were the air gap 75 is formed. Even if the insulating layers 72 remain in such a region where the density of the conductive layers 70 is relatively small, the breakdown voltage decreases and capacitive coupling occurs less easily than in the region where the density of the conductive layers 70 is relatively high.

Compared to a structure in which the columnar portions CL are not disposed in the separation portion 65, the spacing between the columnar portions CL at the vicinity of the separation portion 65 can be reduced for the structure in which the dummy columnar portions CL are disposed in the region where the separation portion 65 is formed.

Large voids occur easily inside the conductive layers 70 in the case where the spacing of the columnar portions CL widens at the vicinity of the separation portion 65 which is distal to the slit ST and not reached easily by the source gas. As the spacing of the columnar portions CL becomes narrow, the conductive layers 70 deposited (grown) on the side surfaces of the columnar portions CL are connected easily to the conductive layers 70 deposited (grown) on the side surfaces of the adjacent columnar portions CL; and the occurrence of large voids can be suppressed.

Figure 21:
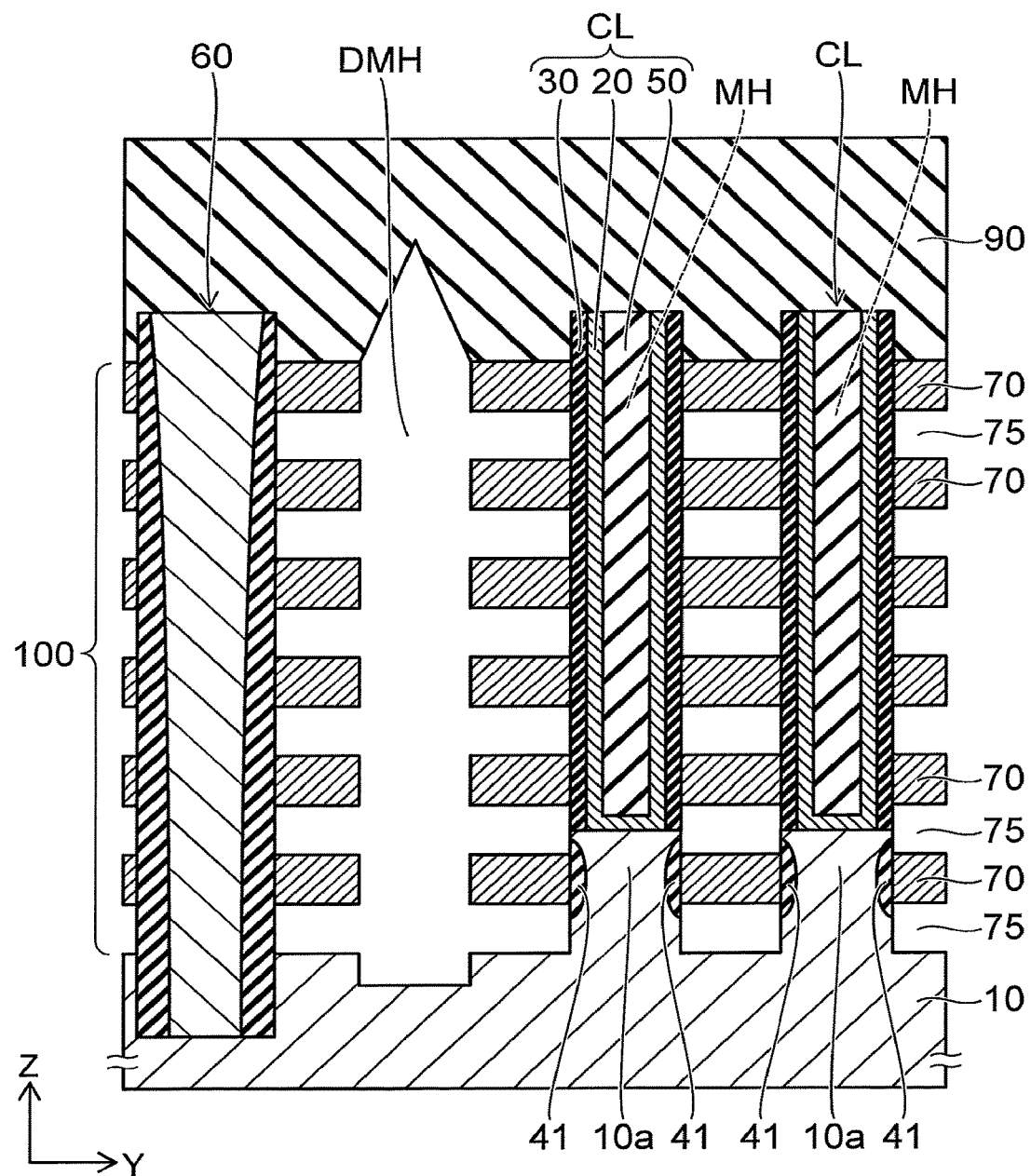
FIG. 21 is a schematic cross-sectional view of the semiconductor device of the embodiment.

FIG. 21 is a schematic cross-sectional view showing another example of the memory cell array of the embodiment. FIG. 21 corresponds to the cross-sectional view of FIG. 3.

In the structure of FIG. 21, the air gap 75 is formed also between the major surface of the substrate 10 and the conductive layer 70 of the lowermost layer. Also, the protrusions 10a of the substrate 10 are not formed under the holes DMH; and the bottoms of the holes DMH are at a position that is lower than the bottoms of the columnar portions CL inside the memory holes MH.

A method for manufacturing the structure shown in FIG. 21 will now be described with reference to FIG. 22 to FIG. 30C.

The cross-sectional views of FIG. 22 to FIG. 29 correspond to the A-A cross section of FIG. 2.

Figure 22:
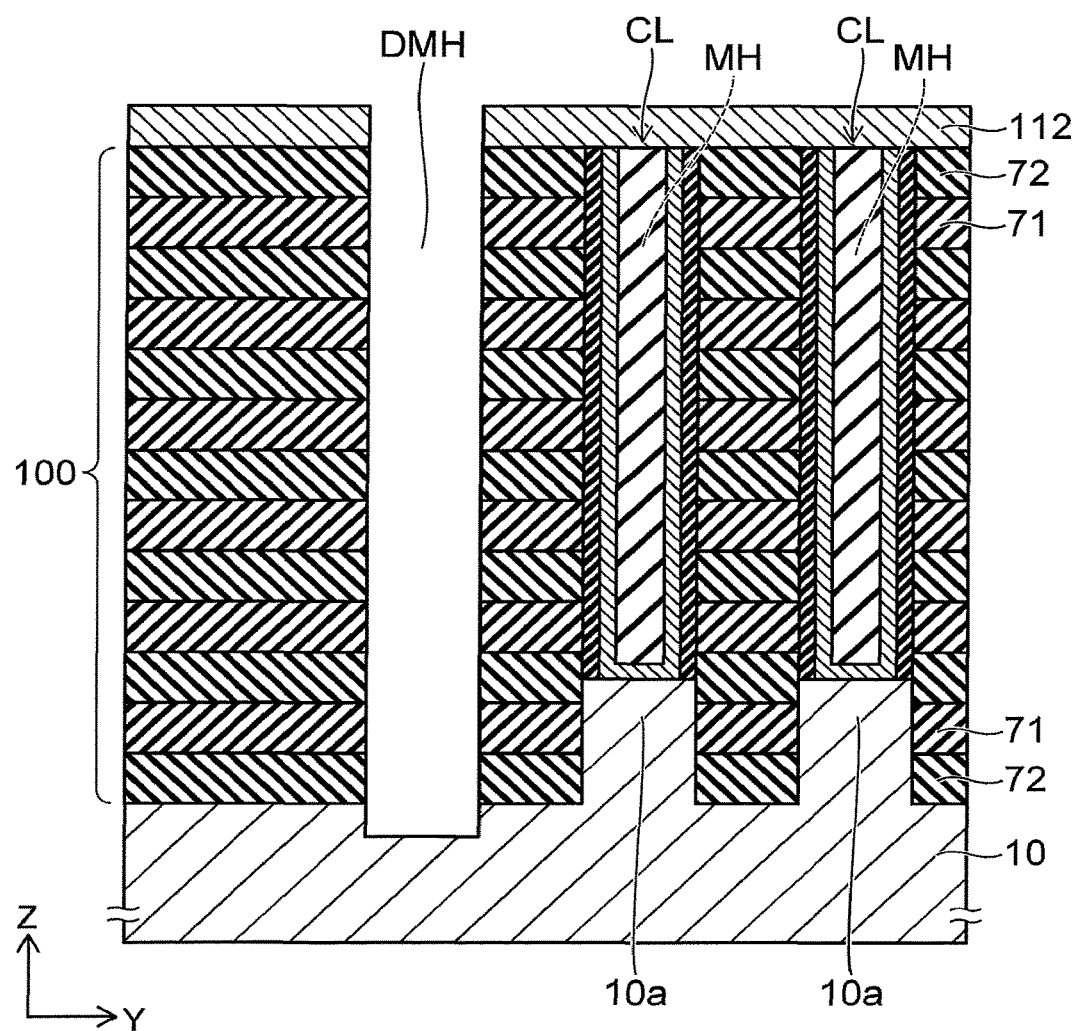
FIG. 22 to FIG. 29 are schematic cross-sectional views showing a method for manufacturing the semiconductor device of the embodiment.
Figure 30A:
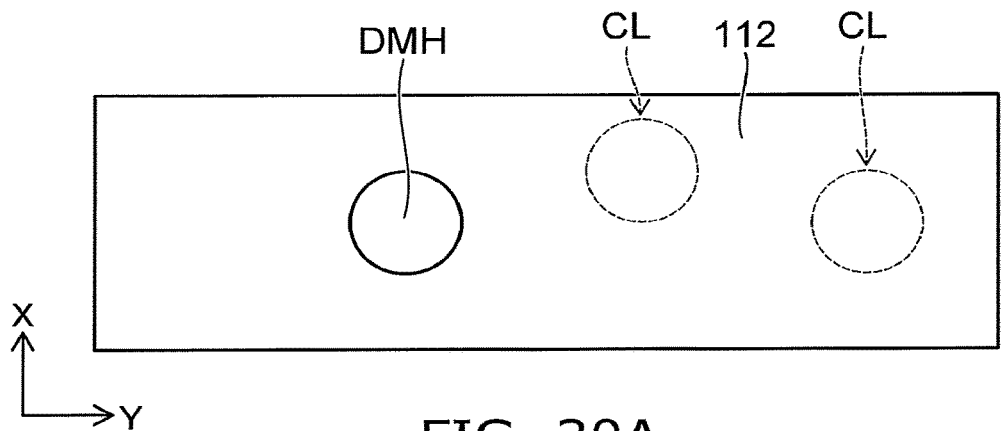
FIG. 30A to FIG. 30C are schematic plan views showing a method for manufacturing the semiconductor device of the embodiment.

FIG. 30A corresponds to the top view of FIG. 22.

Figure 27:
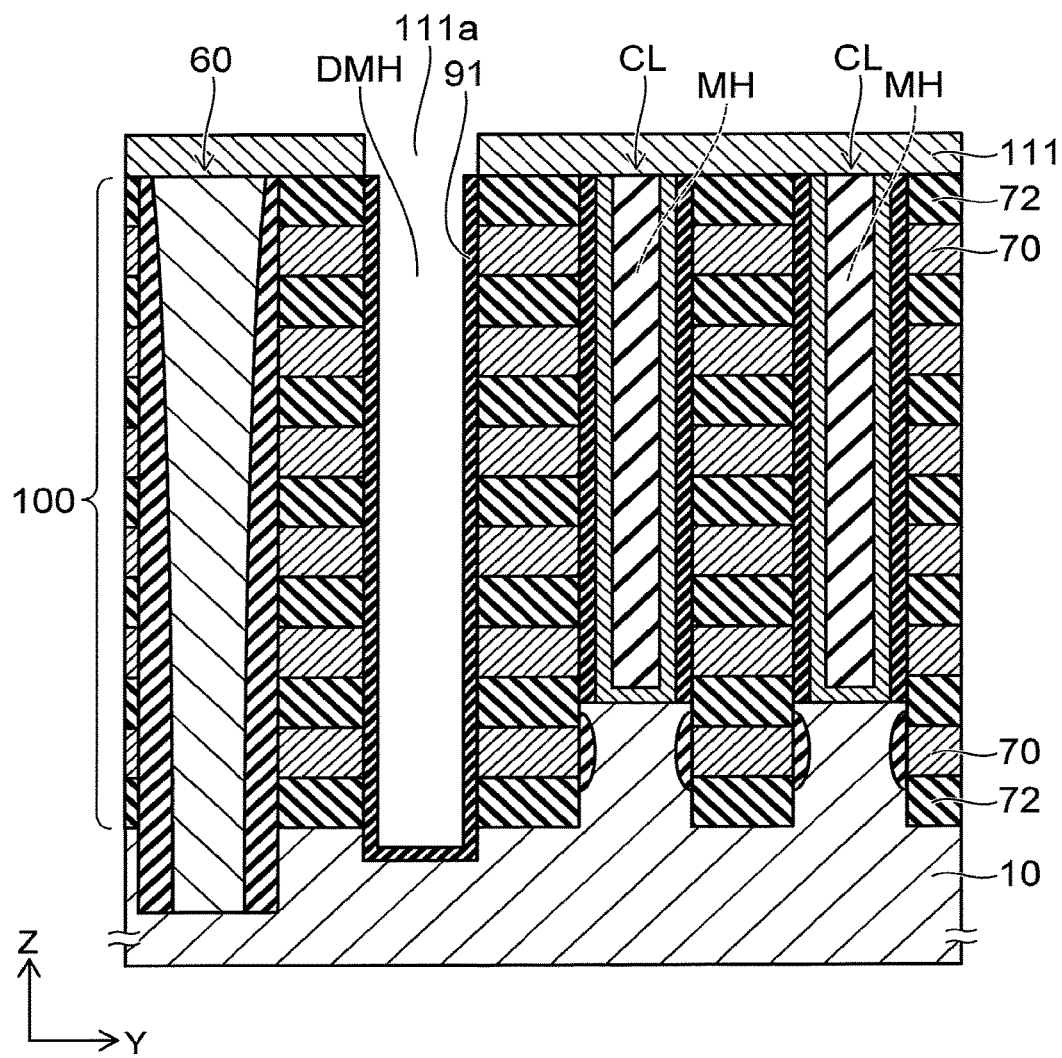
Figure 30B:
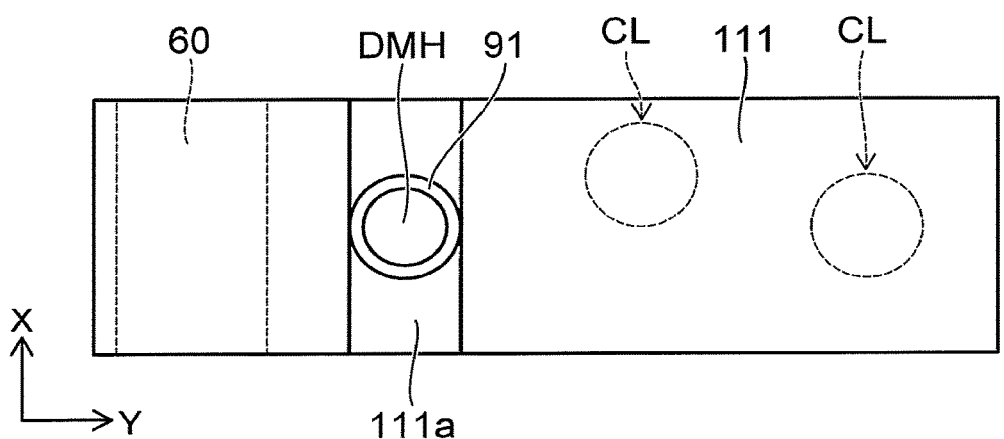

FIG. 30B corresponds to the top view of FIG. 27.

Figure 28:
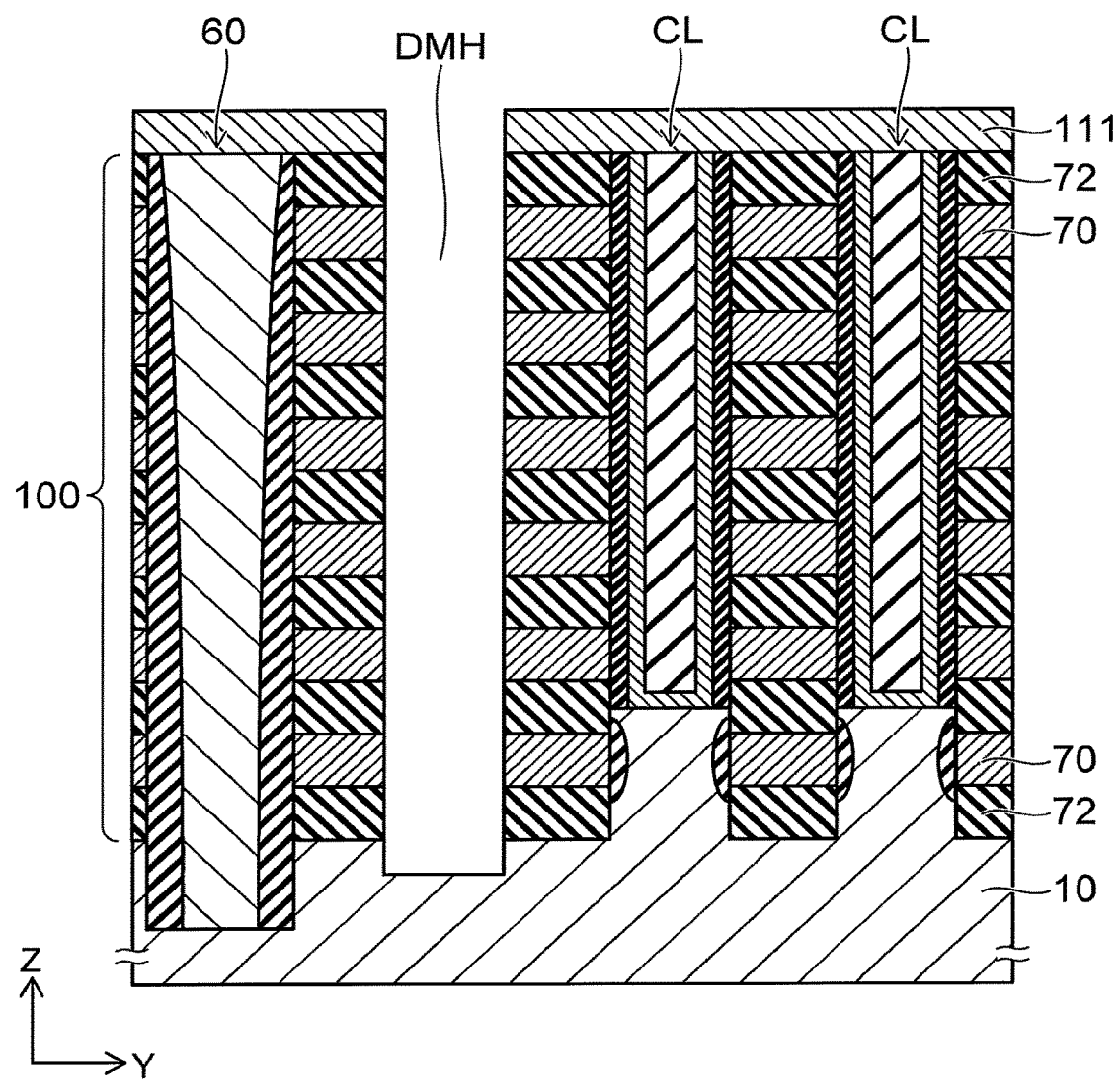
Figure 30C:
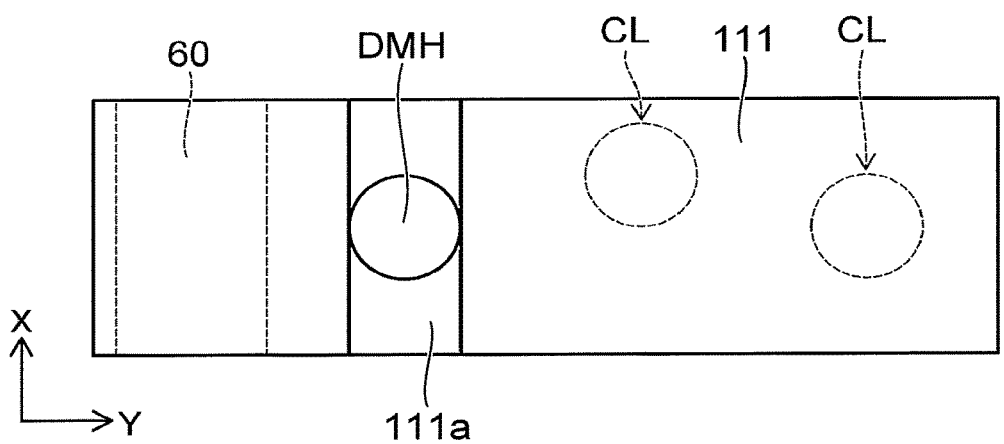

FIG. 30C corresponds to the top view of FIG. 28.

First, similarly to the processes described above, the columnar portions CL are formed on the protrusions 10a of the substrate 10 inside the memory holes MH. Subsequently, as shown in FIG. 22 and FIG. 30A, a capping layer (or a mask layer) 112 is formed on the stacked body 100 to cover the columnar portions CL; and the holes DMH are formed in the stacked body 100 by RIE using the capping layer 112 as a mask. The holes DMH pierce the stacked body 100 and reach the substrate 10. The protrusions 10a are not epitaxially grown on the bottoms of the holes DMH.

Figure 23:
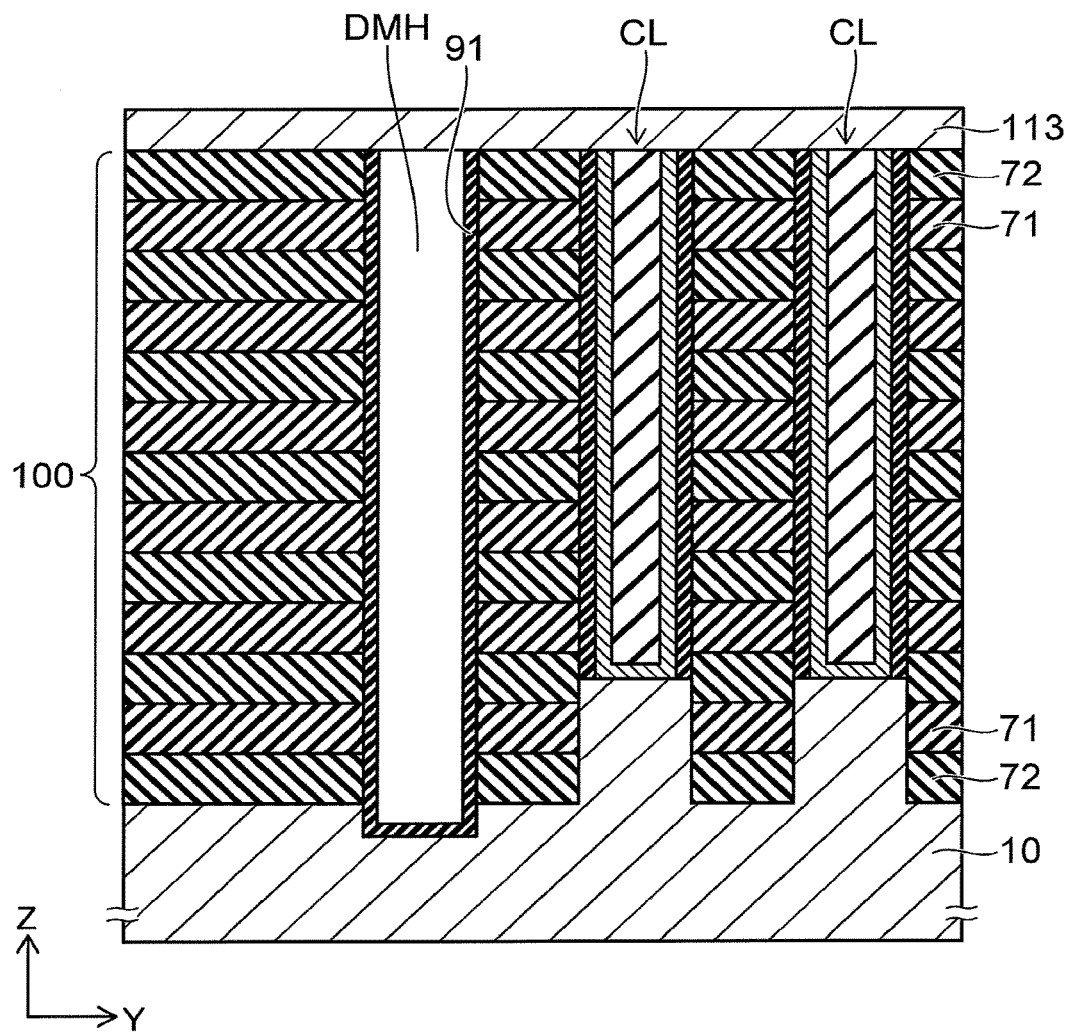

After removing the capping layer 112, a cover film 91 is formed inside the hole DMH as shown in FIG. 23. The cover film 91 is a sacrificial film removed in a subsequent process. The cover film 91 is, for example, a silicon oxide film. The cover film 91 is formed conformally on the side surface and the bottom of the hole DMH.

After forming the cover film 91, a capping layer (or a mask layer) 113 is formed on the stacked body 100. The capping layer 113 plugs the upper end of the hole DMH in a state in which a cavity remains inside the hole DMH.

Figure 24:
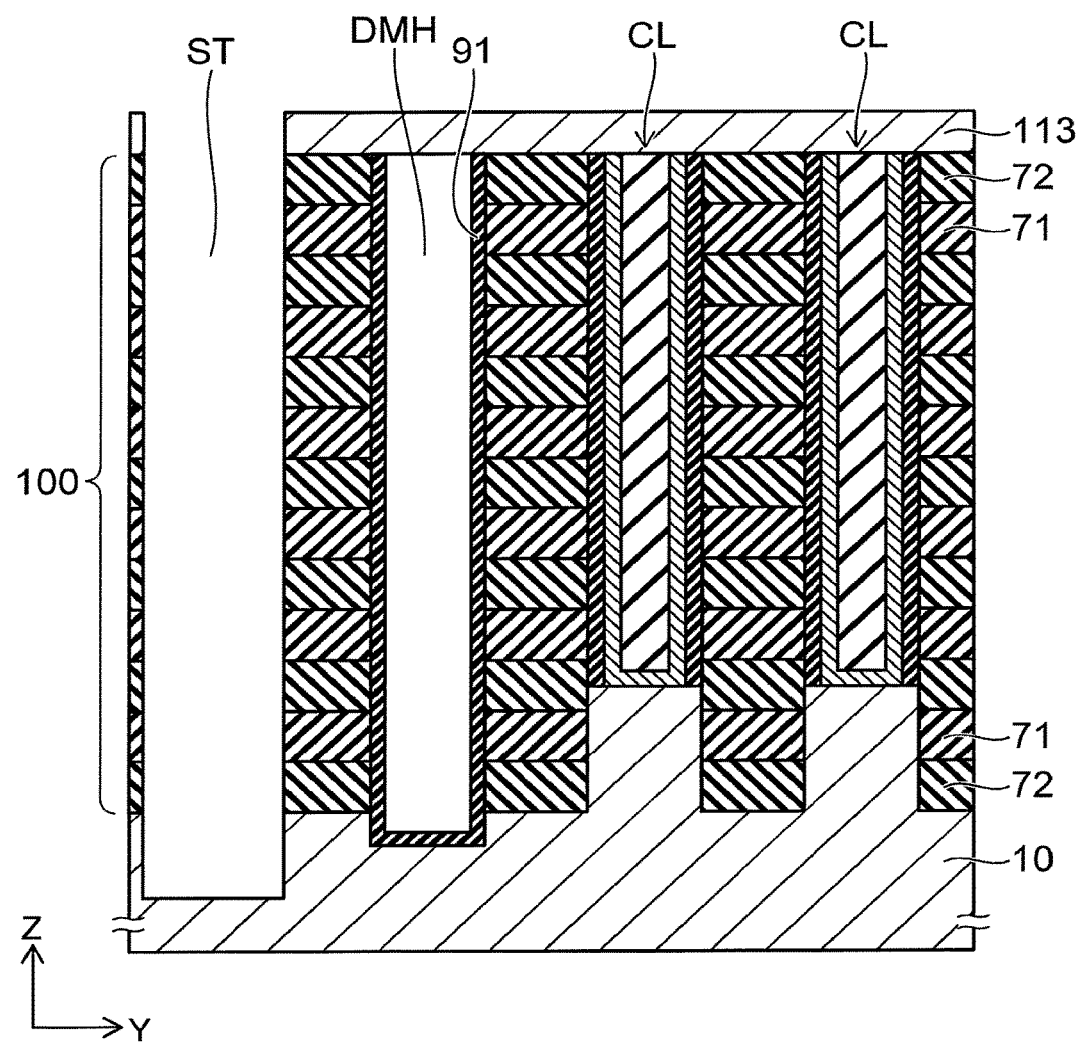

Subsequently, the slit ST is formed in the stacked body 100 as shown in FIG. 24 by RIE using the capping layer 113 as a mask. The slit ST pierces the stacked body 100 and reaches the substrate 10.

Then, the sacrificial layers 71 which are silicon nitride layers are removed using, for example, an etchant including phosphoric acid supplied through the slit ST.

Figure 25:
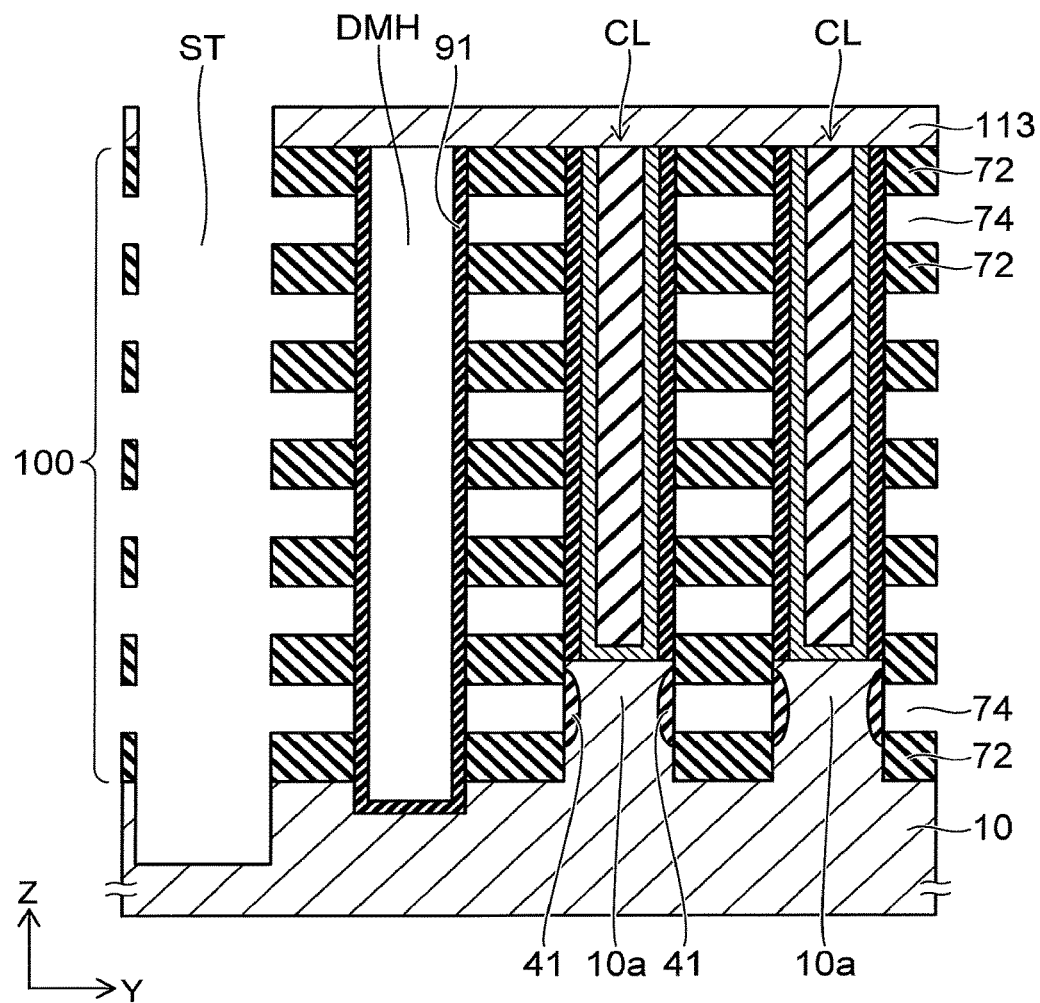

The sacrificial layers 71 are removed; and the air gap 74 is formed between the insulating layers 72 adjacent to each other in the stacking direction as shown in FIG. 25. The cover film 91 is formed on the side surface of the hole DMH. The cover film 91 has resistance to the etching that removes the sacrificial layers 71 and remains because the cover film 91 is a material that is different from the sacrificial layer 71 and is, for example, a silicon oxide film.

Figure 26:
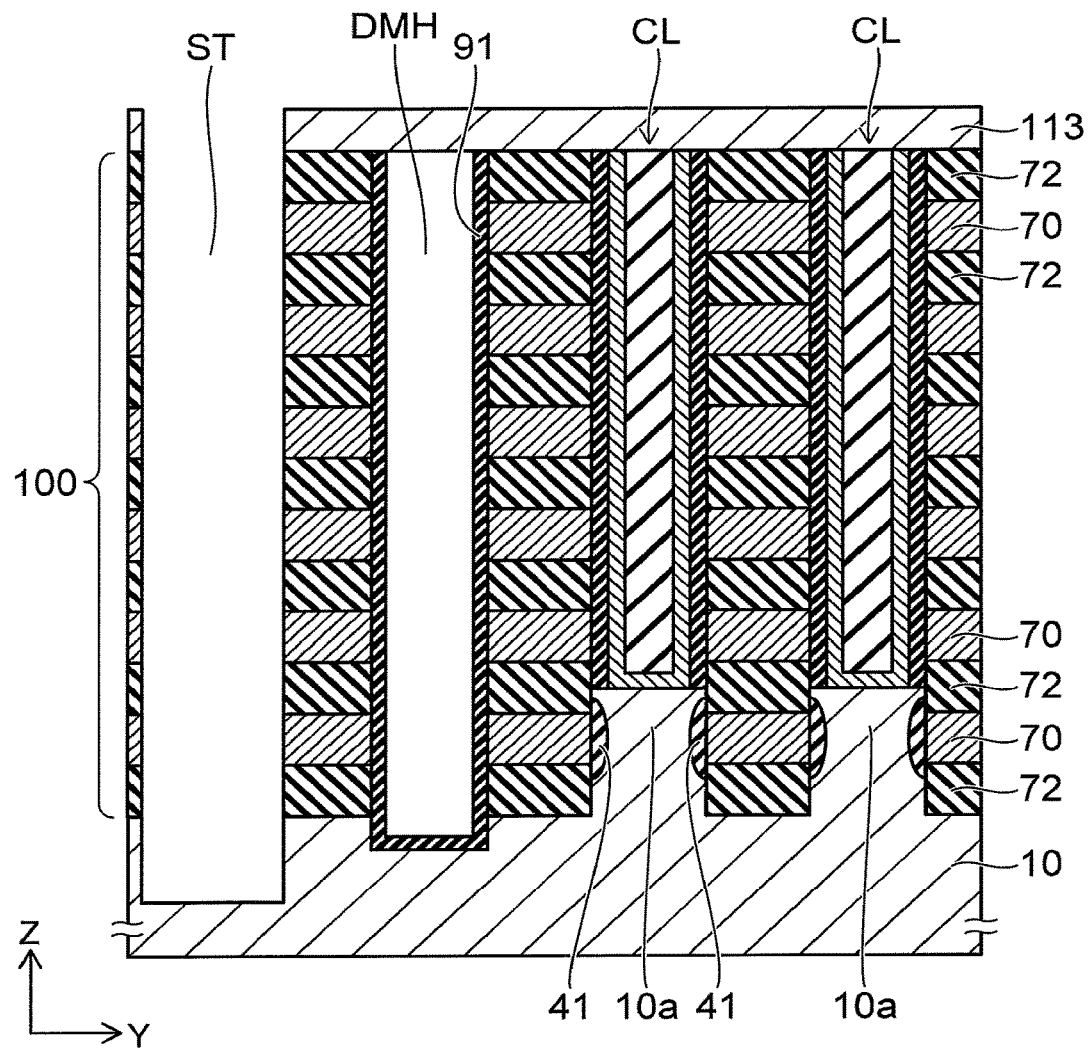

The conductive layers 70 shown in FIG. 26 are formed in the air gap 74 with the second blocking film 35 shown in FIG. 4A interposed. The source gas when forming the conductive layers 70 is blocked by the capping layer 113 and the cover film and does not enter the holes DMH. Accordingly, the conductive layers 70 are not formed inside the holes DMH.

After removing the conductive layer 70 formed at the side surface of the slit ST, the separation portion 60 that includes the insulating film 61 and the interconnect portion LI is formed inside the slit ST as shown in FIG. 27.

After forming the separation portion 60, the capping layer (or the mask layer) 111 is formed on the stacked body 100 as shown in FIG. 27 and FIG. 30B. The capping layer 111 covers the upper end portion of the separation portion 60 and the upper end portions of the columnar portions CL inside the memory holes MH.

The opening 111a is formed in the capping layer 111; and the holes DMH and the cover film 91 inside the holes DMH are exposed from the opening 111a.

Then, the end portions on the hole DMH side of the insulating layers 72 are exposed inside the holes DMH as shown in FIG. 28 and FIG. 30C by removing the cover film 91 inside the holes DMH by etching.

Continuing, the insulating layers 72 are removed by etching through the holes DMH in the state in which the columnar portions CL remain. For example, the insulating layers 72 which are silicon oxide layers are removed using an etchant including hydrofluoric acid.

Figure 29:
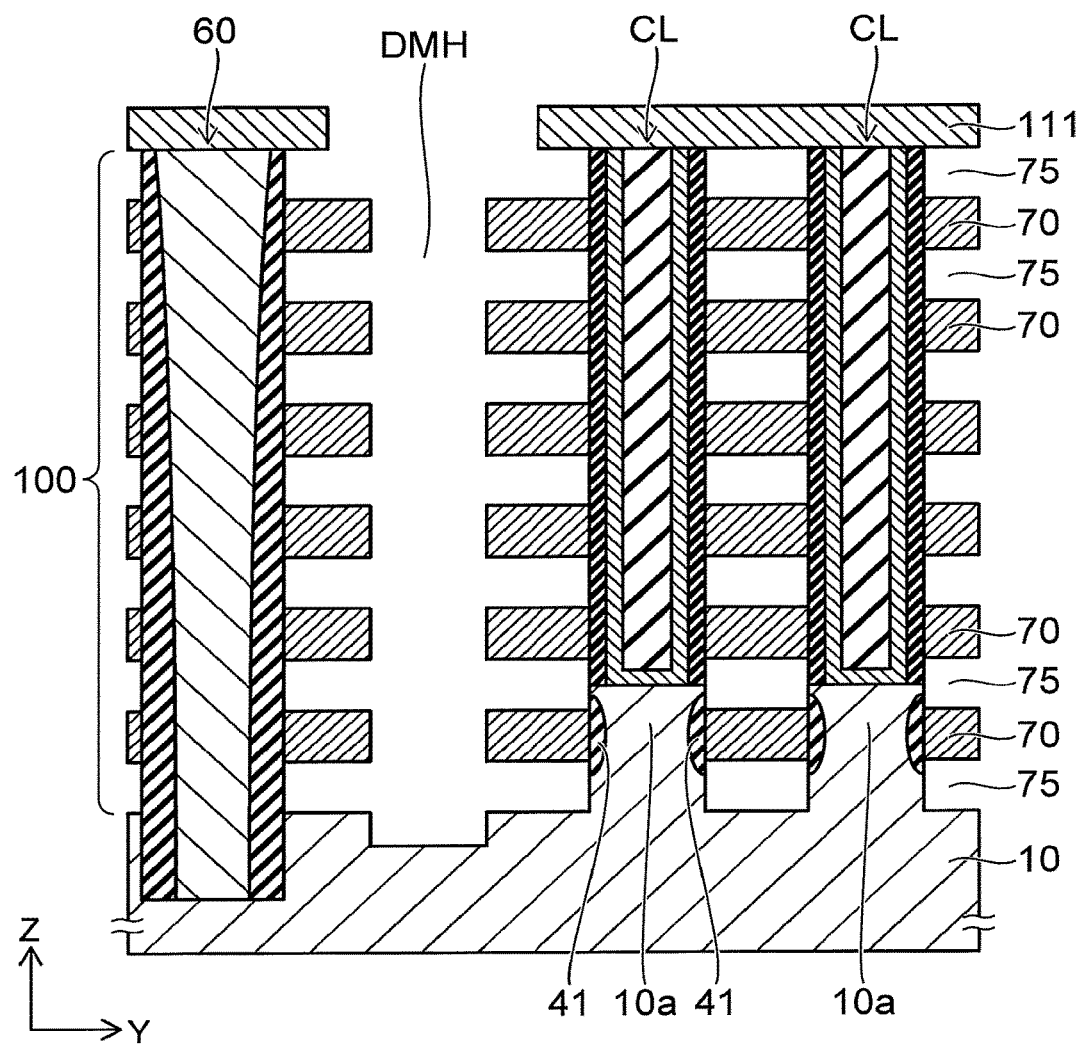

The insulating layers 72 are removed; and the air gap 75 is formed between the conductive layers 70 adjacent to each other in the stacking direction as shown in FIG. 29. The air gap 75 is formed also between the substrate 10 and the conductive layer 70 of the lowermost layer.

Subsequently, the capping layer 111 is removed; as shown in FIG. 21, the sealing film 90 is formed on the stacked body 100; and the upper ends of the holes DMH are plugged with the sealing film 90.

When forming the structure shown in FIG. 21, the holes DMH also can be formed before the columnar portions CL.

After forming the holes DMH and the cover film 91 in the stacked body 100, the upper ends of the holes DMH are plugged with the capping layer (or the mask layer). Subsequently, the structure of FIG. 23 is obtained by forming the memory holes MH in the stacked body 100 and by forming the columnar portions CL inside the memory holes MH.

Figure 31:
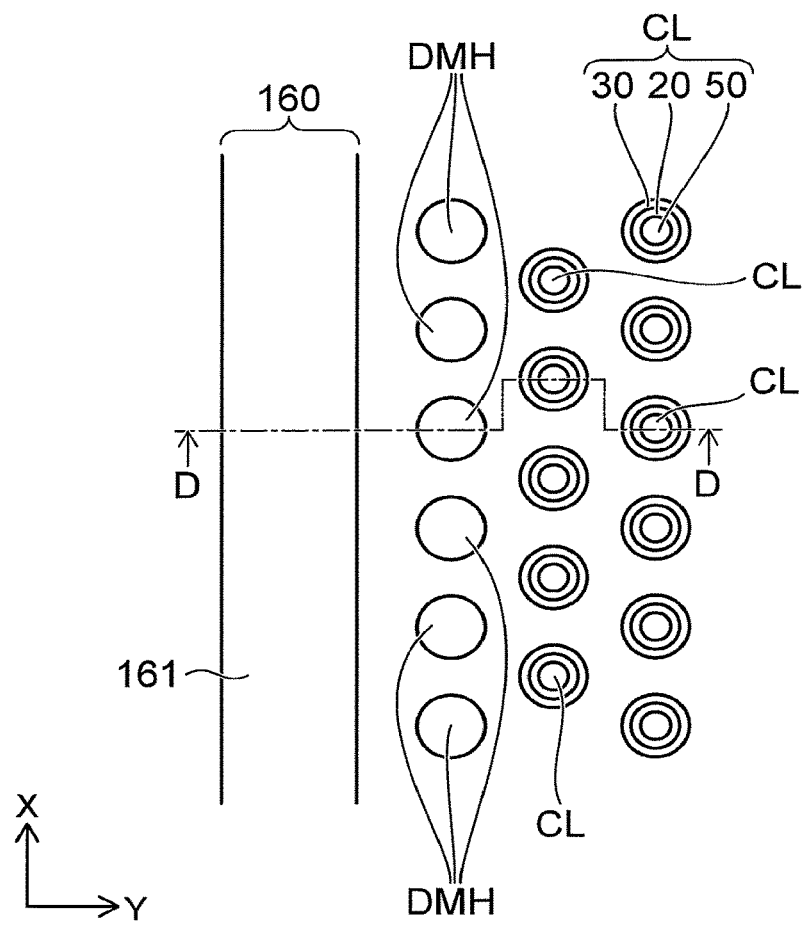
FIG. 31 is a schematic plan view of the semiconductor device of the embodiment.

FIG. 31 is a schematic plan view showing another example of the memory cell array of the embodiment. The region shown in FIG. 31 corresponds to the region on the left side of FIG. 2 in which two columns of columnar portions CL and one column of holes DMH at the vicinity of the separation portion 60 are disposed; and a configuration similar to that of FIG. 2 is formed on the right of FIG. 31.

Figure 32:
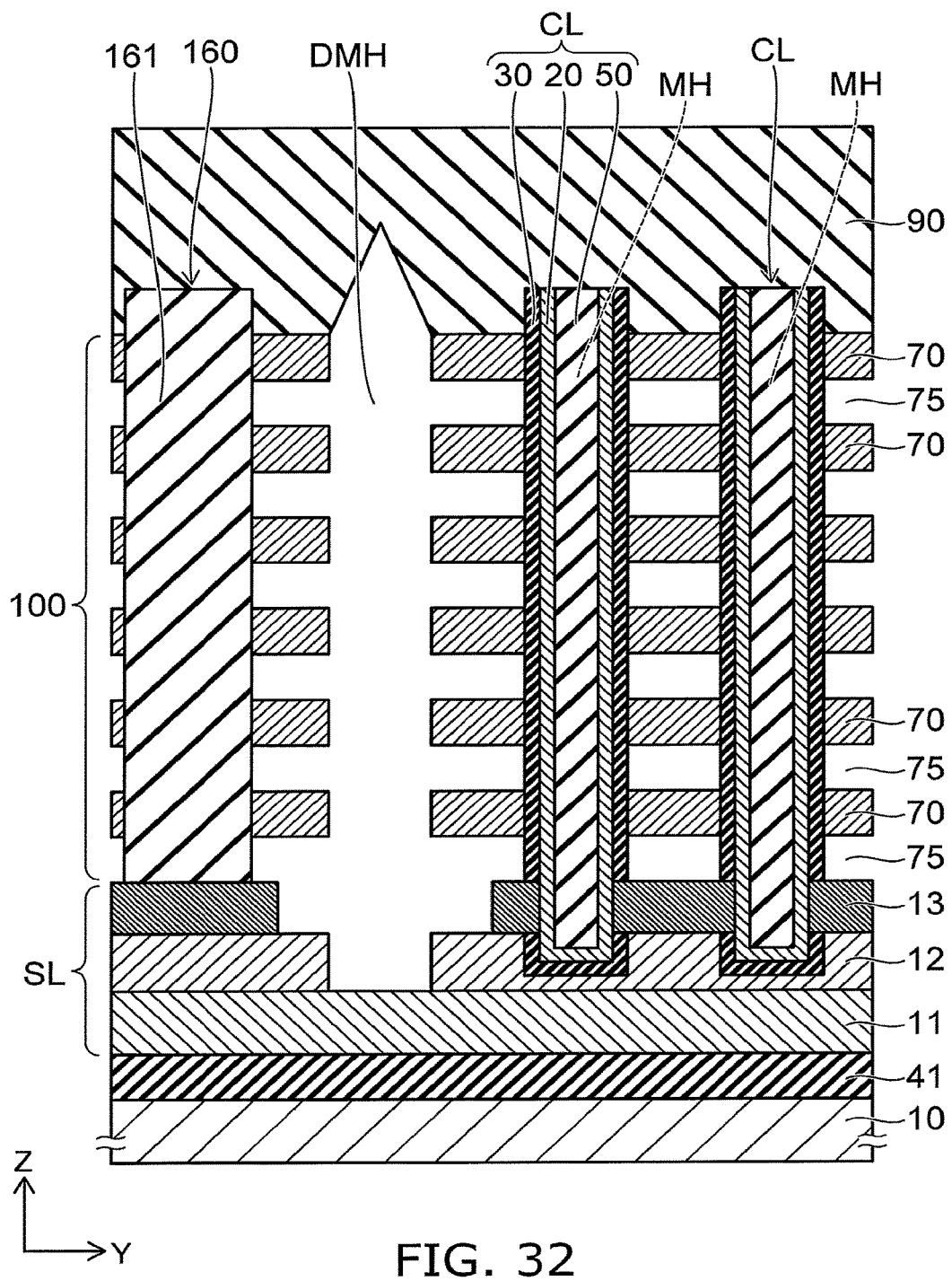
FIG. 32 is a D-D cross-sectional view of FIG. 31.

FIG. 32 is a D-D cross-sectional view of FIG. 31.

In the memory cell array shown in FIG. 32, a source layer SL is provided between the substrate 10 and the stacked body 100. The source layer SL constitutes a part of a foundation layer.

An insulating layer 41 is provided on the substrate 10; and the source layer SL is provided on the insulating layer 41. Or, a layer including a circuit for controlling the memory cell array may be provided between the substrate 10 and the source layer SL.

The source layer SL includes a layer 11 including a metal provided on the insulating layer 41, a semiconductor layer 12 provided on the layer 11 including the metal, and a semiconductor layer 13 provided on the semiconductor layer 12.

For example, the layer 11 including the metal is a tungsten layer or a tungsten silicide layer; and the semiconductor layer 12 and the semiconductor layer 13 are polycrystalline silicon layers doped with an impurity.

The stacked body 100 is provided on the source layer SL. Similar to the embodiment recited above, the stacked body 100 includes the multiple conductive layers 70 stacked with the air gap 75 interposed. The air gap 75 is formed also between the semiconductor layer 13 of the source layer SL and the conductive layer 70 of the lowermost layer.

The multiple columnar portions CL that extend in the stacking direction of the stacked body 100 (the Z-direction) are provided inside the stacked body 100; and the columnar portions CL pierce the stacked body 100 and reach the semiconductor layer 12 of the source layer SL.

A portion of the side surfaces of the semiconductor bodies 20 contacts the semiconductor layer 13 of the source layer SL. The semiconductor layer 13 surrounds the side surfaces of the semiconductor bodies 20 of the multiple columnar portions CL.

As shown in FIG. 31, the multiple holes DMH are disposed between a separation portion 160 and the Y-direction endmost column of the multiple columnar portions CL. The multiple holes DMH are arranged in the X-direction.

As shown in FIG. 32, the holes DMH pierce the stacked body 100 and reach the source layer SL. The holes DMH communicate with the air gap 75 between the conductive layers 70.

As shown in FIG. 31, the separation portion 160 extends in the X-direction and divides the stacked body 100 into the multiple blocks (or fingers) in the Y-direction.

As shown in FIG. 32, the separation portion 160 pierces the stacked body 100 and reaches the source layer SL. The separation portion 160 includes an insulating film 161 formed inside a slit described below. The separation portion 160 does not include an interconnect portion.

The sealing film 90 is provided on the stacked body 100. The sealing film 90 covers the upper ends of the columnar portions CL and the upper end of the separation portion 160. The sealing film 90 also plugs the upper end of the hole DMH and causes a cavity to remain inside the hole DMH.

The method for manufacturing the structure shown in FIG. 31 and FIG. 32 will now be described with reference to FIG. 33 to FIG. 44. The cross-sectional views of FIG. 33 to FIG. 44 correspond to the D-D cross section of FIG. 31.

Figure 33:
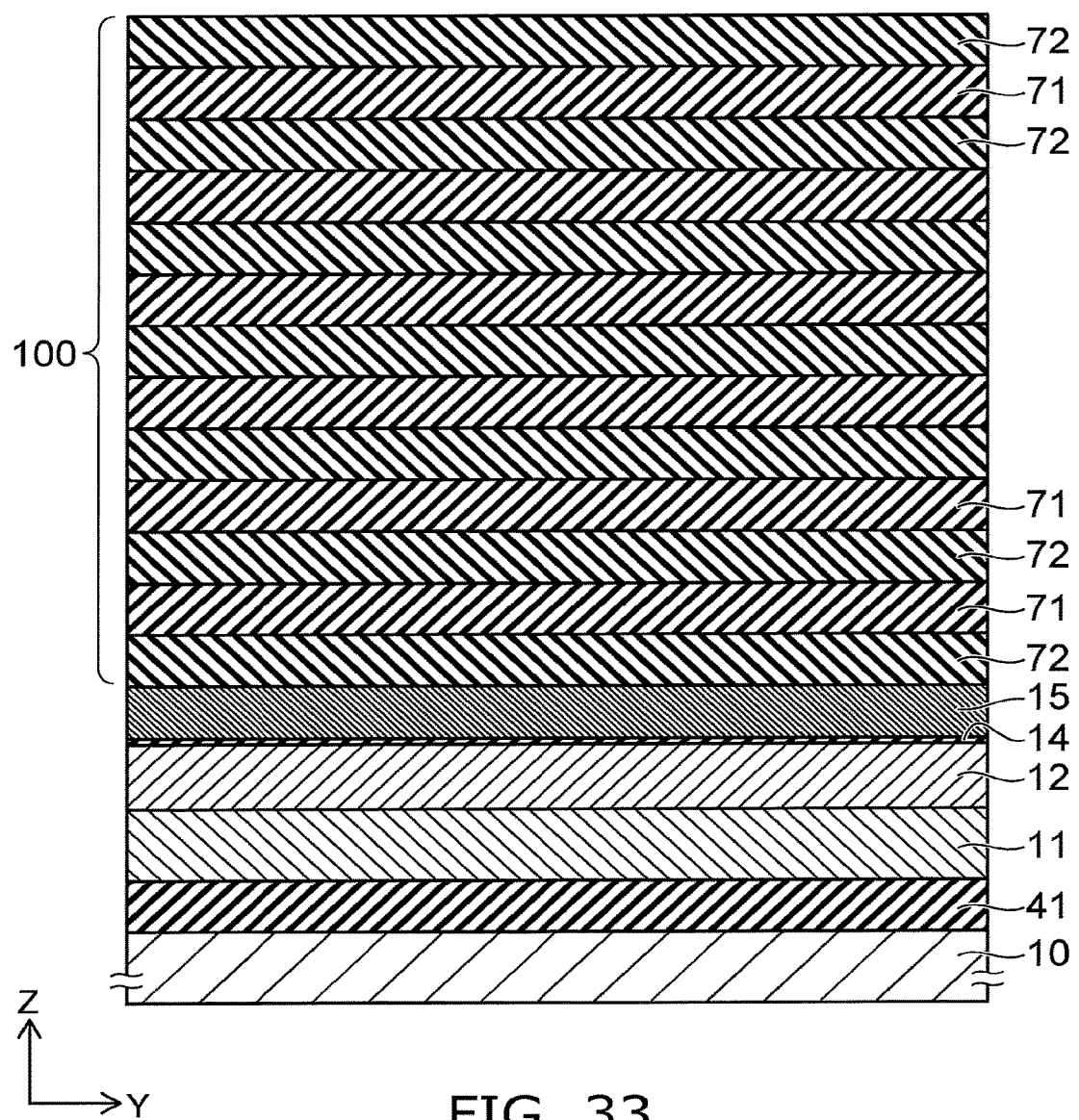
FIG. 33 to FIG. 44 are schematic cross-sectional views showing a method for manufacturing the semiconductor device of the embodiment.

As shown in FIG. 33, the insulating layer 41 is formed on the substrate 10; the layer 11 including the metal is formed on the insulating layer 41; and the semiconductor layer 12 is formed on the layer 11 including the metal.

A cover film 14 is formed on the semiconductor layer 12. The cover film 14 is, for example, a silicon oxide film. A sacrificial layer 15 is formed on the cover film 14. The sacrificial layer 15 is, for example, a polycrystalline silicon layer.

The stacked body 100 including the multiple insulating layers 72 and the multiple sacrificial layers 71 stacked alternately is formed on the sacrificial layer 15.

Figure 34:
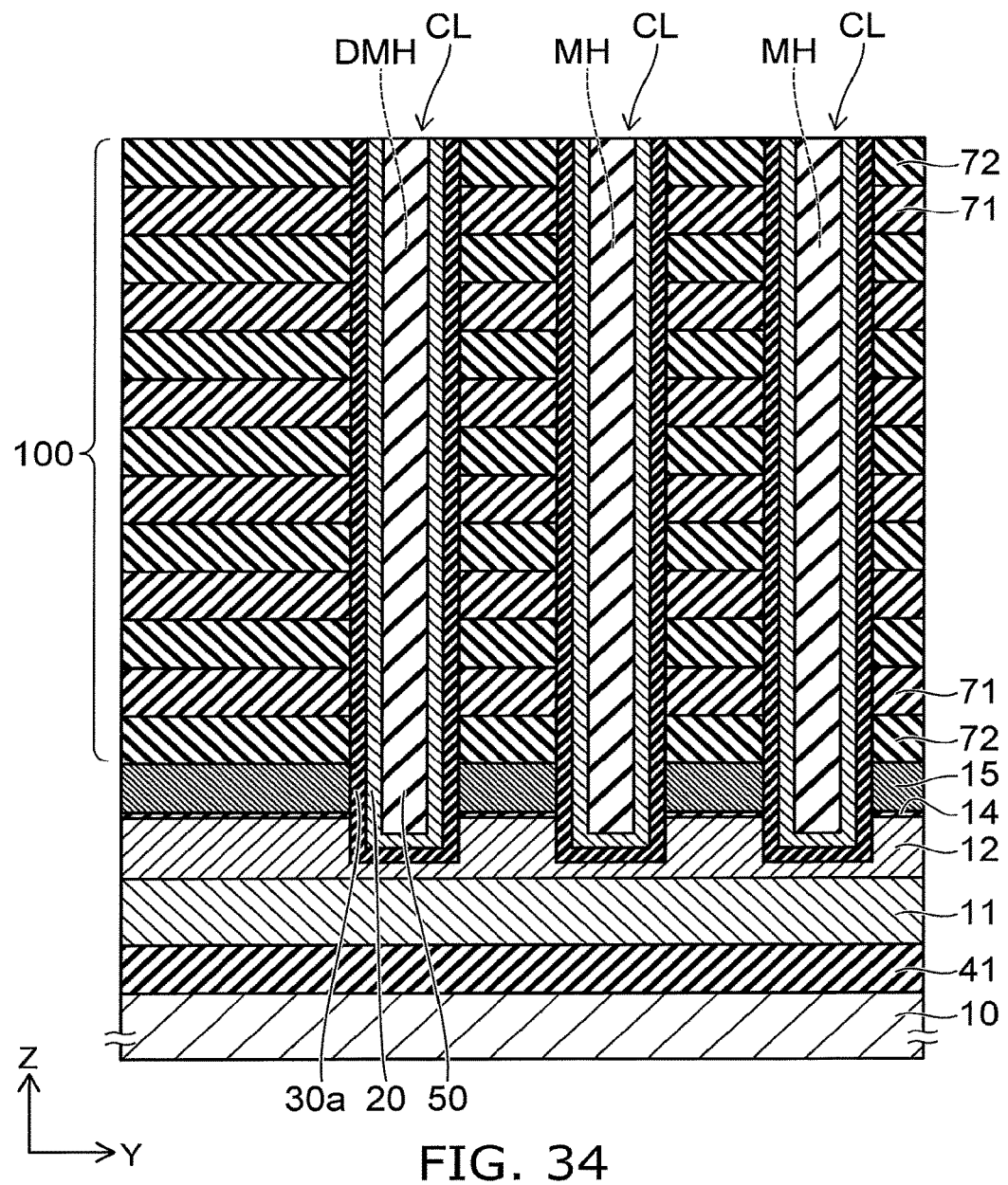

The multiple memory holes MH and the multiple holes DMH are formed simultaneously in the stacked body 100 by RIE using a not-illustrated mask layer. As shown in FIG. 34, the columnar portions CL including the stacked film 30a, the semiconductor body 20, and the core film 50 are formed inside the memory holes MH and the holes DMH. The columnar portions CL are formed simultaneously inside the memory holes MH and inside the holes DMH.

The columnar portions CL pierce the stacked body 100, the sacrificial layer 15, and the cover film 14; and the bottoms of the columnar portions CL reach the semiconductor layer 12.

Figure 35:
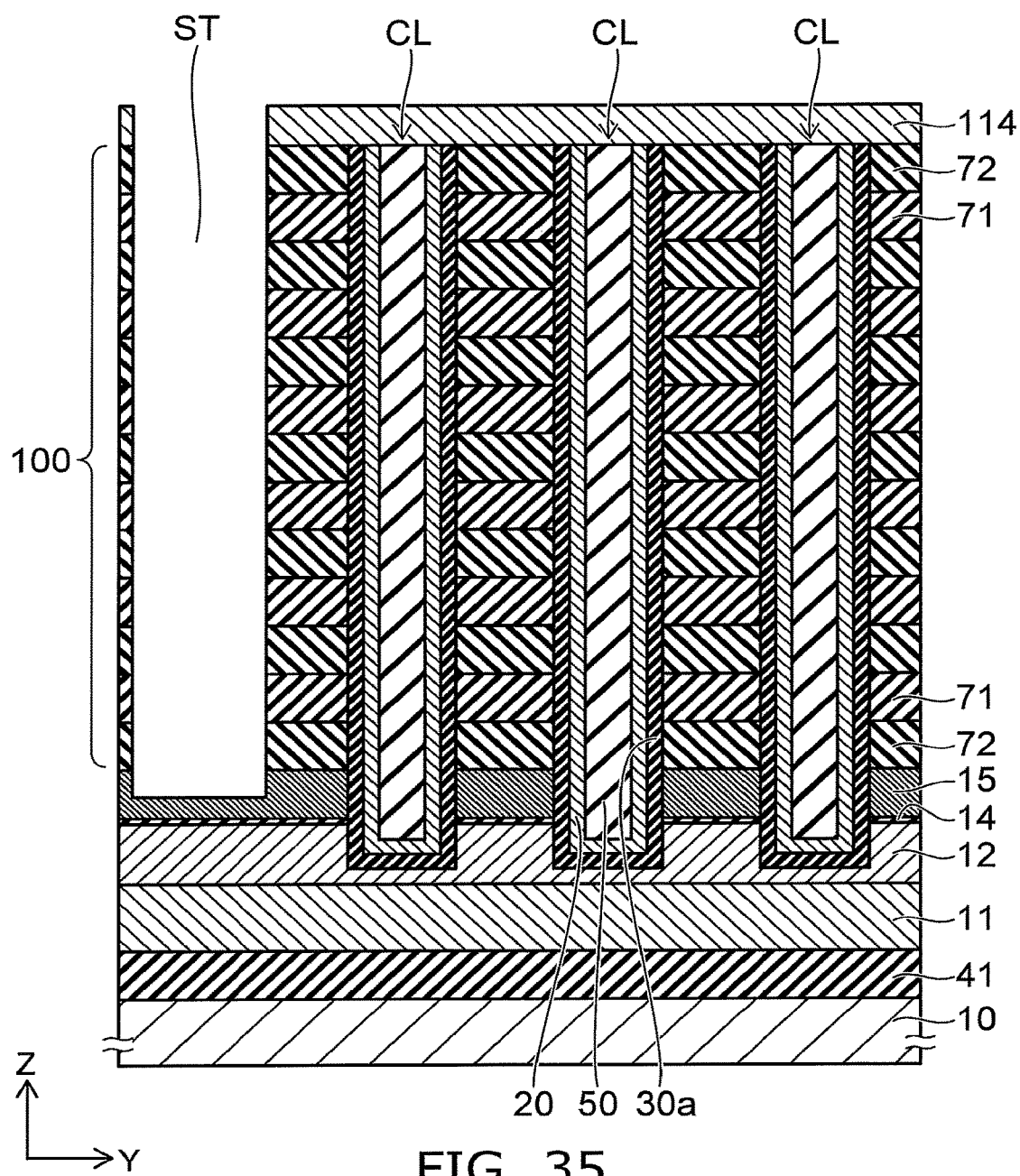

Subsequently, as shown in FIG. 35, a capping layer (or a mask layer) 114 is formed on the stacked body 100 to cover the upper ends of the columnar portions CL; and the slit ST is formed in the stacked body 100 by RIE. The slit ST pierces the stacked body 100 and reaches the sacrificial layer 15.

Figure 36:
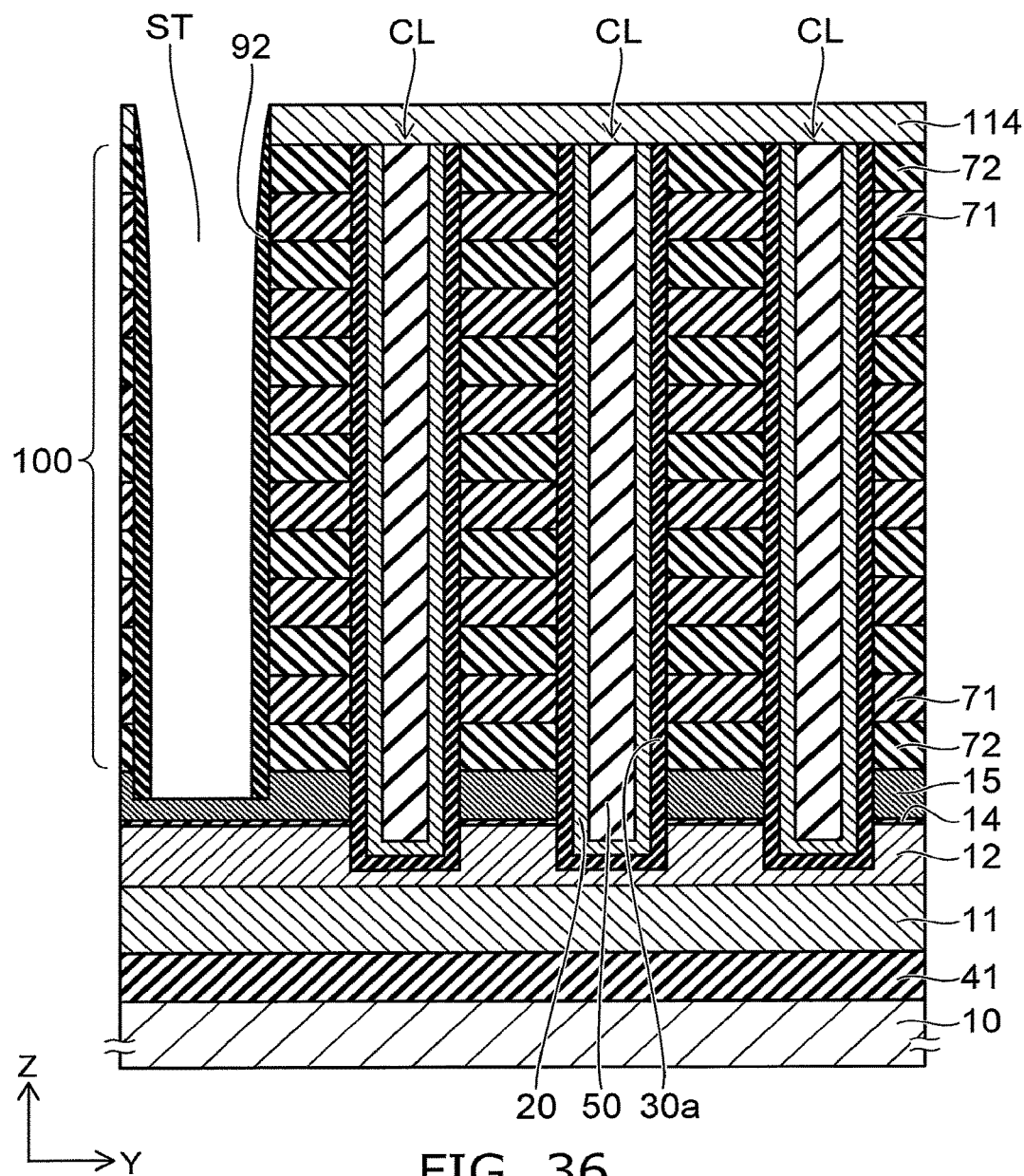

As shown in FIG. 36, a liner film 92 is formed on the side surface of the slit ST. The liner film 92 is, for example, a silicon nitride film. The liner film 92 is formed conformally on the side surface and the bottom of the slit ST; and the liner film 92 at the bottom of the slit ST is removed by RIE. The sacrificial layer 15 is exposed at the bottom of the slit ST.

Figure 37:
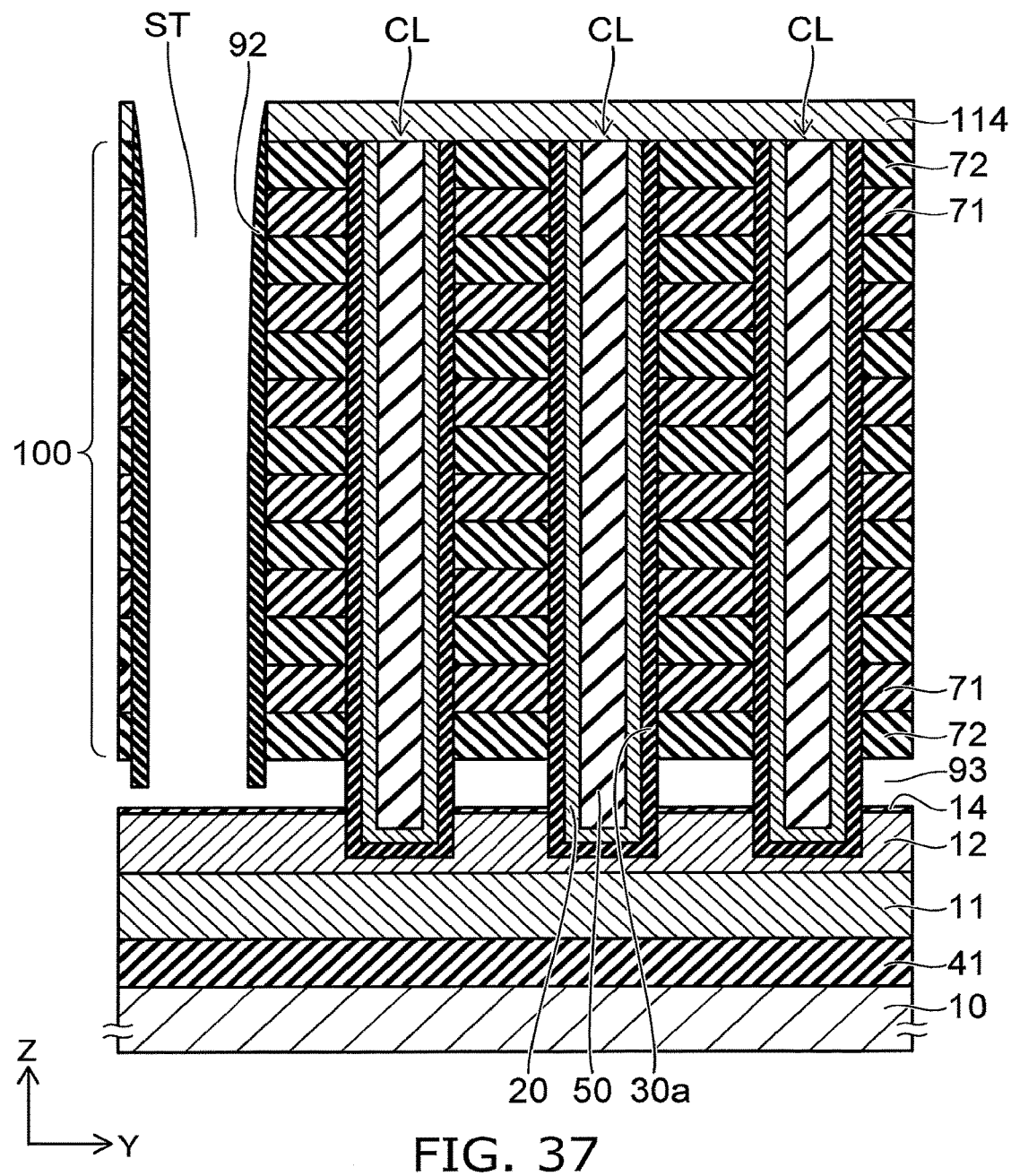

Then, the sacrificial layer 15 is removed by etching through the slit ST. The sacrificial layer 15 is removed; and as shown in FIG. 37, a cavity 93 is formed between the stacked body 100 and the cover film 14. At this time, the upper surface of the semiconductor layer 12 is covered with the cover film 14; and the semiconductor layer 12 is not etched.

Figure 38:
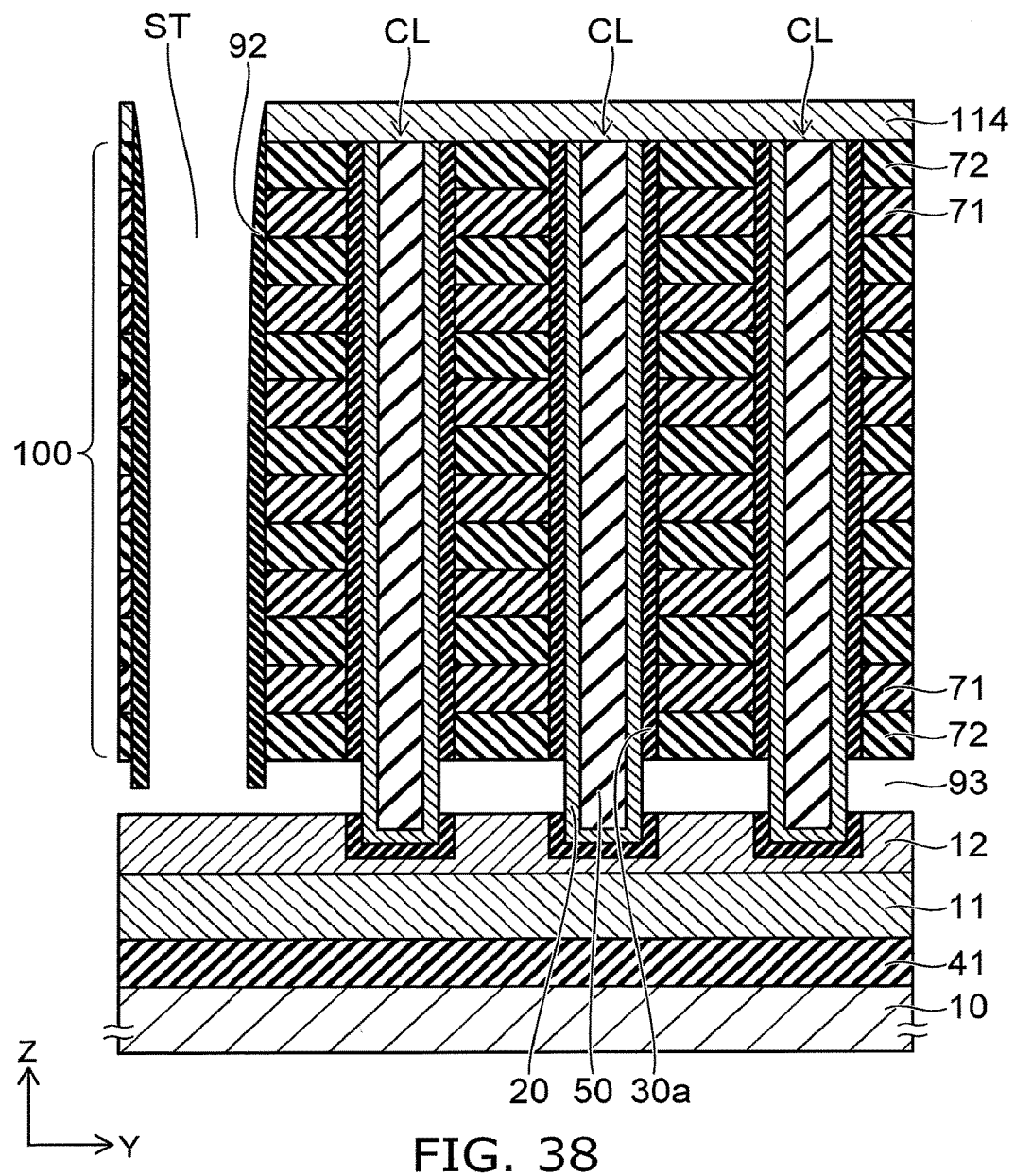

A portion of the side surfaces of the stacked films 30a of the columnar portions CL is exposed in the cavity 93. The stacked film 30a exposed in the cavity 93 is removed by etching through the slit ST. As shown in FIG. 38, the stacked film 30a is divided vertically at the position of the cavity 93; and a portion of the side surfaces of the semiconductor bodies 20 is exposed in the cavity 93.

The cover film 14 that is of the same material (silicon oxide) as the film included in the stacked film 30a also is removed; and the upper surface of the semiconductor layer 12 is exposed in the cavity 93.

When removing the portion of the stacked film 30a, the end portions on the slit ST side of the insulating layers 72 which are silicon oxide layers are covered with the liner film 92; and the insulating layers 72 are not etched.

Figure 39:
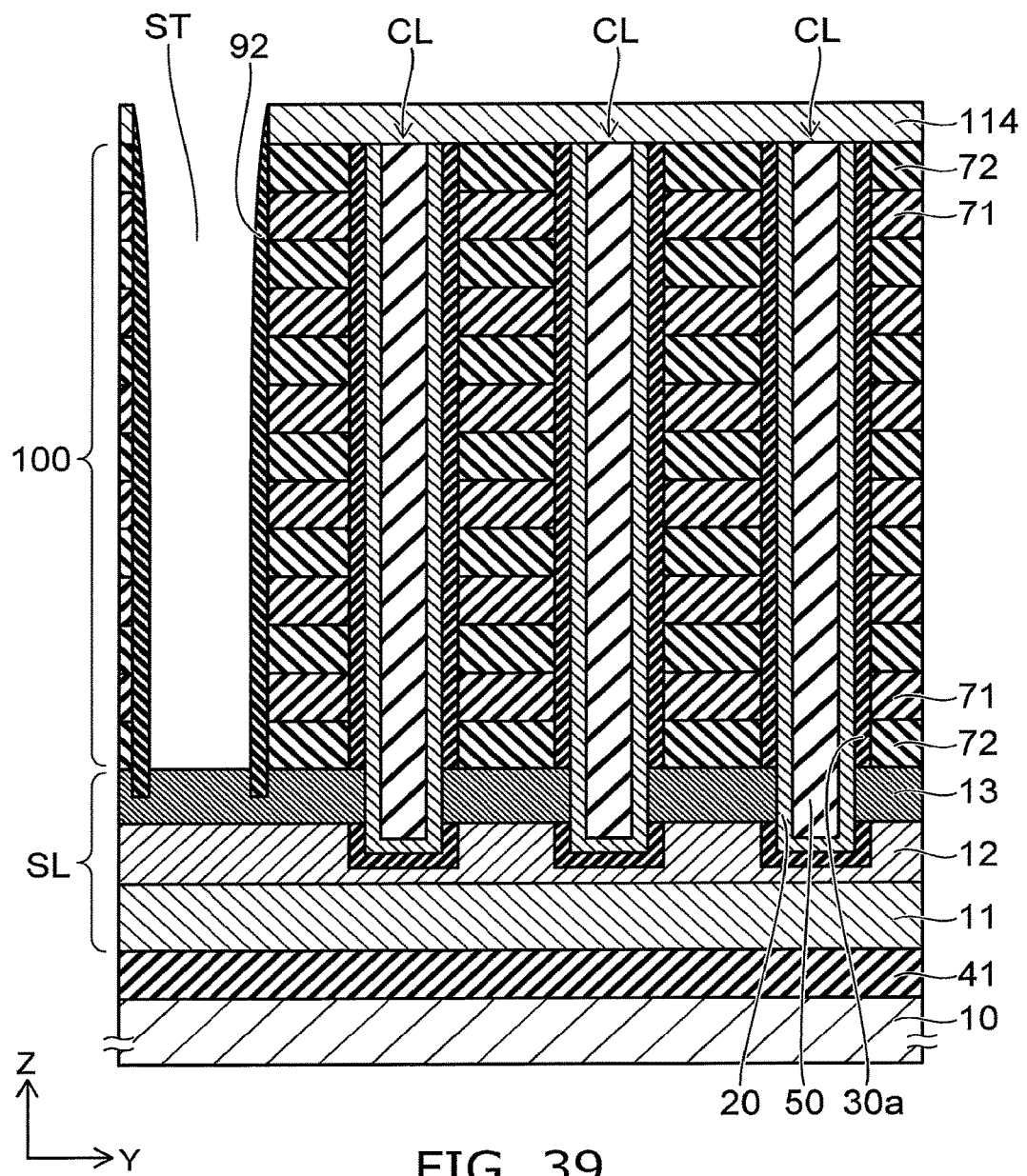

As shown in FIG. 39, the semiconductor layer 13 is formed in the cavity 93. A source gas is supplied to the cavity 93 through the slit ST; and the semiconductor layer 13 is grown from the upper surface of the semiconductor layer 12 and the side surfaces of the semiconductor bodies 20 exposed in the cavity 93.

Subsequently, the sacrificial layers 71 are removed by etching through the slit ST after removing the liner film 92 on the side surface of the slit ST or simultaneously with the process of removing the liner film 92.

Figure 40:
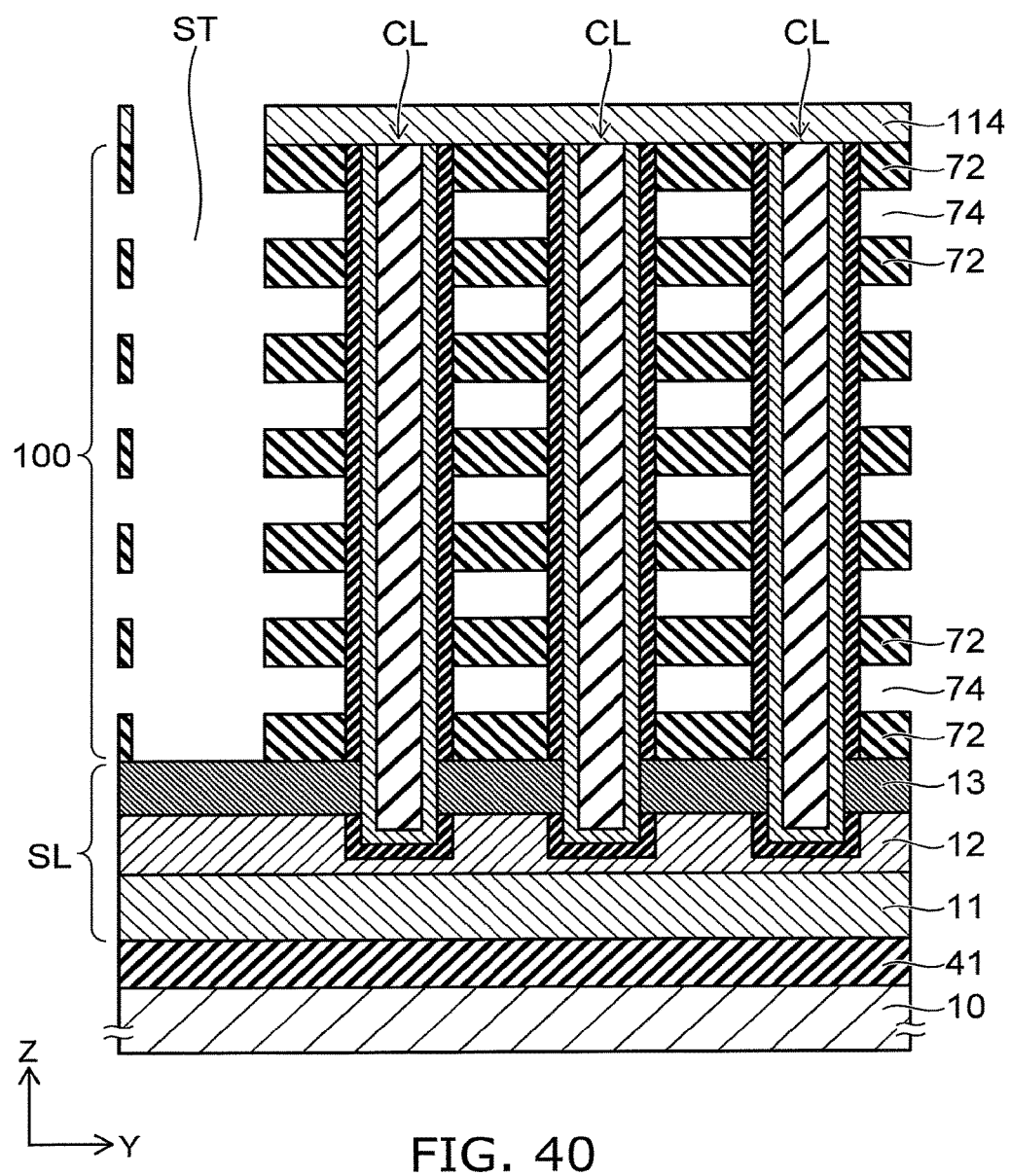

The sacrificial layers 71 are removed; and as shown in FIG. 40, the air gap 74 is formed between the insulating layers 72 adjacent to each other in the stacking direction.

Figure 41:
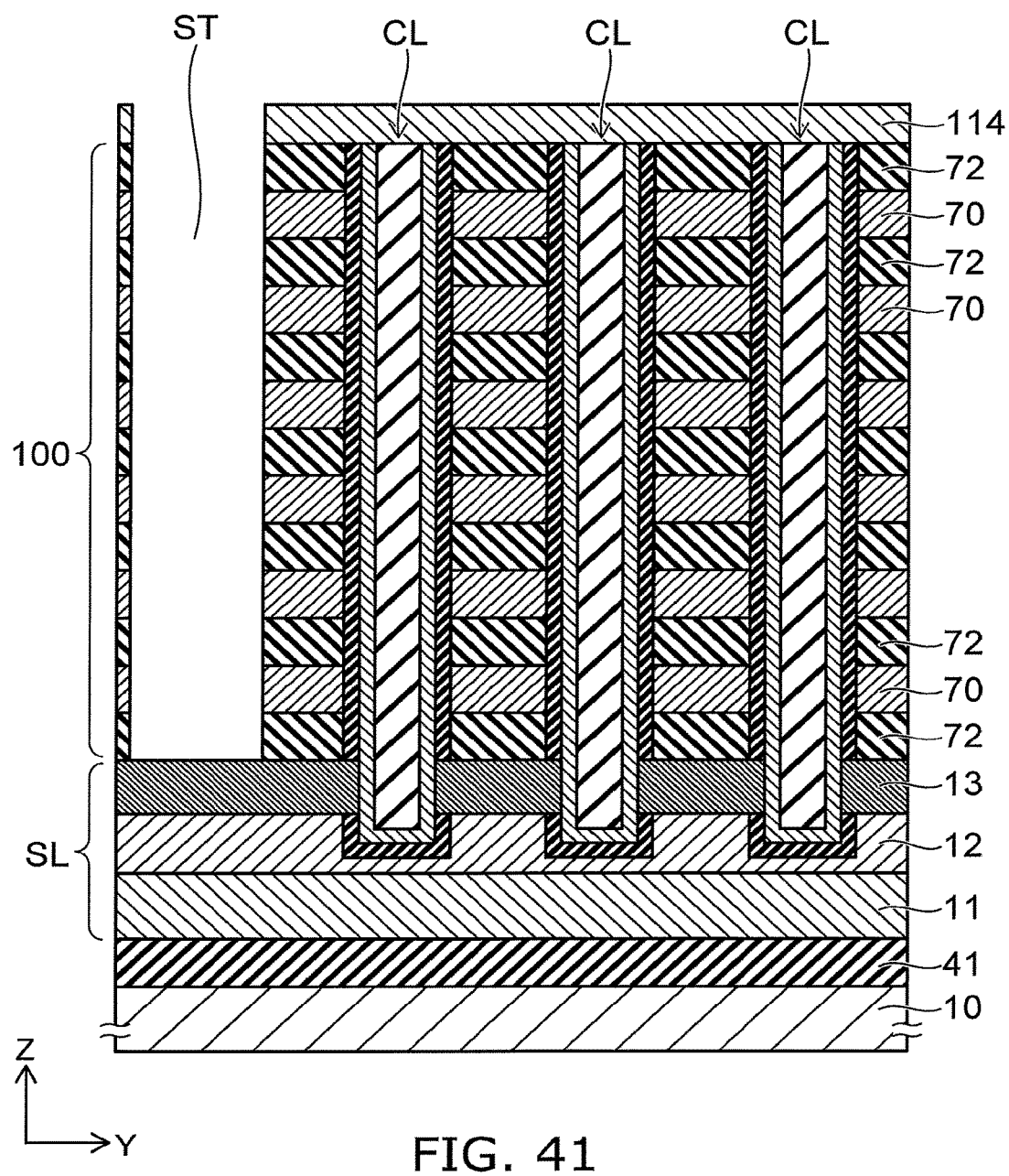
Figure 42:
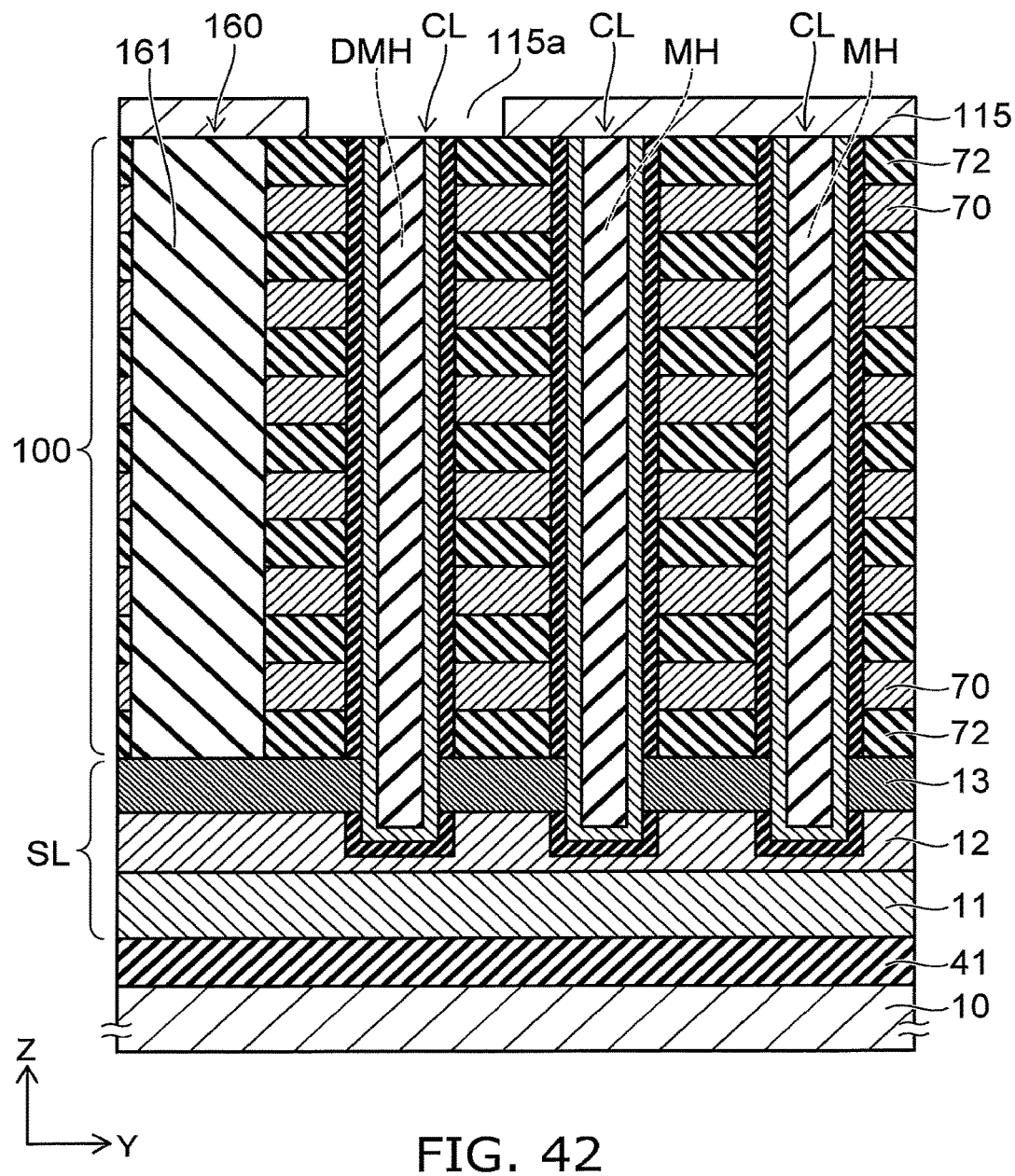

Then, the conductive layers 70 shown in FIG. 41 are formed with the second blocking film 35 shown in FIG. 4A interposed in the air gap 74 by supplying a source gas to the air gap 74 through the slit ST. Subsequently, as shown in FIG. 42, the separation portion 160 is formed by filling the insulating film 161 into the slit ST.

After forming the separation portion 160, a capping layer (or a mask layer) 115 is formed on the stacked body 100. The capping layer 115 covers the upper end portion of the separation portion 160 and the upper end portions of the columnar portions CL inside the memory holes MH. The capping layer 115 may be formed separately from the mask layer when forming the slit ST shown in FIG. 35 or may be formed as a stacked structure stacked on the mask layer when forming the slit ST.

An opening 115a is formed in the capping layer 115; and the upper end portions of the columnar portions CL inside the holes DMH are exposed from the opening 115a.

Figure 43:
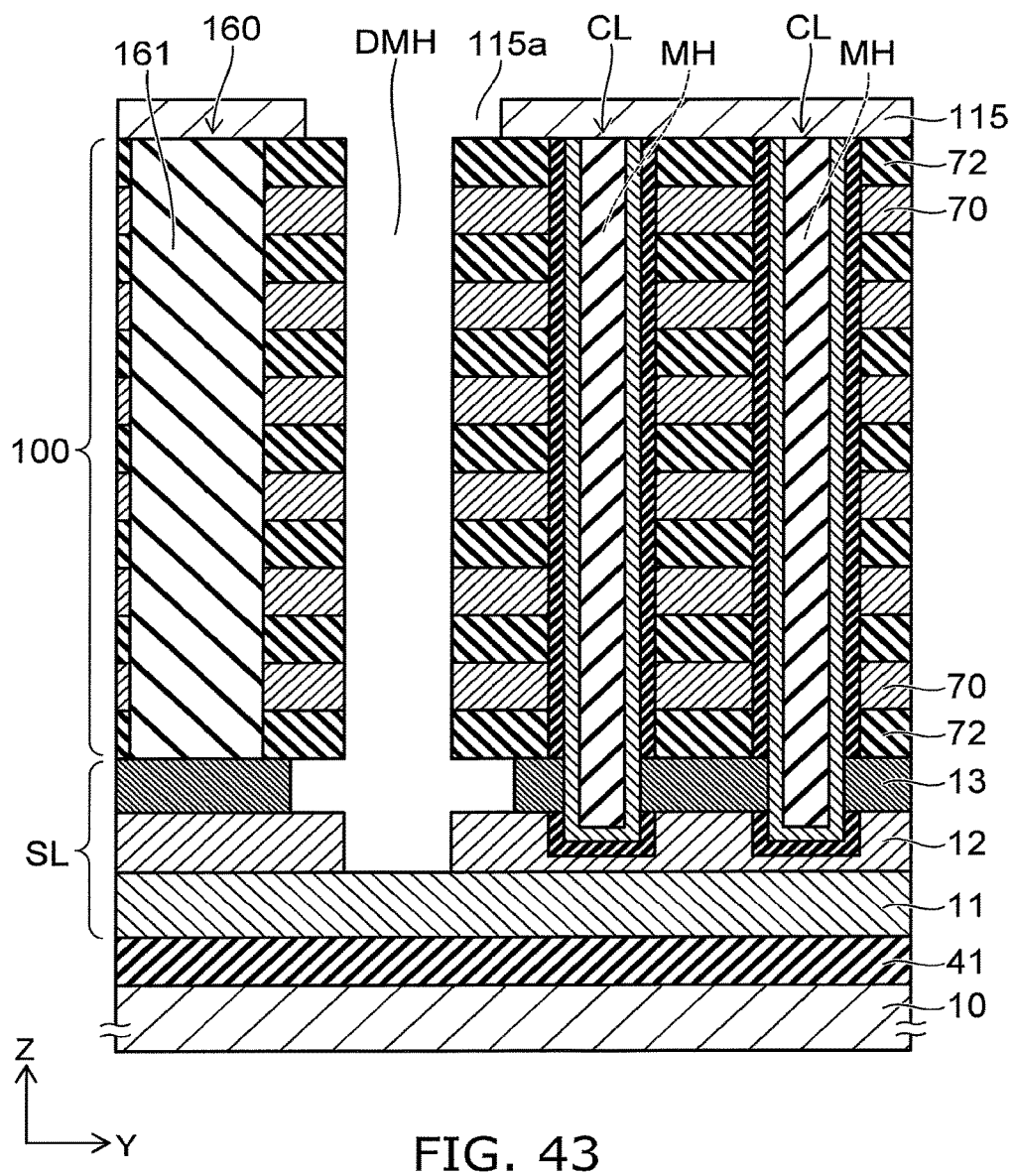

Then, the holes DMH are formed as shown in FIG. 43 by removing the columnar portions CL inside the holes DMH by etching.

Figure 44:
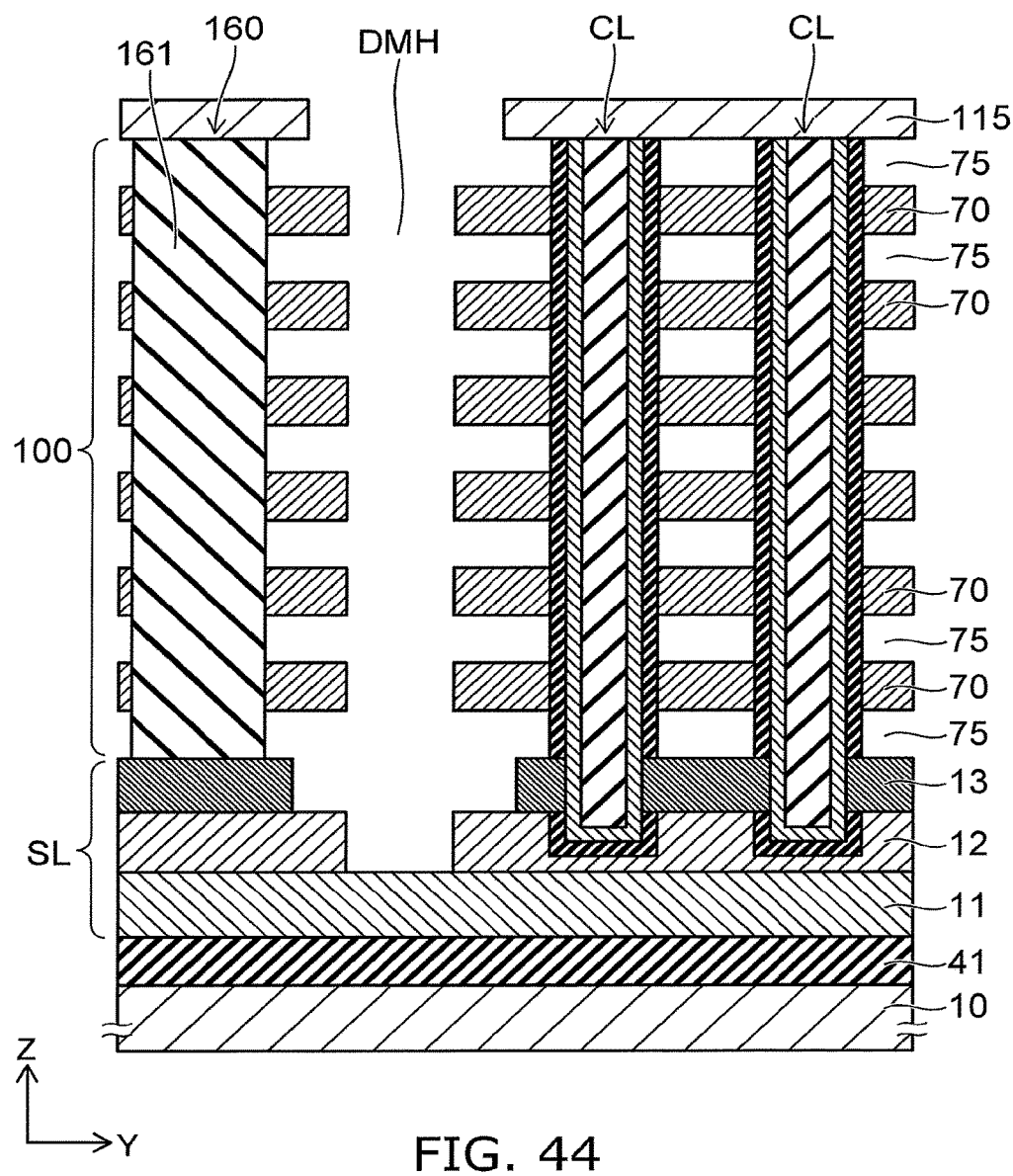

Continuing, the insulating layers 72 are removed by etching through the holes DMH in the state in which the columnar portions CL remain inside the memory holes MH. The insulating layers 72 are removed; and as shown in FIG. 44, the air gap 75 is formed between the conductive layers 70 adjacent to each other in the stacking direction.

Subsequently, the capping layer 115 is removed; and as shown in FIG. 32, the sealing film 90 is formed on the stacked body 100. The sealing film 90 covers the upper ends of the columnar portions CL and the upper end of the separation portion 160. Also, the sealing film 90 plugs the upper ends of the holes DMH in the state in which the cavity remains inside the holes DMH.

Figure 45:
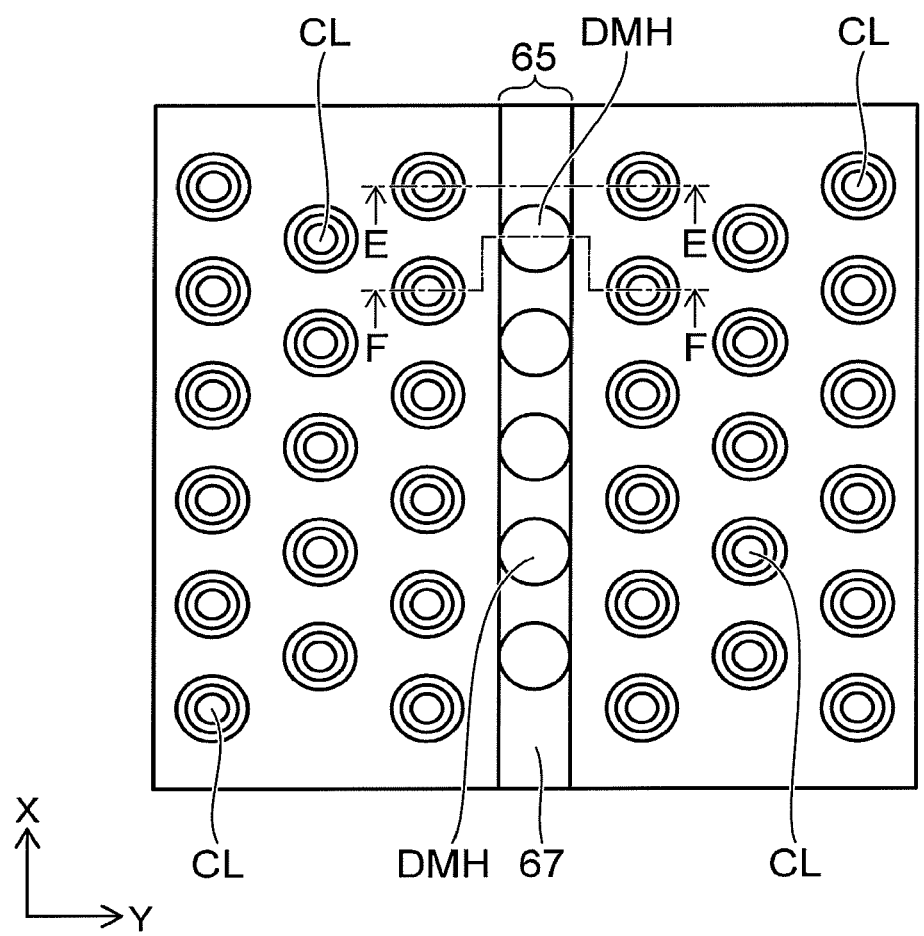
FIG. 45 is a schematic plan view of the semiconductor device of the embodiment.

FIG. 45 is a schematic plan view showing another example of the separation portion 65. Although only the region of the vicinity of the separation portion 65 is shown in FIG. 45, the separation portion 60 and the column of the multiple holes DMH arranged in the X-direction are disposed as shown in FIG. 2 on both the left and the right of the region shown in FIG. 45.

Figure 46:
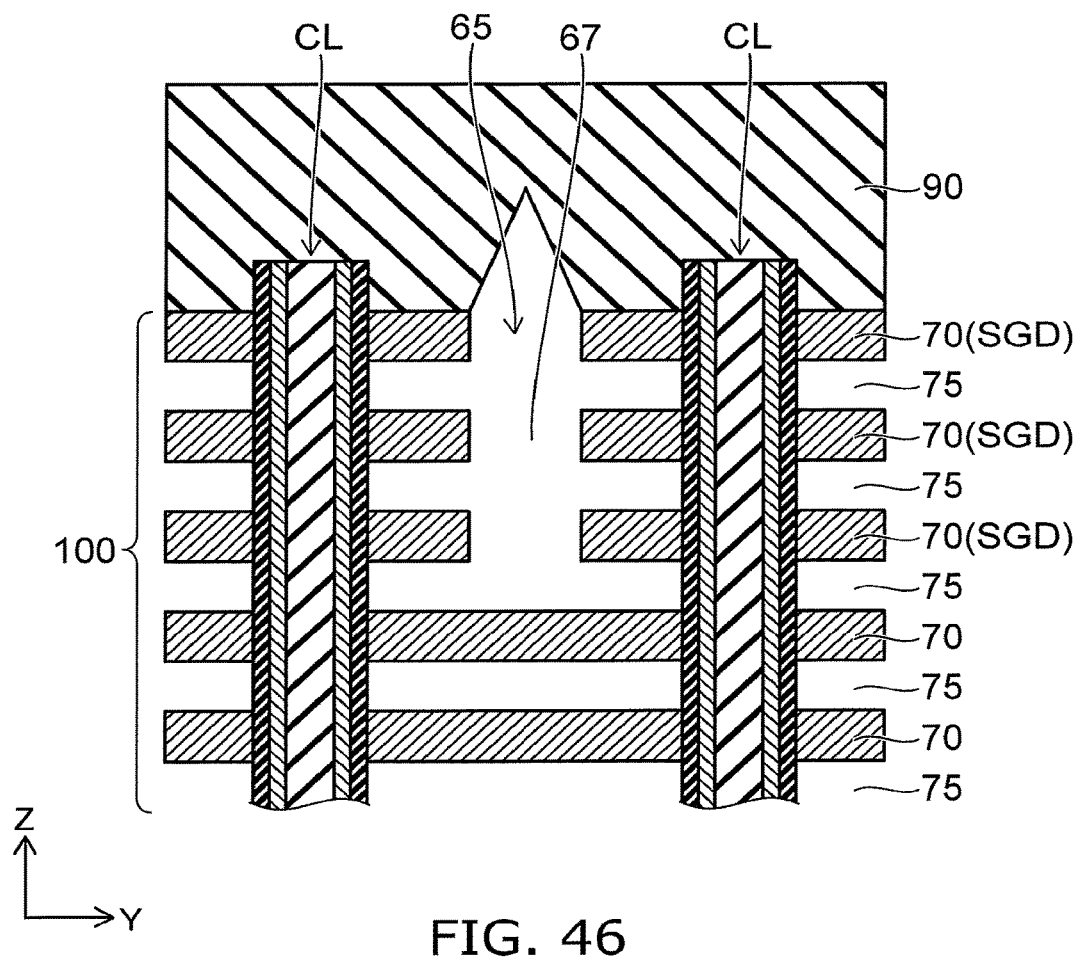
FIG. 46 is an E-E cross-sectional view of FIG. 45.

FIG. 46 is an E-E cross-sectional view of FIG. 45.

Figure 47:
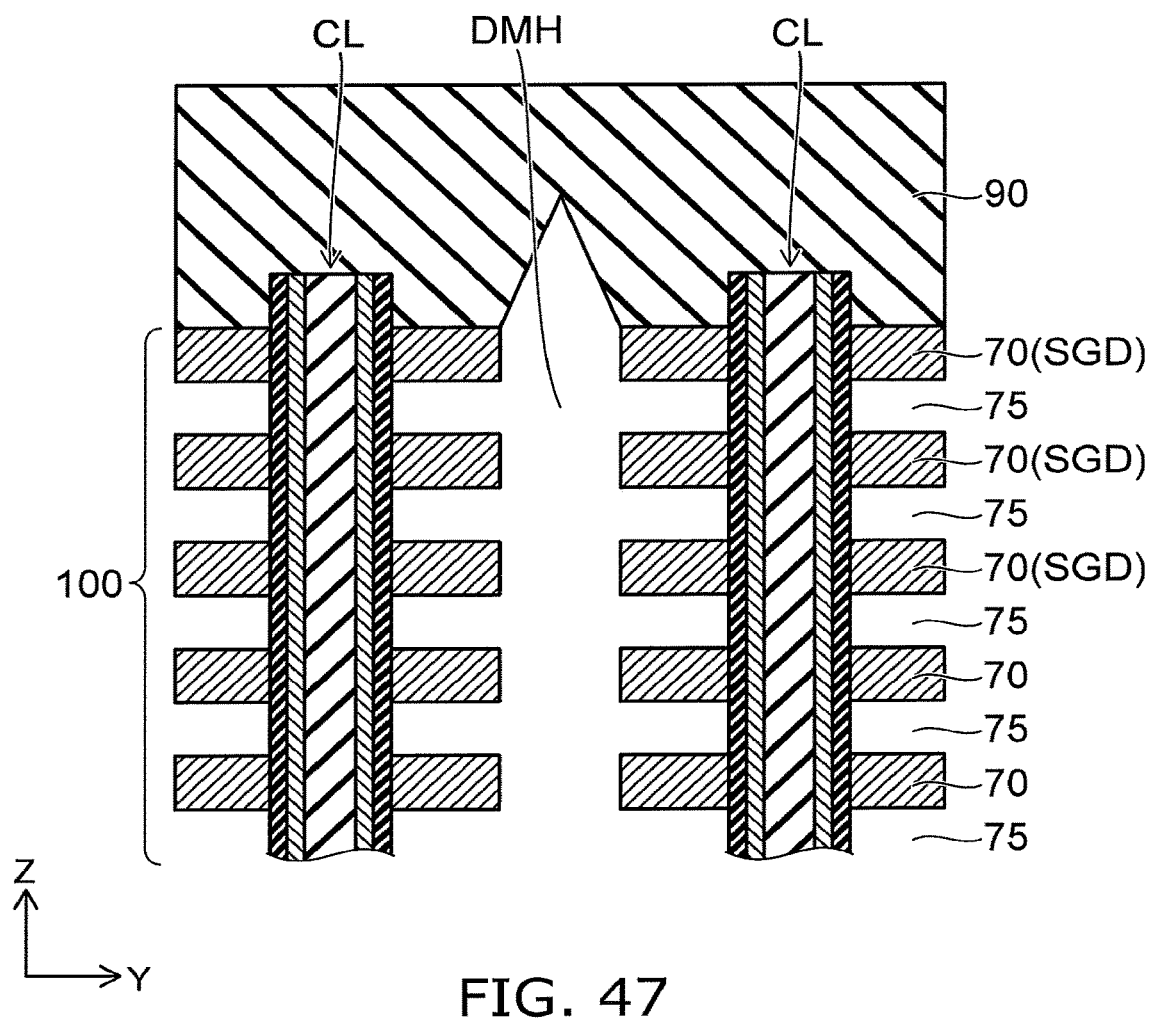
FIG. 47 is a F-F cross-sectional view of FIG. 45.

FIG. 47 is an F-F cross-sectional view of FIG. 45.

In the example shown in FIG. 45, the multiple holes DMH are disposed also in the region overlapping the separation portion 65. The multiple holes DMH are arranged in the X-direction in the region overlapping the separation portion 65.

As shown in FIG. 46, for example, the conductive layers 70 of the three layers on the upper layer side function as the drain-side selection gate SGD. The separation portion 65 divides the drain-side selection gate SGD in the Y-direction and is formed as a cavity 67 extending in a slit configuration in the X-direction. The conductive layers 70 that are lower than the drain-side selection gate SGD are not divided in the Y-direction at the position of the separation portion 65.

The holes DMH disposed in the region overlapping the separation portion 65 pierce the stacked body 100 as shown in FIG. 47. On the upper layer side where the cavity 67 is formed, the holes DMH are positioned inside the cavity 67; and there is no boundary between the cavity 67 and the holes DMH.

The etching of the insulating layers 72 for forming the air gap 75 between the conductive layers 70 adjacent to each other in the stacking direction is performed also from the holes DMH disposed in the region overlapping the separation portion 65; and as shown in FIG. 46 and FIG. 47, the air gap 75 is formed between the conductive layers 70 also in the region at the vicinity of the separation portion 65.

A method for forming the separation portion 65 and the holes DMH shown in FIG. 45 to FIG. 47 will now be described with reference to FIG. 48 to FIG. 53.

Figure 48:
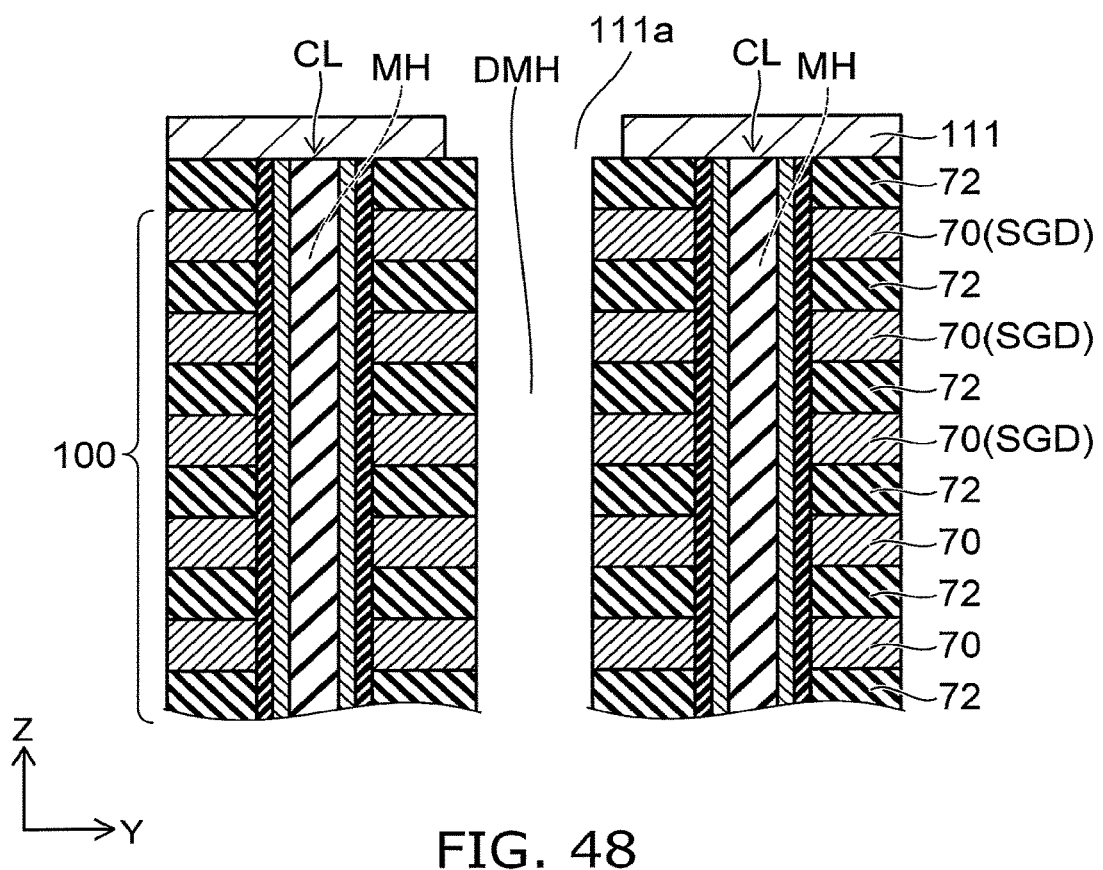
FIG. 48 to FIG. 58 are schematic cross-sectional views showing a method for manufacturing the semiconductor device of the embodiment.
Figure 49:
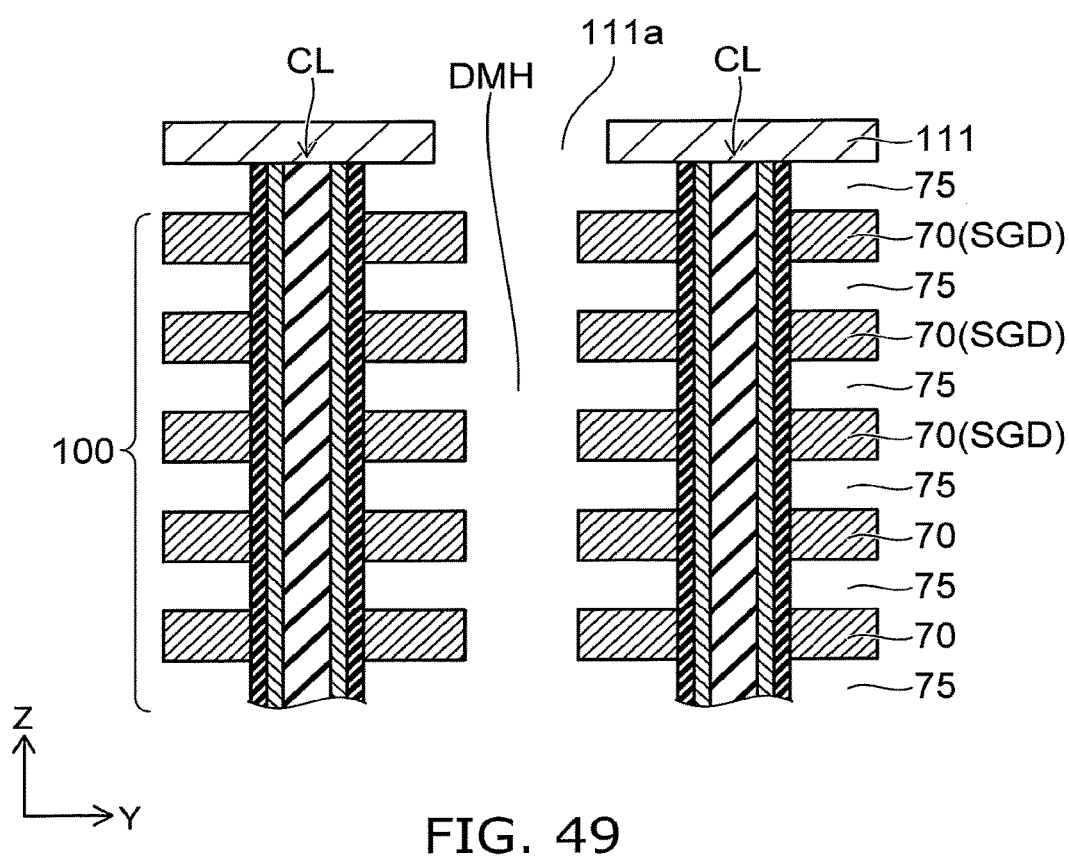
Figure 51:
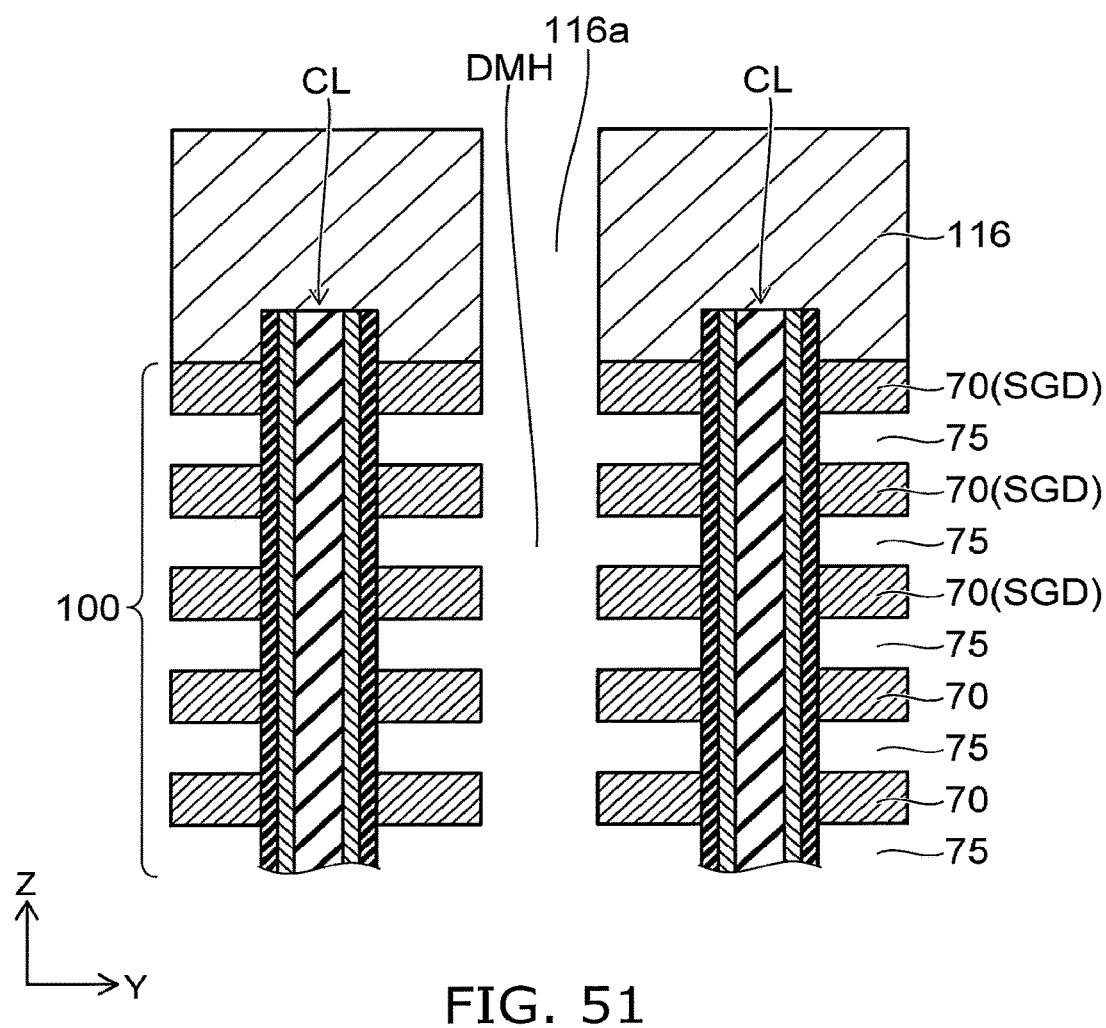

FIG. 48, FIG. 49, and FIG. 51 correspond to the F-F cross section of FIG. 45.

Figure 50:
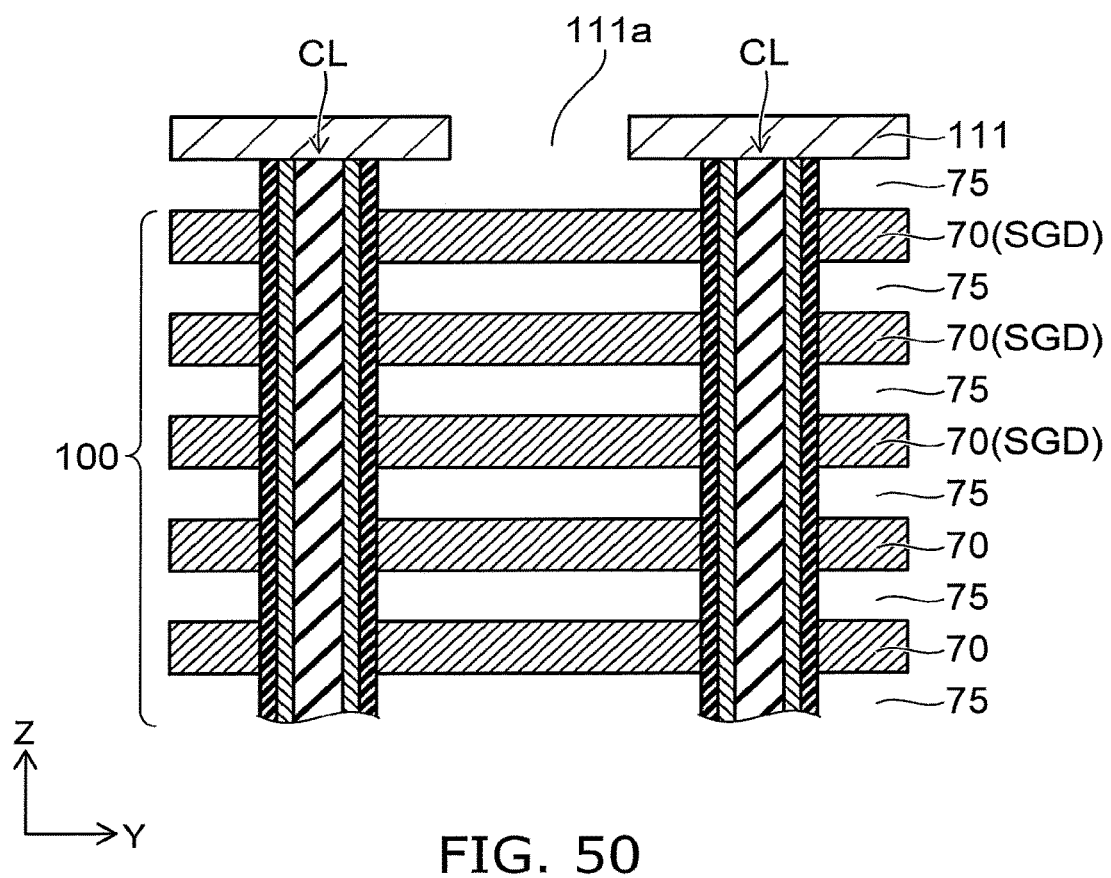
Figure 52:
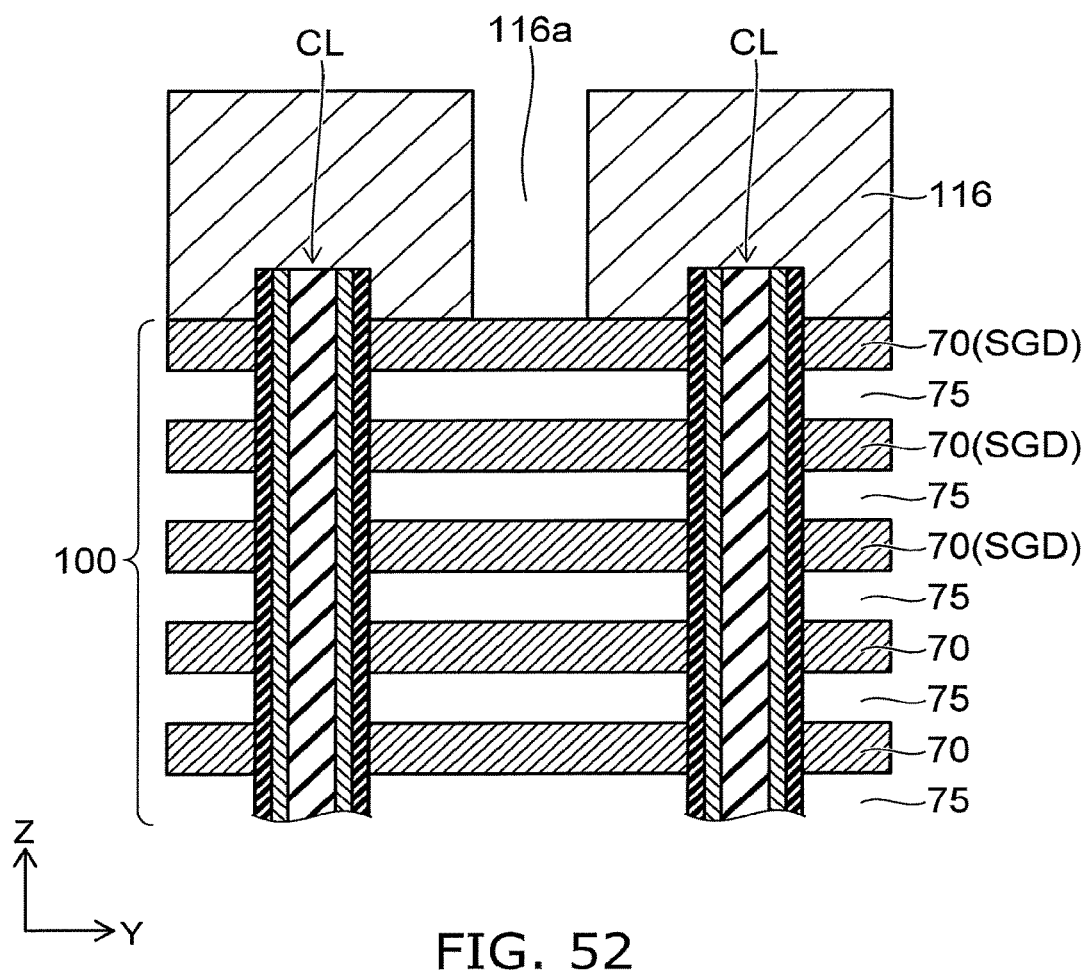
Figure 53:
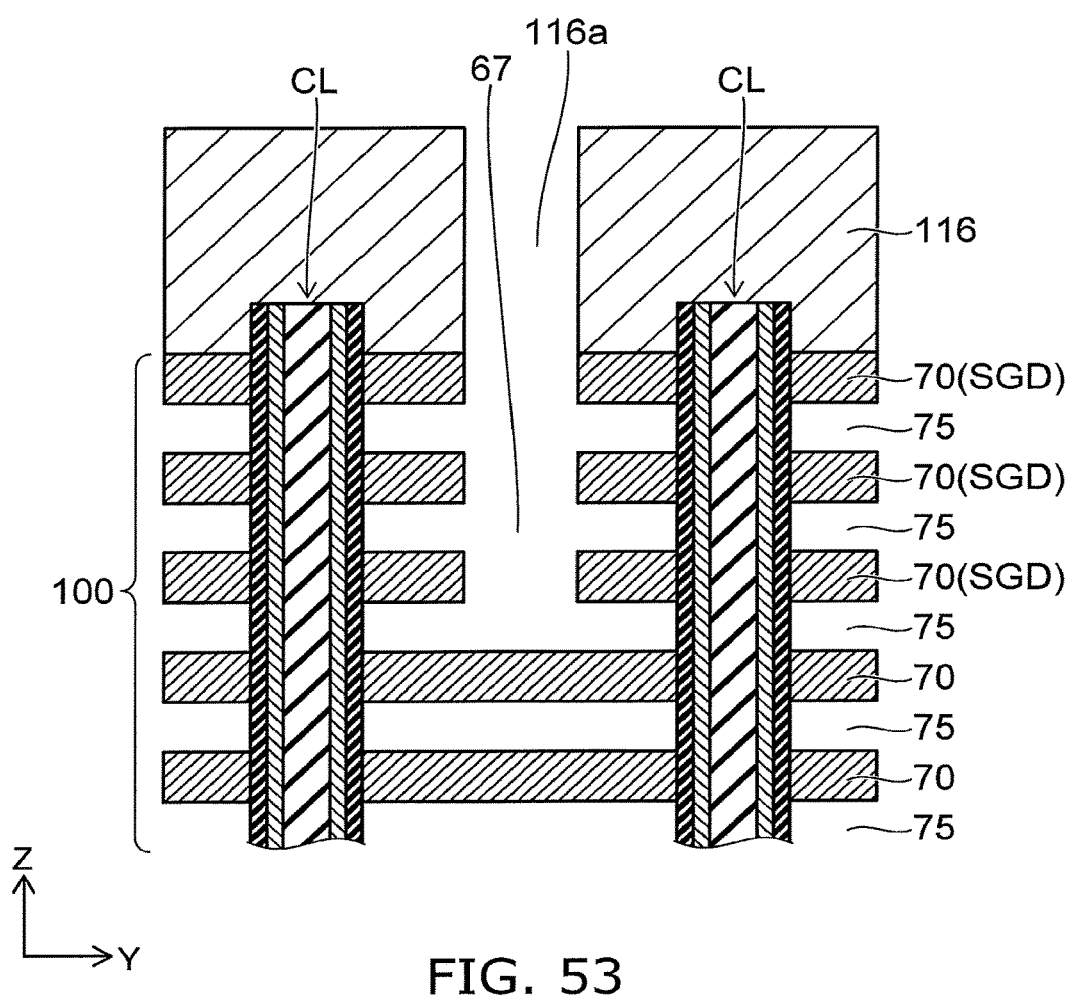

FIG. 50, FIG. 52, and FIG. 53 correspond to the E-E cross section of FIG. 45.

The process shown in FIG. 48 corresponds to the process shown in FIG. 16 described above in which the columnar portions CL inside the holes DMH are removed. Subsequently, the insulating layers 72 are removed by etching through the holes DMH; and the air gap 75 is formed between the conductive layers 70 as shown in FIG. 49. At this time, the portion where the holes DMH are not formed is as in FIG. 50.

The insulating layers 72 are etched through the multiple holes DMH arranged similarly to FIG. 2 proximal to the separation portion 60 (at the end of the block) and through the multiple holes DMH disposed at the central vicinity of the block (the formation region of the separation portion 65). Or, the insulating layers 72 may be etched from only the multiple holes DMH disposed at the central vicinity of the block (the formation region of the separation portion 65) without forming the holes DMH at the end of the block.

After forming the air gap 75, the capping layer 111 is removed; and a mask layer 116 is formed on the stacked body 100 as shown in FIG. 51 which is the cross section of the hole DMH formation portion and as shown in FIG. 52 which is the cross section of the portion where the holes DMH are not formed. A slit 116a that extends in the X-direction is formed in the mask layer 116.

Then, the conductive layers 70 on the upper layer side that function as the drain-side selection gate SGD are divided in the Y-direction by RIE as shown in FIG. 53 which is the cross section of the portion where the holes DMH are not formed.

Subsequently, the mask layer 116 is removed; the sealing film 90 is formed on the stacked body 100 as shown in FIG. 46 and FIG. 47; and the upper ends of the holes DMH are plugged with the sealing film 90.

The diameter of the hole DMH may be smaller than the diameter of the memory hole MH and the diameter of the columnar portion CL formed inside the memory hole MH.

The processes in such a case are shown in FIG. 54 to FIG. 58. FIG. 54 to FIG. 58 correspond to the A-A cross section of FIG. 2.

Figure 54:
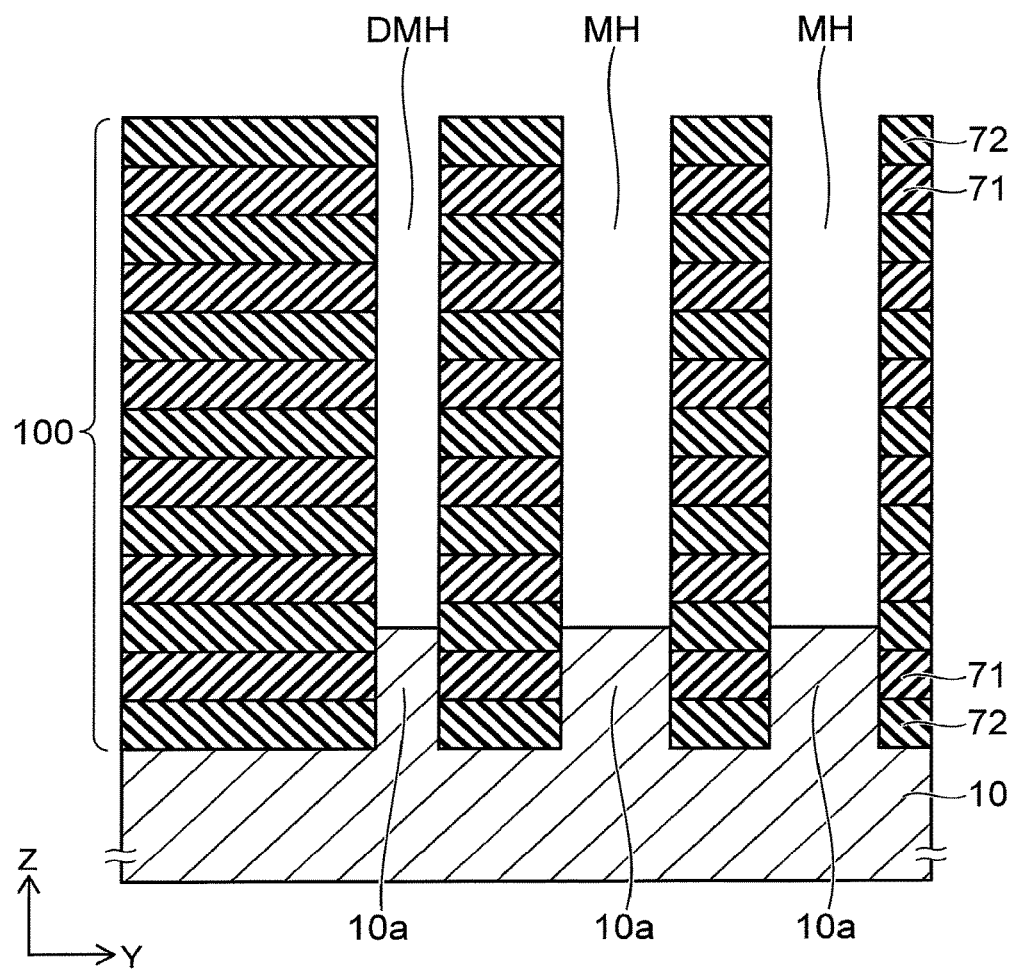

Similarly to the processes described above, the memory holes MH and the holes DMH are formed simultaneously as shown in FIG. 54. However, the diameter of the hole DMH is smaller than the diameter of the memory hole MH.

Figure 55:
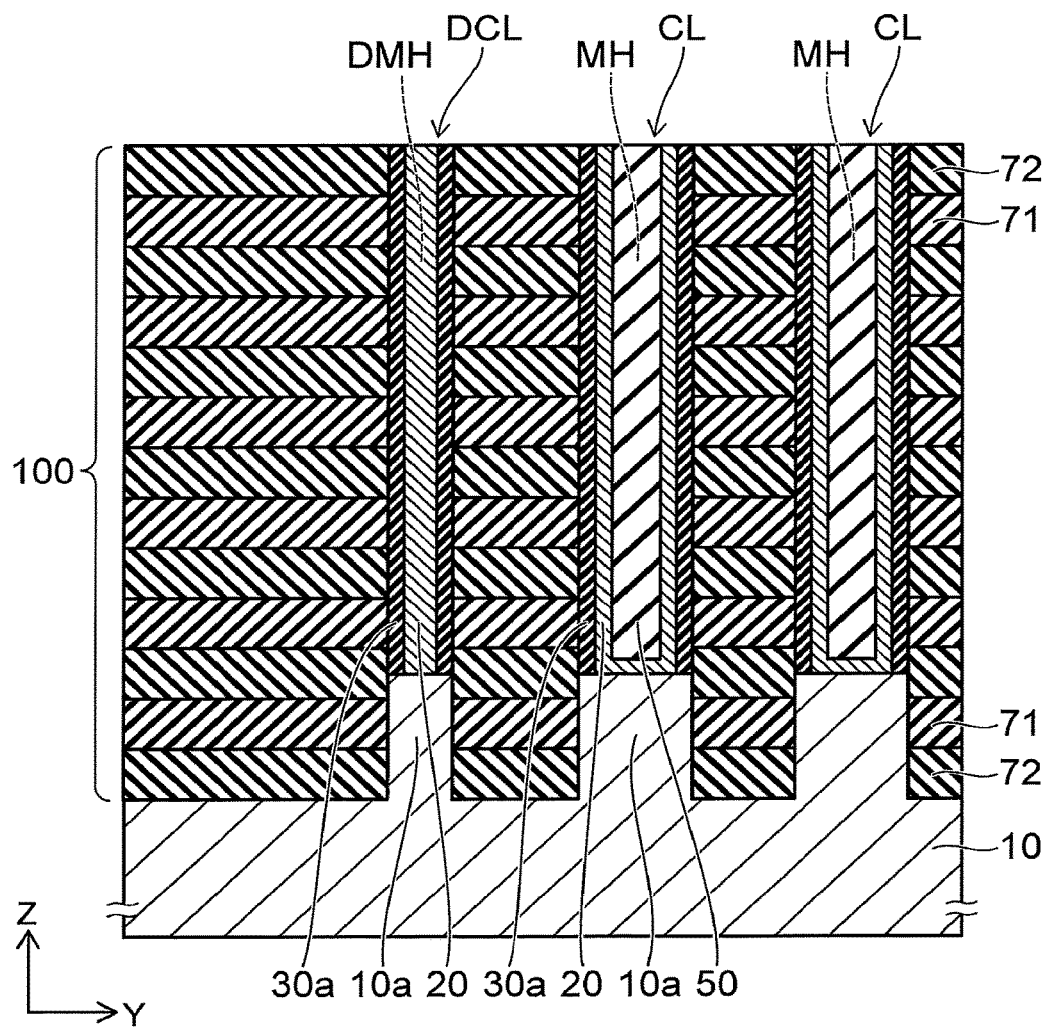

Subsequently, as shown in FIG. 55, the columnar portions CL are formed inside the memory holes MH. The stacked film 30a, the semiconductor body 20, and the core film 50 are formed in order inside the memory holes MH.

The stacked film 30a is formed also inside the holes DMH when forming the stacked film 30a inside the memory holes MH; and the semiconductor body 20 is formed also inside the holes DMH when forming the semiconductor body 20 inside the memory holes MH.

Because the diameter of the hole DMH is smaller than the diameter of the memory hole MH, the interior of the hole DMH is filled with the stacked film 30a and the semiconductor body 20. The core film 50 is not formed inside the holes DMH. Accordingly, a columnar portion DCL that is made of the stacked film 30a and the semiconductor body 20 is formed inside the hole DMH. The diameter of the columnar portion DCL is smaller than the diameter of the columnar portion CL.

Figure 56:
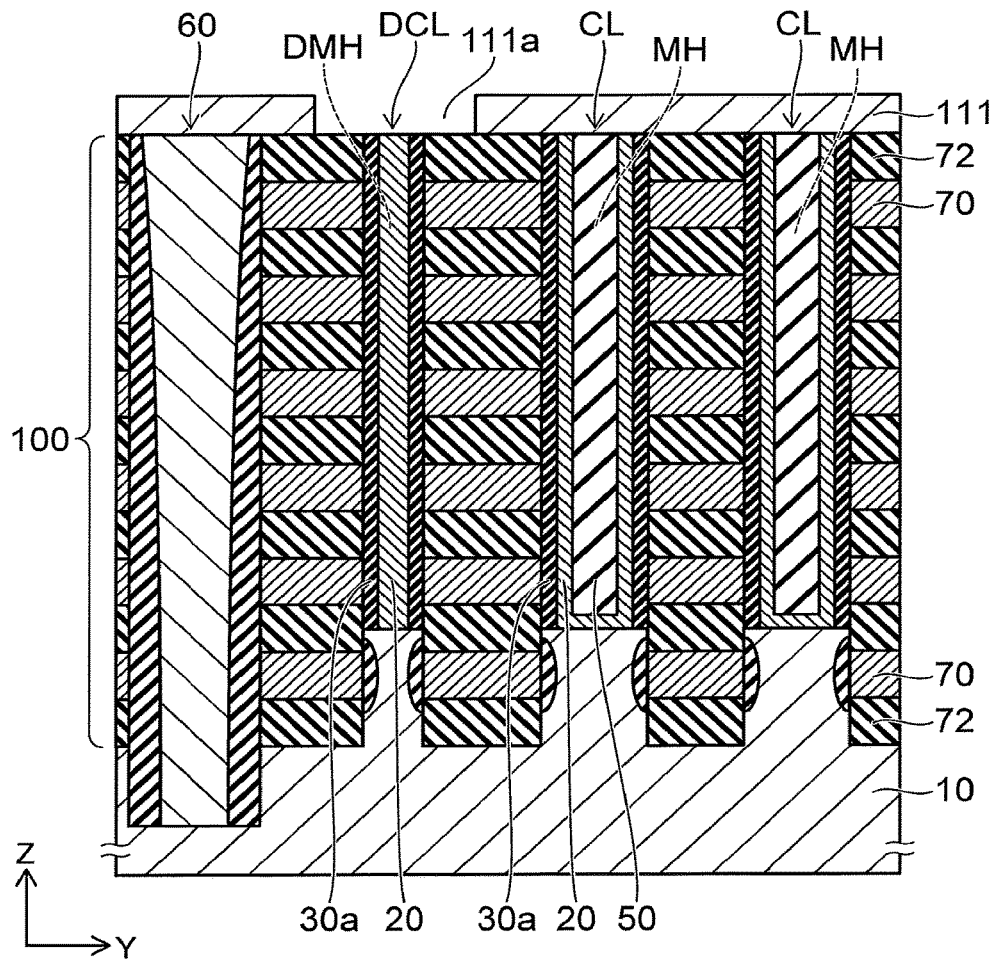

Subsequently, the sacrificial layers 71 are replaced with the conductive layers 70; the separation portion 60 is formed; subsequently, as shown in FIG. 56, the capping layer (or the mask layer) 111 is formed on the stacked body 100. The capping layer 111 covers the upper end portion of the separation portion 60 and the upper end portions of the columnar portions CL inside the memory holes MH.

The opening 111a is formed in the capping layer 111; and the upper end portions of the columnar portions DCL inside the holes DMH are exposed from the opening 111a.

Figure 57:
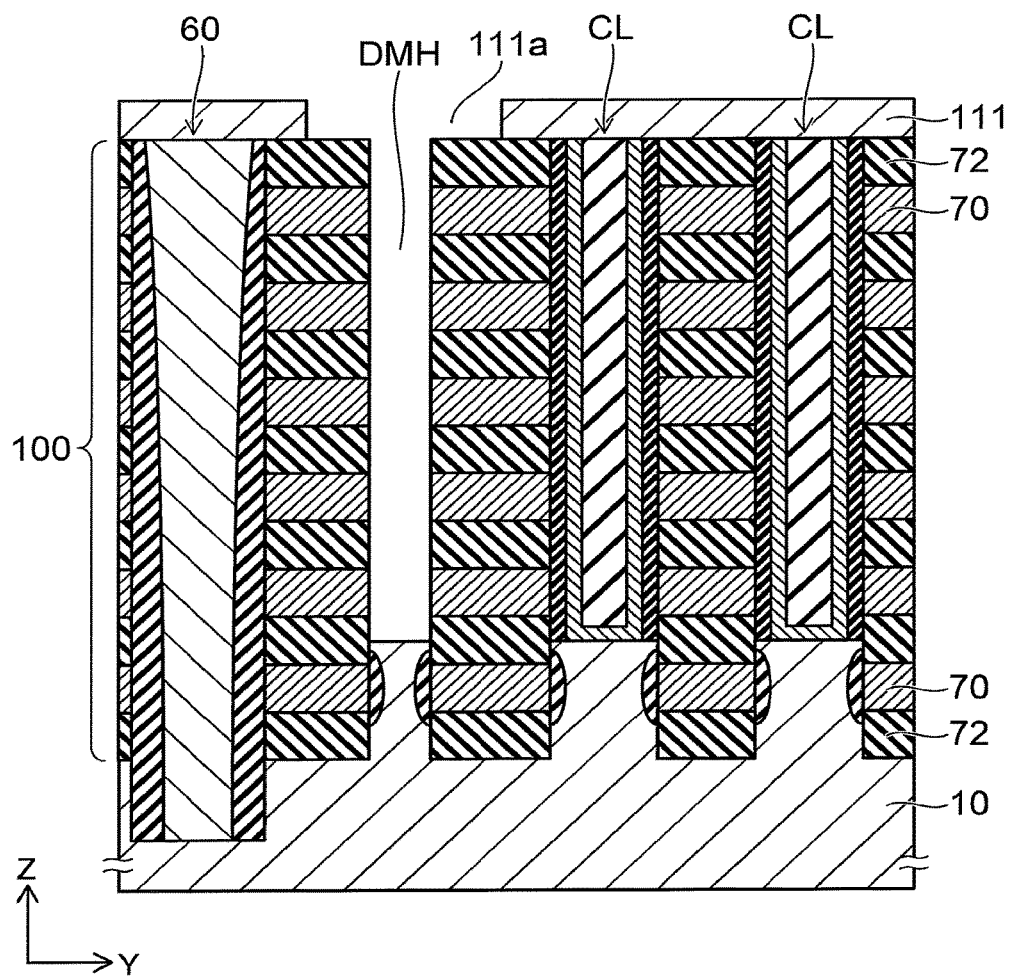

Then, the columnar portions DCL inside the holes DMH are removed by etching; and the holes DMH are formed as shown in FIG. 57.

A process for removing the core film 50 is unnecessary because the columnar portions DCL inside the holes DMH do not include the core film 50.

Figure 58:
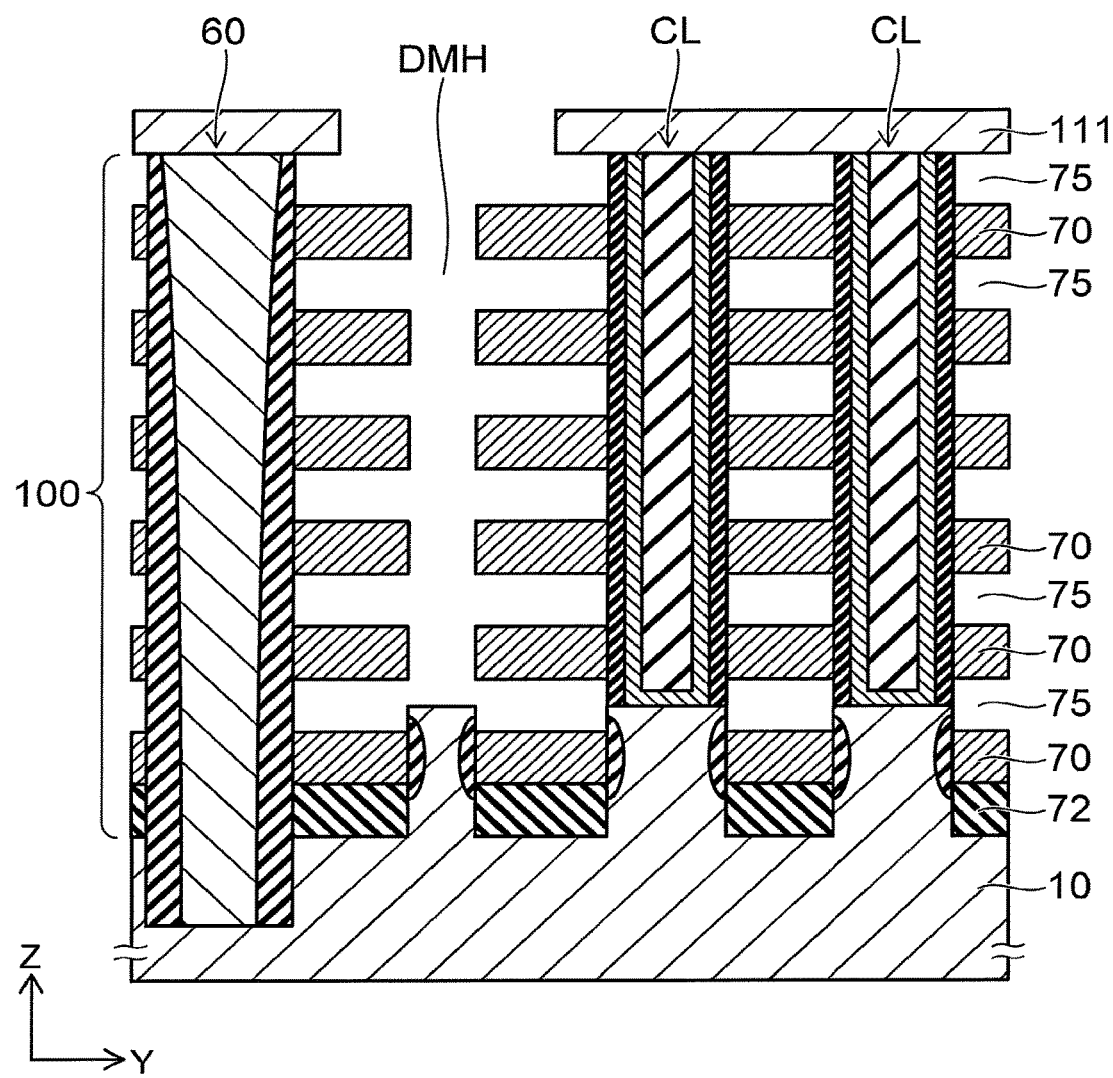

Subsequently, the insulating layers 72 other than the insulating layer 72 of the lowermost layer are removed by etching through the holes DMH in the state in which the columnar portions CL remain inside the memory holes MH. As shown in FIG. 58, the air gap 75 is formed between the conductive layers 70 adjacent to each other in the stacking direction.

Subsequently, similarly to FIG. 3, the sealing film 90 is formed on the stacked body 100; and the upper ends of the holes DMH are plugged with the sealing film 90.

Although the process of replacing the sacrificial layers 71 with the conductive layers 70 after forming the sacrificial layers 71 as the first layers is illustrated in the embodiment recited above, a metal layer or a silicon layer doped with an impurity may be formed as the first layer. In such a case, the first layers remain as the conductive layers 70 as-is without performing the replacement process.

According to the embodiments described above, a semiconductor device having high flexural strength can be provided while providing the air gap between the conductive layers 70 adjacent to each other in the stacking direction.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
    a foundation layer;
    a stacked body provided above the foundation layer, the stacked body including a plurality of conductive layers stacked with an air gap interposed;
    a columnar portion including a semiconductor body, the semiconductor body extending in a stacking direction of the stacked body through the stacked body and contacting the foundation layer;
    a hole extending in the stacking direction through the stacked body and forming a cavity communicating with the air gap;
    a sealing film plugging an upper end of the hole forming the cavity; and
    a first separation portion extending in a first direction and dividing the stacked body into a plurality of blocks in a second direction, the first direction crossing the stacking direction, the second direction crossing the first direction.

2. The device according to claim 1, wherein a plurality of the holes is arranged in a first direction crossing the stacking direction.

3. The device according to claim 1, wherein a plurality of the holes is arranged in the first direction between the first separation portion and the columnar portion.

4. The device according to claim 1, further comprising a second separation portion extending in the first direction and dividing the conductive layer of at least an uppermost layer into a plurality of blocks in the second direction.

5. The device according to claim 4, wherein a plurality of the holes is arranged in the first direction in a region overlapping the second separation portion.

6. The device according to claim 5, wherein the second separation portion is a cavity communicating with the holes.

7. The device according to claim 1, wherein a plurality of the columnar portions and a plurality of the holes are arranged periodically at a substantially uniform pitch.

8. The device according to claim 1, wherein a region between the plurality of conductive layers adjacent to each other in the stacking direction includes
 a region where an insulating layer is provided, and
 a region where the air gap spreads at a periphery of the hole.

9. The device according to claim 1, wherein a diameter of the hole is smaller than a diameter of the columnar portion.

10. The device according to claim 1, wherein
 the foundation layer includes a semiconductor region, and
 the semiconductor body contacts the semiconductor region.

11. The device according to claim 10, wherein a side surface of the semiconductor body contacts the semiconductor region.

12. A semiconductor device, comprising:
 a foundation layer;
 a stacked body provided above the foundation layer, the stacked body including a plurality of conductive layers stacked with an air gap interposed;
 a columnar portion including a semiconductor body, the semiconductor body extending in a stacking direction of the stacked body through the stacked body and contacting the foundation layer;
 a hole extending in the stacking direction through the stacked body and forming a cavity communicating with the air gap; and
 a sealing film plugging an upper end of the hole forming the cavity, wherein
 the stacked body includes an insulating layer provided between the foundation layer and the conductive layer of a lowermost layer, and
 the foundation layer includes a protrusion piercing the insulating layer and being provided under the hole.

13. The device according to claim 12, further comprising a first separation portion extending in a first direction and dividing the stacked body into a plurality of blocks in a second direction, the first direction crossing the stacking direction, the second direction crossing the first direction.

14. The device according to claim 13, wherein a plurality of the holes is arranged in the first direction between the first separation portion and the columnar portion.

15. The device according to claim 13, further comprising a second separation portion extending in the first direction and dividing the conductive layer of at least an uppermost layer into a plurality of blocks in the second direction.

16. The device according to claim 15, wherein a plurality of the holes is arranged in the first direction in a region overlapping the second separation portion.

17. The device according to claim 16, wherein the second separation portion is a cavity communicating with the holes.

18. The device according to claim 12, wherein a plurality of the holes is arranged in a first direction crossing the stacking direction.

19. The device according to claim 12, wherein a plurality of the columnar portions and a plurality of the holes are arranged periodically at a substantially uniform pitch.

20. The device according to claim 12, wherein a region between the plurality of conductive layers adjacent to each other in the stacking direction includes
 a region where an insulating layer is provided, and
 a region where the air gap spreads at a periphery of the hole.

21. The device according to claim 12, wherein a diameter of the hole is smaller than a diameter of the columnar portion.

* * * * *